United States Patent
Yamano et al.

(10) Patent No.: US 11,392,033 B2
(45) Date of Patent: Jul. 19, 2022

(54) RESIST COMPOSITION AND METHOD OF FORMING RESIST PATTERN

(71) Applicant: TOKYO OHKA KOGYO CO., LTD., Kawasaki (JP)

(72) Inventors: Hitoshi Yamano, Kawasaki (JP); Takahiro Kojima, Kawasaki (JP); Yoichi Hori, Kawasaki (JP); Yasuhiro Yoshii, Kawasaki (JP); Masahito Yahagi, Kawasaki (JP)

(73) Assignee: TOKYO OHKA KOGYO CO., LTD., Kawasaki (JP)

( * ) Notice: Subject to any disclaimer, the term of this patent is extended or adjusted under 35 U.S.C. 154(b) by 444 days.

(21) Appl. No.: 16/222,758

(22) Filed: Dec. 17, 2018

(65) Prior Publication Data

US 2019/0204738 A1    Jul. 4, 2019

(30) Foreign Application Priority Data

Dec. 28, 2017 (JP) .............................. JP2017-254665

(51) Int. Cl.

| G03F 7/039 | (2006.01) |
|---|---|
| G03F 7/30 | (2006.01) |
| G03F 7/38 | (2006.01) |
| C08F 12/24 | (2006.01) |
| C08F 220/30 | (2006.01) |
| C09D 125/18 | (2006.01) |
| C08F 212/14 | (2006.01) |
| C08F 220/18 | (2006.01) |

(52) U.S. Cl.
CPC ............ G03F 7/0397 (2013.01); C08F 12/24 (2013.01); C08F 212/24 (2020.02); C08F 220/1807 (2020.02); C08F 220/1808 (2020.02); C08F 220/30 (2013.01); C09D 125/18 (2013.01); G03F 7/30 (2013.01); G03F 7/38 (2013.01)

(58) Field of Classification Search
CPC ........ G03F 7/0392; G03F 7/0397; G03F 7/30; G03F 7/38
See application file for complete search history.

(56) References Cited

U.S. PATENT DOCUMENTS

| 2010/0129738 A1* | 5/2010 | Takemura ............. C08F 212/14 430/5 |
| 2016/0195814 A1* | 7/2016 | Enomoto ............ H01L 21/0273 430/311 |
| 2016/0202608 A1 | 7/2016 | Namai |
| 2016/0209745 A1* | 7/2016 | Hirayama ............... G03F 7/322 |
| 2016/0229940 A1* | 8/2016 | Hatakeyama ......... G03F 7/0046 |
| 2017/0097567 A1* | 4/2017 | Hatakeyama ....... C08F 220/283 |
| 2019/0219921 A1 | 7/2019 | Tsubaki et al. |

FOREIGN PATENT DOCUMENTS

| JP | 2012-037774 A | 2/2012 |
| JP | 2015-025879 A | 2/2015 |
| JP | 2016-085382 A | 5/2016 |
| JP | 2016-133547 A | 7/2016 |
| WO | WO 2010/095698 A1 | 8/2010 |
| WO | WO 2015/046021 A1 | 4/2015 |
| WO | WO 2018/061944 A1 | 4/2018 |

OTHER PUBLICATIONS

Office Action in Japanese Patent Application No. 2017-254665 dated Jun. 29, 2021.

* cited by examiner

*Primary Examiner* — John S Chu
(74) *Attorney, Agent, or Firm* — Knobbe Martens Olson & Bear LLP

(57) ABSTRACT

A resist composition including a resin component whose solubility in a developing solution is changed due to the action of the acid, in which the resin component has a constitutional unit derived from a compound represented by Formula (a0-1) and a constitutional unit containing an acid decomposable group whose polarity is increased due to the action of the acid. In the formula, W represents a polymerizable group-containing group, $Ya^0$ represents a carbon atom, $Xa^0$ represents a group that forms a monocyclic aliphatic hydrocarbon group together with $Ya^0$, some or all hydrogen atoms in the monocyclic aliphatic hydrocarbon group may be substituted with substituents, and $Ra^{00}$ represents an aromatic hydrocarbon group which may have a substituent.

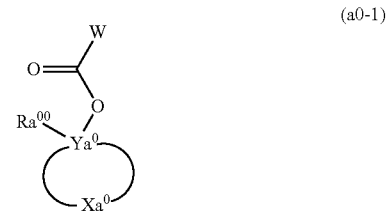

(a0-1)

4 Claims, No Drawings

RESIST COMPOSITION AND METHOD OF FORMING RESIST PATTERN

BACKGROUND OF THE INVENTION

Field of the Invention

The present invention relates to a resist composition and a method of forming a resist pattern.

Priority is claimed on Japanese Patent Application No. 2017-254665, filed on Dec. 28, 2017, the content of which is incorporated herein by reference.

Description of Related Art

In lithography techniques, for example, a resist film formed of a resist material is formed on a substrate, and the resist film is subjected to selective exposure, followed by a development treatment, thereby forming a resist pattern having a predetermined shape on the resist film. A resist material in which the exposed portions of the resist film become soluble in a developing solution is called a positive type, and a resist material in which the exposed portions thereof become insoluble in a developing solution is called a negative type.

In recent years, in the production of semiconductor elements and liquid crystal display elements, advances in lithography techniques have led to rapid progress in the field of pattern miniaturization. Typically, these miniaturization techniques involve shortening the wavelength (increasing the energy) of the exposure light source.

Conventionally, ultraviolet radiation typified by g-line and i-line radiation has been used, but nowadays KrF excimer lasers and ArF excimer lasers are used in mass production. Furthermore, research is also being conducted into lithography techniques that use an exposure light source having a wavelength shorter (energy higher) than these excimer lasers, such as electron beams (EB), extreme ultraviolet radiation (EUV), and X rays.

Recently, in EUV lithography or EB lithography, a chemically amplified resist which has been suggested to be used for KrF excimer laser or ArF excimer laser has been usually used as the resist material since lithography characteristics such as the sensitivity with respect to EUV or EB or the resolution that enables formation of a fine target resist pattern are excellent. Particularly, it is considered that the chemically amplified resist containing an acrylic resin as a base resin has excellent lithography characteristics described above.

For example, EUV exposure has a problem of acid diffusion control. In order to control acid diffusion, the anion structure of an acid generator is usually changed, and an acid generator having an anion structure in which the diffusion length of an acid is short diffusion is already applied.

In order to further control acid diffusion, a method of changing a polymer compound in various manners is employed.

For example, PCT International Publication No. WO2010/095698 describes a resist composition which employs a polymer compound containing a specific acid dissociable functional group and improves the reactivity with respect to an acid to contribute to improvement of the solubility in a developing solution.

SUMMARY OF THE INVENTION

With further progress of lithography techniques and further promotion of miniaturization of a resist pattern, there has been a growing demand for a resist material to form a resist pattern with higher resolution while maintaining excellent lithography characteristics.

The present invention has been made in consideration of the above-described problems, and an object thereof is to provide a resist composition in which various lithography characteristics are favorably balanced and the resolution and roughness are improved; and a method of forming a resist pattern obtained by using the resist composition.

In order to solve the above-described problems, the present invention employs the following configurations.

In other words, according to a first aspect of the present invention, there is provided a resist composition which generates an acid upon exposure and whose solubility in a developing solution is changed due to an action of the acid, the resist composition including: a resin component (A1) whose solubility in a developing solution is changed due to the action of the acid, in which the resin component (A1) has a constitutional unit (a0) derived from a compound represented by Formula (a0-1) and a constitutional unit (a1) (where a constitutional unit corresponding to the constitutional unit (a0) is excluded) containing an acid decomposable group whose polarity is increased due to the action of the acid.

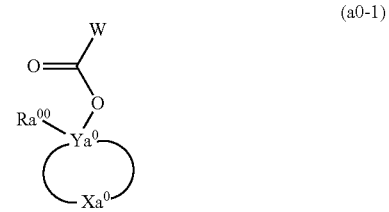

(a0-1)

[In the formula, W represents a polymerizable group-containing group, $Ya^0$ represents a carbon atom, $Xa^0$ represents a group that forms a monocyclic aliphatic hydrocarbon group together with $Ya^0$, some or all hydrogen atoms in the monocyclic aliphatic hydrocarbon group may be substituted with substituents, and $Ra^{00}$ represents an aromatic hydrocarbon group which may have a substituent]

According to a second aspect of the present invention, there is provided a method of forming a resist pattern, including: a step of forming a resist film on a support using the resist composition according to the first aspect; a step of exposing the resist film; and a step of developing the exposed resist film to form a resist pattern.

According to the present invention, it is possible to provide a resist composition in which various lithography characteristics are favorably balanced and the resolution and roughness are improved; and a method of forming a resist pattern obtained by using the resist composition.

DETAILED DESCRIPTION OF THE INVENTION

In the present description and claims, the term "aliphatic" is a relative concept used in relation to the term "aromatic", and defines a group or compound that has no aromaticity.

The term "alkyl group" includes linear, branched or cyclic, monovalent saturated hydrocarbon, unless otherwise specified. The same applies for the alkyl group in an alkoxy group.

The term "alkylene group" includes linear, branched or cyclic, divalent saturated hydrocarbon, unless otherwise specified.

A "halogenated alkyl group" is a group in which some or all hydrogen atoms of an alkyl group is substituted with halogen atoms. Examples of the halogen atom include a fluorine atom, a chlorine atom, a bromine atom, and an iodine atom.

A "fluorinated alkyl group" or a "fluorinated alkylene group" is a group in which some or all hydrogen atoms of an alkyl group or an alkylene group have been substituted with fluorine atoms.

The term "constitutional unit" indicates a monomer unit that contributes to the formation of a polymeric compound (a resin, a polymer, or a copolymer).

The expression "may have a substituent" means that a case where a hydrogen atom (—H) is substituted with a monovalent group, or a case where a methylene (—$CH_2$—) group is substituted with a divalent group.

The term "exposure" is used as a general concept that includes irradiation with any form of radiation.

A "constitutional unit derived from acrylic acid ester" indicates a constitutional unit that is formed by the cleavage of the ethylenic double bond of acrylic acid ester.

The "acrylic acid ester" indicates a compound in which the terminal hydrogen atom of the carboxy group of acrylic acid ($CH_2$=CH—COOH) has been substituted with an organic group.

The acrylic acid ester may have the hydrogen atom bonded to the carbon atom at the α-position substituted with a substituent. The substituent)($R^{\alpha 0}$ that substitutes the hydrogen atom bonded to the carbon atom at the α-position is an atom other than hydrogen or a group, and examples thereof include an alkyl group having 1 to 5 carbon atoms and a halogenated alkyl group having 1 to 5 carbon atoms. Further, acrylic acid ester having the hydrogen atom bonded to the carbon atom at the α-position substituted with a substituent)($R^{\alpha 0}$ in which the substituent has been substituted with a substituent containing an ester bond (itaconic acid diester), or an acrylic acid having the hydrogen atom bonded to the carbon atom at the α-position substituted with a substituent)($R^{\alpha 0}$ in which the substituent has been substituted with a hydroxyalkyl group or a group in which the hydroxyl group in a hydroxyalkyl group has been modified (α-hydroxyalkyl acrylic acid ester) can be exemplified as acrylic acid ester having the hydrogen atom bonded to the carbon atom at the α-position substituted with a substituent. A carbon atom at the α-position of acrylic acid ester indicates the carbon atom bonded to the carbonyl group, unless specified otherwise.

Hereinafter, acrylic acid ester in which the hydrogen atom bonded to the carbon atom at the α-position is substituted with a substituent is also referred to as α-substituted acrylic acid ester". Further, acrylic acid ester and α-substituted acrylic acid ester are also collectively referred to as "(α-substituted) acrylic acid ester". Further, an acrylic acid in which a hydrogen atom bonded to the carbon atom at the α-position is substituted with a substituent is also referred to as α-substituted acrylic acid. In addition, acrylic acid and α-substituted acrylic acid are also collectively referred to as "(α-substituted) acrylic acid".

A "constitutional unit derived from acrylamide" indicates a constitutional unit that is formed by the cleavage of the ethylenic double bond of acrylamide.

The acrylamide may have the hydrogen atom bonded to the carbon atom at the α-position substituted with a substituent, and may have either or both terminal hydrogen atoms on the amino group of acrylamide substituted with a substituent. A carbon atom at the α-position of an acrylamide indicates the carbon atom bonded to the carbonyl group, unless specified otherwise.

As the substituent which substitutes the hydrogen atom bonded to the carbon atom at the α-position of acrylamide, the same substituents as those described above for the substituent)($R^{\alpha 0}$ at the α-position of the above-described α-position of the above-described α-substituted acrylic acid ester can be exemplified.

A "constitutional unit derived from hydroxystyrene" indicates a constitutional unit that is formed by the cleavage of an ethylenic double bond of hydroxystyrene. A "constitutional unit derived from a hydroxystyrene derivative" indicates a constitutional unit formed by the cleavage of an ethylenic double bond of a hydroxystyrene derivative.

The term "hydroxystyrene derivative" includes compounds in which the hydrogen atom at the α-position of hydroxystyrene has been substituted with another substituent such as an alkyl group or a halogenated alkyl group; and derivatives thereof.

Examples of the derivatives thereof include hydroxystyrene in which the hydrogen atom of the hydroxyl group has been substituted with an organic group and may have the hydrogen atom at the α-position substituted with a substituent; and hydroxystyrene which has a substituent other than a hydroxyl group bonded to the benzene ring and may have the hydrogen atom at the α-position substituted with a substituent. Here, the α-position (carbon atom at the α-position) indicates the carbon atom having the benzene ring bonded thereto, unless specified otherwise.

As the substituent which substitutes the hydrogen atom at the α-position of hydroxystyrene, the same substituents as those described above for the substituent at the α-position of the above-described α-substituted acrylic acid ester can be exemplified.

A "constitutional unit derived from vinylbenzoic acid or a vinylbenzoic acid derivative" indicates a constitutional unit that is formed by the cleavage of the ethylenic double bond of vinylbenzoic acid or a vinylbenzoic acid derivative.

The term "vinylbenzoic acid derivative" includes compounds in which the hydrogen atom at the α-position of vinylbenzoic acid has been substituted with another substituent such as an alkyl group or a halogenated alkyl group; and derivatives thereof. Examples of the derivatives thereof include vinylbenzoic acid in which the hydrogen atom of the carboxy group has been substituted with an organic group and may have the hydrogen atom at the α-position substituted with a substituent; and vinylbenzoic acid which has a substituent other than a hydroxyl group and a carboxy group bonded to the benzene ring and may have the hydrogen atom at the α-position substituted with a substituent. Here, the α-position (carbon atom at the α-position) indicates the carbon atom having the benzene ring bonded thereto, unless specified otherwise.

As the alkyl group as a substituent at the α-position, a linear or branched alkyl group is preferable, and specific examples thereof include alkyl groups of 1 to 5 carbon atoms, such as a methyl group, an ethyl group, a propyl group, an isopropyl group, an n-butyl group, an isobutyl group, a tert-butyl group, a pentyl group, an isopentyl group, and a neopentyl group.

Specific examples of the halogenated alkyl group as the substituent at the α-position include groups in which some or all hydrogen atoms of the above-described "alkyl group as the substituent at the α-position" are substituted with halogen atoms. Examples of the halogen atom include a fluorine atom, a chlorine atom, a bromine atom and an iodine atom, and a fluorine atom is particularly preferable.

Specific examples of the hydroxyalkyl group as the substituent at the α-position include groups in which some or all hydrogen atoms of the above-described "alkyl group as the substituent at the α-position" are substituted with a hydroxyl group. The number of hydroxyl groups in the hydroxyalkyl group is preferably 1 to 5, and most preferably 1.

In the present specification and the scope of the present patent claims, asymmetric carbons may be present or enantiomers or diastereomers may be present depending on the structures of the chemical formulae. In this case, these isomers are represented by one formula. These isomers may be used alone or in the form of a mixture.

(Resist Composition)

The resist composition according to the present embodiment is a resist composition which generates an acid upon exposure and whose solubility in a developing solution is changed due to an action of the acid.

Such a resist composition contains a base material component (A) in which the solubility in a developing solution is changed due to an action of the acid (hereinafter, also referred to as "component (A)").

In a case where a resist film is formed using the resist composition according to the present embodiment and the formed resist film is subjected to a selective exposure, acid is generated at exposed portions of the resist film, and the generated acid acts on the component (A) to change the solubility of the component (A) in a developing solution, whereas the solubility of the component (A) in a developing solution is not changed at unexposed portions of the resist film, thereby generating difference in solubility in a developing solution between exposed portions and unexposed portions of the resist film. Therefore, by subjecting the resist film to development, the exposed portions of the resist film are dissolved and removed to form a positive type resist pattern in a case of a positive type resist, whereas the unexposed portions of the resist film are dissolved and removed to form a negative type resist pattern in a case of a negative type resist.

In the present specification, a resist composition which forms a positive type resist pattern by dissolving and removing the exposed portions of the resist film is called a positive type resist composition, and a resist composition which forms a negative type resist pattern by dissolving and removing the unexposed portions of the resist film is called a negative type resist composition.

The resist composition of the present embodiment may be a positive type resist composition or a negative type resist composition.

Further, in the formation of a resist pattern, the resist composition of the present embodiment can be applied to an alkali developing process using an alkali developing solution in the developing treatment, or a solvent developing process using a developing solution containing an organic solvent (organic developing solution) in the developing treatment.

In other words, the resist composition of the present embodiment is a "positive type resist composition for an alkali developing process" that forms a positive type resist pattern in an alkali developing process and is a "negative type resist composition for a solvent developing process" that forms a negative type resist pattern in a solvent developing process.

The resist composition of the present embodiment has a function of generating acid upon exposure, and in the resist composition, the component (A) may generate an acid upon exposure, or an additive component other than the component (A) may generate an acid upon exposure.

In the present embodiment, the resist composition may be a resist composition (1) containing an acid generator component (B) which generates acid upon exposure (hereinafter, referred to as "component (B)"); a resist composition (2) in which the component (A) is a component which generates acid upon exposure; or a resist composition (3) in which the component (A) is a component which generates acid upon exposure, and further containing an acid generator component (B).

That is, in a case where the resist composition of the present invention is the above-described resist composition (2) or (3), the component (A) is a "base material component which generates acid upon exposure and whose solubility in a developing solution is changed due to an action of an acid". In a case where the component (A) is a base material component which generates an acid upon exposure and whose solubility in a developing solution is changed due to an action of an acid, the component (A1) described below is preferably a polymeric compound which generates an acid upon exposure and whose solubility in a developing solution is changed due to an action of an acid. As the polymeric compound, a copolymer having a constitutional unit which generates acid upon exposure can be used.

As the constitutional unit which generates acid upon exposure, a known constitutional unit can be used.

It is particularly preferable that the resist composition of the present embodiment corresponds to the case of (1) described above.

<Component (A)>

The component (A) is a base material component whose solubility in a developing solution is changed due to an action of an acid.

In the present invention, the term "base material component" indicates an organic compound capable of forming a film, and is preferably an organic compound having a molecular weight of 500 or greater. In a case where the organic compound has a molecular weight of 500 or greater, the film-forming ability is improved, and a resist pattern at a nano level can be easily formed.

The organic compound used as the base material component is broadly classified into non-polymers and polymers.

In general, as a non-polymer, any of those which have a molecular weight in the range of 500 to less than 4,000 is used. Hereinafter, a "low molecular weight compound" indicates a non-polymer having a molecular weight in the range of 500 to less than 4,000.

As a polymer, any of those which have a molecular weight of 1,000 or greater is generally used. Hereinafter, a "resin" or a "polymeric compound" indicates a polymer having a molecular weight of 1,000 or greater.

As the molecular weight of the polymer, the weight average molecular weight in terms of the polystyrene equivalent value determined by gel permeation chromatography (GPC) is used.

The component (A) in the resist composition of the present embodiment contains a resin component (A1) (hereinafter, also referred to as a "component (A1)") in which the solubility in a developing solution is changed due to an action of an acid.

As the component (A), at least the component (A1) is used, and other polymer compounds and/or low molecular weight compounds may be used in combination with the component (A1).

<<Component (A1)>>

The component (A1) contains a constitutional unit (a0) derived from a compound represented by Formula (a0-1) and a constitutional unit (a1) containing an acid decomposable group whose polarity is increased due to the action of the acid.

Such a component (A1) may contain other constitutional units as necessary in addition to the constitutional unit (a0) and the constitutional unit (a1).

In the resist composition of the present embodiment, since the constitutional unit (a0) and the constitutional unit (a1) contain an acid dissociable group, the polarity of the resin component is changed before and after the exposure by using the (A1) component. In the alkali developing process and the solvent developing process, an excellent development contrast between exposed portions and unexposed portions of the resist film can be obtained.

In a case of applying an alkali developing process, the component (A1) is substantially insoluble in an alkali developing solution prior to exposure, but in a case where acid is generated from the component (B) upon exposure, the action of this acid causes an increase in the polarity of the base material component, thereby increasing the solubility of the component (A1) in an alkali developing solution. Therefore, in the formation of a resist pattern, by conducting selective exposure of a resist film formed by applying the resist composition to a substrate, the exposed portions of the resist film change from an insoluble state to a soluble state in an alkali developing solution, whereas the unexposed portions of the resist film remain insoluble in an alkali developing solution, and hence, a positive type resist pattern is formed by alkali developing.

Meanwhile, in a case of a solvent developing process, the component (A1) exhibits high solubility in an organic developing solution prior to exposure, and in a case where acid is generated from the component (B) upon exposure, the polarity of the component (A1) is increased by the action of the generated acid, thereby decreasing the solubility of the component (A1) in an organic developing solution. Therefore, in the formation of a resist pattern, by conducting selective exposure of a resist film formed by applying the resist composition to a substrate, the exposed portions of the resist film changes from an soluble state to an insoluble state in an organic developing solution, whereas the unexposed portions of the resist film remain soluble in an organic developing solution. As a result, by conducting development using an organic developing solution, a negative type resist pattern can be formed.

In regard to constitutional unit (a0):

The constitutional unit (a0) is a constitutional unit derived from a compound (hereinafter, also referred to as a "compound (a0)") represented by Formula (a0-1).

The constitutional unit (a0) contains an acid decomposable group whose polarity is increased due to an action of an acid. The term "acid decomposable group" indicates a group in which at least a part of a bond in the structure of the acid decomposable group can be cleaved due to the action of an acid. In the constitutional unit (a0), a bond between an acid decomposable group (a cyclic aliphatic hydrocarbon group which has $Ra^{00}$ as a substituent and is formed by $Xa^0$ together with $Ya^0$ and an oxygen atom adjacent to the acid decomposable group is cleaved due to the action of an acid so that a polar group (carboxy group) with a high polarity is generated, and thus the polarity is increased.

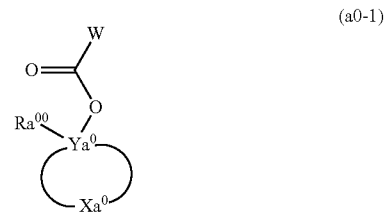

(a0-1)

[In the formula, W represents a polymerizable group-containing group. $Ya^0$ represents a carbon atom. $Xa^0$ represents a group that forms a monocyclic aliphatic hydrocarbon group together with $Ya^0$. Some or all hydrogen atoms in the monocyclic aliphatic hydrocarbon group may be substituted with substituents. $Ra^{00}$ represents an aromatic hydrocarbon group which may have a substituent.]

In Formula (a0-1), W represents a polymerizable group-containing group.

The "polymerizable group" as W indicates a group that enables polymerization of a compound containing a polymerizable group through radical polymerization or the like and has a multiple bond between carbon atoms, such as an ethylenic double bond.

Examples of the polymerizable group include a vinyl group, an allyl group, an acryloyl group, a methacryloyl group, a fluorovinyl group, a difluorovinyl group, a trifluorovinyl group, a difluorotrifluoromethyl vinyl group, a trifluoroallyl group, a perfluoroallyl group, a trifluoromethyl acryloyl group, a nonylfluorobutyl acryloyl group, a vinyl ether group, a fluorine-containing vinyl ether group, an allyl ether group, a fluorine-containing allyl ether group, a styryl group, a vinyl naphthyl group, a fluorine-containing styryl group, a fluorine-containing vinyl naphthyl group, a norbornyl group, a fluorine-containing norbornyl group, and a silyl group.

As the polymerizable group-containing group, a group formed of only a polymerizable group or a group formed of a polymerizable group and a group other than the polymerizable group may be employed. Examples of the group other than the polymerizable group include a divalent hydrocarbon group which may have a substituent and a divalent linking group having hetero atoms.

As W, a group represented by Chemical Formula: $CH_2=C(R)-Ya^{x0}-$ is suitably exemplified. In this chemical formula, R represents a hydrogen atom, an alkyl group having 1 to 5 carbon atoms, or a halogenated alkyl group having 1 to 5 carbon atoms, and $Ya^{x0}$ represents a single bond or a divalent linking group.

In the chemical formula shown above, as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable. As R, a hydrogen atom, an alkyl group having 1 to 5 carbon atoms, or a fluorinated alkyl group having 1 to 5 carbon atoms is preferable, a hydrogen atom or a methyl group is more preferable, and a methyl group is particularly preferable in terms of industrial availability.

In the chemical formula shown above, the divalent linking group as $Ya^{x0}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{x0}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x0}$

The aliphatic hydrocarbon group indicates a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be used.

The cyclic aliphatic hydrocarbon group has preferably 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which 2 hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group or a tert-butyl group is particularly preferable.

The alkoxy group as the substituent is preferably an alkoxy group having 1 to 5 carbon atoms, more preferably a methoxy group, an ethoxy group, an n-propoxy group, an iso-propoxy group, an n-butoxy group or a tert-butoxy group, and most preferably a methoxy group or an ethoxy group.

Examples of the halogen atom as the substituent include a fluorine atom, a chlorine atom, a bromine atom, and an iodine atom, and a fluorine atom is preferable.

Examples of the halogenated alkyl group as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group as $Ya^{x0}$

The aromatic hydrocarbon group is a hydrocarbon group having at least one aromatic ring.

The aromatic ring is not particularly limited as long as it is a cyclic conjugated system having (4n+2)π electrons, and may be monocyclic or polycyclic. The aromatic ring has preferably 5 to 30 carbon atoms, more preferably 5 to 20 carbon atoms, still more preferably 6 to 15 carbon atoms, and most preferably 6 to 12 carbon atoms. Here, the number of carbon atoms in a substituent is not included in the number of carbon atoms.

Examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (biphenyl, fluorene or the like); and a group in which one hydrogen atom of a group (an aryl group or a heteroaryl group) obtained by removing one hydrogen atom from the above-described aromatic hydrocarbon ring or aromatic hetero ring has been substituted with an alkylene group (a group in which one hydrogen atom has been further removed from the aryl group in the above-described arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group has preferably 1 to 4 carbon atoms, more preferably 1 or 2 carbon atoms, and most preferably 1 carbon atom.

With respect to the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group or a tert-butyl group is more preferable.

As the alkoxy group, the halogen atom, and the halogenated alkyl group as the substituents, the same groups as the above-described substituent groups for substituting a hydrogen atom in the cyclic aliphatic hydrocarbon group can be exemplified.

Divalent Linking Group Containing Hetero Atom:

In a case where $Ya^{x0}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group or the like), —S—, —S(=O)$_2$—, —S(=O)$_2$—O—, and a group represented by Formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$— [in the formulae, Y$^{21}$ and Y$^{22}$ each independently represent a divalent hydrocarbon group which may have a substituent, O represents an oxygen atom, and m" represents an integer of 0 to 3].

In a case where the divalent linking group containing a hetero atom is —C(=O)—NH—, —C(=O)—NH—C(=O)—, —NH— or —NH—C(=NH)—, H may be substituted with a substituent such as an alkyl group, an acyl group or the like. The substituent (an alkyl group, an acyl group or the like) has preferably 1 to 10 carbon atoms, more preferably 1 to 8 carbon atoms, and most preferably 1 to 5 carbon atoms.

In Formulae —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—, Y$^{21}$ and Y$^{22}$ each independently represent a divalent hydrocarbon group which may have a substituent. Examples of the divalent hydrocarbon group include the same groups as those described above as the "divalent hydrocarbon group which may have a substituent" in the explanation of the above-described divalent linking group.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—, m" represents an integer of 0 to 3, preferably an integer of 0 to 2, more preferably 0 or 1, and particularly preferably 1. In other words, it is particularly preferable that the group represented by Formula —[Y$^{21}$—C(=O)—O]$_{m''}$—Y$^{22}$— is a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

In the description above, as $Ya^{x0}$, a single bond, an ester bond [—C(=O)—O— or —O—C(=O)—], an ether bond (—O—), a linear or branched alkylene group, or a combination of these is preferable, a single bond or an ester bond [—C(=O)—O— or —O—C(=O)—] is more preferable, and an ester bond [—C(=O)—O—] is particularly preferable.

In Formula (a0-1), $Ya^0$ represents a carbon atom. $Xa^0$ represents a group that forms a monocyclic aliphatic hydrocarbon group together with $Ya^0$. As the monocyclic aliphatic hydrocarbon group to be formed by $Xa^0$ together with $Ya^0$, a group in which two hydrogen atoms have been removed from a monocycloalkane is preferable. The monocycloalkane has preferably 3 to 6 carbon atoms, and specific examples thereof include cyclopentane and cyclohexane. Some or all hydrogen atoms in this monocyclic aliphatic hydrocarbon group may be substituted.

In a case where hydrogen atoms in such a monocyclic aliphatic hydrocarbon group are substituted, examples of the substituent include —R$^{P1}$, —R$^{P2}$—O—R$^{P1}$, —R$^{P2}$—CO—R$^{P1}$, —R$^{P2}$—CO—OR$^{P1}$, —R$^{P2}$—O—CO—R$^{P1}$, —R$^{P2}$—OH, —R$^{P2}$—CN, and —R$^{P2}$—COOH (hereinafter, these substituents are also collectively referred to as "Ra$^{05}$").

Here, R$^{P1}$ represents a chain-like monovalent saturated hydrocarbon group having 1 to 10 carbon atoms, a monovalent aliphatic cyclic saturated hydrocarbon group having 3 to 20 carbon atoms, or a monovalent aromatic hydrocarbon group having 6 to 30 carbon atoms. Further, R$^{P2}$ represents a single bond, a chain-like divalent saturated hydrocarbon group having 1 to 10 carbon atoms, a divalent aliphatic cyclic saturated hydrocarbon group having 3 to 20 carbon atoms, or a divalent aromatic hydrocarbon group having 6 to 30 carbon atoms.

Some or all hydrogen atoms in the chain-like saturated hydrocarbon group, the aliphatic cyclic saturated hydrocarbon group, and the aromatic hydrocarbon group as R$^{P1}$ and R$^{P2}$ may be substituted with fluorine atoms. The aliphatic cyclic hydrocarbon group may have one or more of one kind of substituents or one or more of each of plural kinds of the substituents.

Examples of the chain-like monovalent saturated hydrocarbon group having 1 to 10 carbon atoms include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group;

and a polycyclic aliphatic saturated hydrocarbon group such as a bicycle[2.2.2]octanyl group, a tricycle[5.2.1.02,6]decanyl group, a tricycle[3.3.1.13,7]decanyl group, a tetracyclo[6.2.1.13,6.02,7]dodecanyl group, or an adamantyl group.

Examples of the monovalent aromatic hydrocarbon group having 6 to 30 carbon atoms include a group formed by removing one hydrogen atom from an aromatic hydrocarbon ring, such as benzene, biphenyl, fluorene, naphthalene, anthracene, or phenanthrene.

In Formula (a0-1), $Ra^{00}$ represents an aromatic hydrocarbon group which may have a substituent.

Examples of the aromatic hydrocarbon group as $Ra^{00}$ include a group formed by removing one or more hydrogen atoms from an aromatic hydrocarbon group having 5 to 30 carbon atoms. Among the examples, $Ra^{00}$ represents preferably a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from benzene or naphthalene, and most preferably a group formed by removing one or more hydrogen atoms from benzene.

Examples of the substituent which may be included in $Ra^{00}$ in Formula (a0-1) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

Specific examples of the constitutional unit represented by formula (a0-1) are shown below. In each formula, $R^{\alpha}$ represents a hydrogen atom, a methyl group, or a trifluoromethyl group.

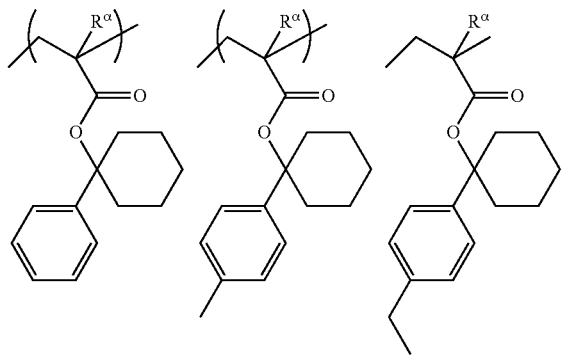

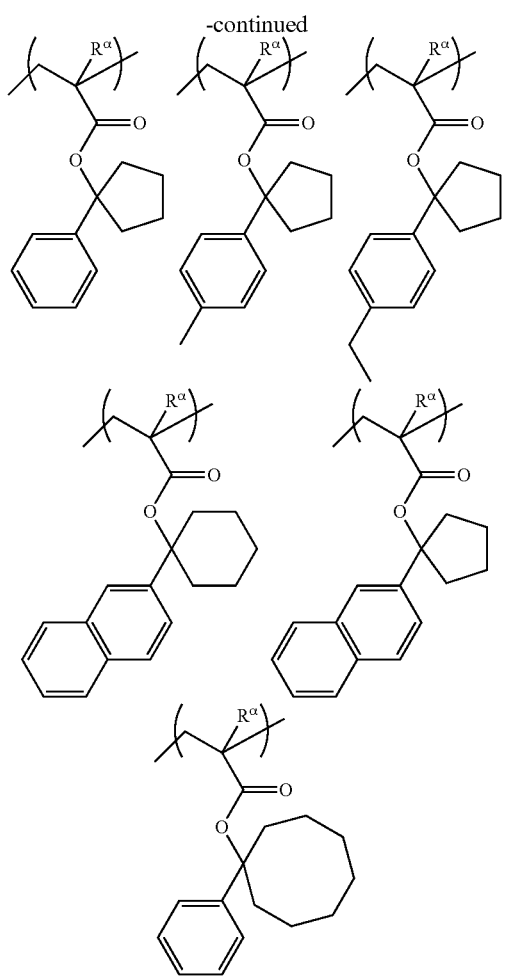

Among the examples, a constitutional unit represented by Formula (a0-1-1) is preferable as the constitutional unit (a0).

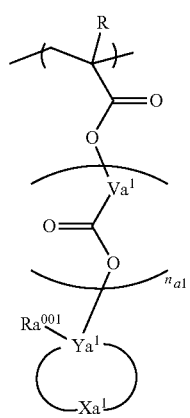

(a0-1-1)

[In the formula, R represents a hydrogen atom, an alkyl group having 1 to 5 carbon atoms, or a halogenated alkyl group having 1 to 5 carbon atoms. $Va^{01}$ represents a divalent hydrocarbon group which may have an ether bond, and $n_a{}^{01}$ represents 0 to 2. $Ya^1$ represents a carbon atom. $Xa^1$ represents a group that forms a cyclopentyl group or a cyclohexyl group together with $Ya^1$. Some or all hydrogen atoms in this cyclopentyl group or cyclohexyl group may be substituted with substituents. $Ra^{001}$ represents a phenyl group or a naphthyl group.

In Formula (a0-1-1), as the alkyl group having 1 to 5 carbon atoms as R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group. The halogenated alkyl group having 1 to 5 carbon atoms is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable. As R, a hydrogen atom, an alkyl group having 1 to 5 carbon atoms, or a fluorinated alkyl group having 1 to 5 carbon atoms is preferable, a hydrogen atom or a methyl group is more preferable, and a methyl group is particularly preferable in terms of industrial availability.

In Formula (a0-1-1), $Va^{01}$ represents a divalent hydrocarbon group which may have an ether bond. The divalent hydrocarbon group as $Va^{01}$ may be an aliphatic hydrocarbon group or an aromatic hydrocarbon group.

The aliphatic hydrocarbon group as the divalent hydrocarbon group represented by Va01 may be saturated or unsaturated, but it is preferable that the aliphatic hydrocarbon group is saturated.

More specific examples of the aliphatic hydrocarbon group include a linear or branched aliphatic hydrocarbon group and an aliphatic hydrocarbon group having a ring in the structure thereof.

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, branched alkylene groups are preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

Examples of the aliphatic hydrocarbon group containing a ring in the structure thereof include an alicyclic hydrocarbon group (a group in which two hydrogen atoms have been removed from an aliphatic hydrocarbon ring), a group in which the alicyclic hydrocarbon group is bonded to the terminal of the above-described linear or branched aliphatic hydrocarbon group, and a group in which the alicyclic hydrocarbon group is interposed in the above-described linear or branched aliphatic hydrocarbon group. The linear or branched aliphatic hydrocarbon group is the same as defined for the above-described linear aliphatic hydrocarbon group or the above-described branched aliphatic hydrocarbon group.

The alicyclic hydrocarbon group has preferably 3 to 20 carbon atoms and more preferably 3 to 12 carbon atoms.

The alicyclic hydrocarbon group may be a monocyclic group or a polycyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Specific examples of the polycycloalkane include adamantane, norbornane, isobornane, tricyclodecane, and tetracyclododecane.

The aromatic hydrocarbon group as the divalent hydrocarbon group represented by $Va^{01}$ is a hydrocarbon group having an aromatic ring.

The aromatic hydrocarbon group has preferably 3 to 30 carbon atoms, more preferably 5 to 30 carbon atoms, still more preferably 5 to 20 carbon atoms, particularly preferably 6 to 15 carbon atoms, and most preferably 6 to 10 carbon atoms. Here, the number of carbon atoms in a substituent is not included in the number of carbon atoms.

Specific examples of the aromatic ring contained in the aromatic hydrocarbon group include aromatic hydrocarbon rings such as benzene, biphenyl, fluorene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom.

Specific examples of the aromatic hydrocarbon group include a group in which two hydrogen atoms have been removed from the above-described aromatic hydrocarbon ring (an arylene group); and a group in which one hydrogen atom of a group (an aryl group) formed by removing one hydrogen atom from the aromatic hydrocarbon ring has been substituted with an alkylene group (a group formed by removing one more hydrogen atom from an aryl group in an arylalkyl group such as a benzyl group, a phenethyl group, a 1-naphthylmethyl group, a 2-naphthylmethyl group, a 1-naphthylethyl group, or a 2-naphthylethyl group). The alkylene group (an alkyl chain in the arylalkyl group) has preferably 1 to 4 carbon atoms, more preferably 1 or 2 carbon atoms, and most preferably 1 carbon atom.

The constitutional unit (a0) included in the component (A1) may be used alone or two or more kinds thereof.

The proportion of the constitutional unit (a0) in the component (A1) is preferably in a range of 5% to 70% by mole, more preferably in a range of 5% to 65% by mole, and still more preferably in a range of 5% to 50% by mole with respect to the total amount (100% by mole) of all constitutional units constituting the component (A1).

By setting the proportion of the constitutional unit (a0) to be greater than or equal to the lower limit, a resist pattern can be easily obtained, and lithography characteristics of enhancing the sensitivity, the resolution, the roughness, and the like are improved.

Further, by setting the proportion of the constitutional unit (a0) to be lower than or equal to the upper limit, the constitutional unit (a0) and other constitutional units can be balanced.

Constitutional Unit (a1):

The constitutional unit (a1) is a constitutional unit (here, a constitutional unit corresponding to the constitutional unit (a0) is excluded) containing an acid decomposable group whose polarity is increased due to an action of an acid.

Examples of the acid decomposable group whose polarity is increased due to the action of an acid include groups which are decomposed due to the action of an acid to form a polar group.

Examples of the polar group include a carboxy group, a hydroxyl group, an amino group, and a sulfo group (—$SO_3H$). Among these, a polar group containing —OH in the structure thereof (hereinafter, also referred to as a "OH-containing polar group") is preferable, a carboxy group or a hydroxyl group is more preferable, and a carboxy group is particularly preferable.

More specific examples of the acid decomposable group include a group in which the above-described polar group has been protected with an acid dissociable group (such as a group in which a hydrogen atom of the OH-containing polar group has been protected with an acid dissociable group).

Here, the "acid dissociable group" indicates both (i) group in which a bond between the acid dissociable group and an atom adjacent to the acid dissociable group can be cleaved due to the action of an acid; and (ii) group in which some bonds are cleaved due to the action of an acid, and then a decarboxylation reaction occurs, thereby cleaving the bond between the acid dissociable group and the atom adjacent to the acid dissociable group.

It is necessary that the acid dissociable group that constitutes the acid decomposable group is a group which exhibits a lower polarity than the polar group generated by the dissociation of the acid dissociable group. Thus, in a case where the acid dissociable group is dissociated by the action of an acid, a polar group exhibiting a higher polarity than that of the acid dissociable group is generated, thereby increasing the polarity. As a result, the polarity of the entire component (A1) is increased. By the increase in the polarity, relatively, the solubility in a developing solution changes, and the solubility in an alkali developing solution is increased, whereas the solubility in an organic developing solution is relatively decreased.

Examples of the acid dissociable group include those which have been suggested as an acid decomposable group of a base resin for a chemical amplified resist composition.

Specific examples of acid dissociable groups for the base resin of a conventional chemically amplified resist composition include an "acetal type acid dissociable group", a "tertiary alkyl ester type acid dissociable group", and a "tertiary alkyloxycarbonyl acid dissociable group" described below.

Acetal Type Acid Dissociable Group:

Examples of the acid dissociable group for protecting a carboxy group or a hydroxyl group as a polar group include the acid dissociable group represented by Formula (a1-r-1) shown below (hereinafter, also referred to as "acetal type acid dissociable group").

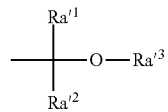

(a1-r-1)

[In the formula, $Ra'^1$ and $Ra'^2$ represents a hydrogen atom or an alkyl group, and $Ra'^3$ represents a hydrocarbon group, provided that $Ra'^3$ may be bonded to $Ra'^1$ or $Ra'^2$.]

In Formula (a1-r-1), it is preferable that at least one of $Ra'^1$ and $Ra'^2$ represents a hydrogen atom and more preferable that both of $Ra'^1$ and $Ra'^2$ represent a hydrogen atom.

In a case where $Ra'^1$ or $Ra'^2$ represents an alkyl group, examples of the alkyl group include the same alkyl groups exemplified as the substituent which may be bonded to the carbon atom at the α-position in the description on α-substituted acrylic acid ester. Among these, an alkyl group having 1 to 5 carbon atoms is preferable. Specific examples thereof include linear or branched alkyl groups. Specific examples of the alkyl group include a methyl group, an ethyl group, a propyl group, an isopropyl group, an n-butyl group, an isobutyl group, a tert-butyl group, a pentyl group, an isopentyl group, and a neopentyl group. Among these, a methyl group or an ethyl group is preferable, and a methyl group is particularly preferable.

In Formula (a1-r-1), examples of the hydrocarbon group as $Ra'^3$ include a linear or branched alkyl group and a cyclic hydrocarbon group.

The linear alkyl group has preferably 1 to 5 carbon atoms, more preferably 1 to 4, and still more preferably 1 or 2. Specific examples thereof include a methyl group, an ethyl group, an n-propyl group, an n-butyl group, and an n-pentyl group. Among these, a methyl group, an ethyl group, or an n-butyl group is preferable, and a methyl group or an ethyl group is more preferable.

The branched alkyl group has preferably 3 to 10 carbon atoms and more preferably 3 to 5 carbon atoms. Specific examples thereof include an isopropyl group, an isobutyl group, a tert-butyl group, an isopentyl group, a neopentyl group a 1,1-diethylpropyl group, and a 2,2-dimethylbutyl group. Among these, an isopropyl group is preferable.

In a case where $Ra'^3$ represents a cyclic hydrocarbon group, the cyclic hydrocarbon group may be an aliphatic hydrocarbon group or an aromatic hydrocarbon group, and may be polycyclic or monocyclic.

As the aliphatic hydrocarbon group which is a monocyclic group, a group in which one hydrogen atom has been removed from a monocycloalkane is preferable. The monocycloalkane has preferably 3 to 6 carbon atoms, and specific examples thereof include cyclopentane and cyclohexane.

As the aliphatic hydrocarbon group which is a polycyclic group, a group in which one hydrogen atom has been removed from a polycycloalkane is preferable, and the polycyclic group has preferably 7 to 12 carbon atoms, and specific examples of the polycycloalkane include adamantane, norbornane, isobornane, tricyclodecane, and tetracyclododecane.

In a case where the cyclic hydrocarbon group as $Ra'^3$ becomes an aromatic hydrocarbon group, the aromatic hydrocarbon group is a hydrocarbon group having at least one aromatic ring.

The aromatic ring is not particularly limited as long as it is a cyclic conjugated system having (4n+2)π electrons, and may be monocyclic or polycyclic. The aromatic ring has preferably 5 to 30 carbon atoms, more preferably 5 to 20 carbon atoms, still more preferably 6 to 15 carbon atoms, and most preferably 6 to 12 carbon atoms. Here, the number of carbon atoms in a substituent is not included in the number of carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group as $Ra'^3$ include a group in which one hydrogen atom has been removed from the above-described aromatic hydrocarbon ring or aromatic hetero ring (an aryl group or a heteroaryl group); a group in which one hydrogen atom has been removed from an aromatic compound having two or more aromatic rings (biphenyl, fluorene or the like); and a group in which one hydrogen atom of the above-described aromatic hydrocarbon ring or aromatic hetero ring has been substituted with an alkylene group (an arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aromatic hydrocarbon ring or aromatic hetero ring has preferably 1 to 4 carbon atoms, more preferably 1 or 2 carbon atoms, and particularly preferably 1 carbon atom.

The cyclic hydrocarbon group as $Ra'^3$ may have a substituent. Examples of the substituent are the same as those exemplified above as $Ra^{05}$.

In a case where $Ra'^3$ is bonded to $Ra'^1$ or $Ra'^2$ to form a ring, the cyclic group is preferably a 4- to 7-membered ring, and more preferably a 4- to 6-membered ring. Specific examples of the cyclic group include a tetrahydropyranyl group and a tetrahydrofuranyl group.

Tertiary Alkyl Ester Type Acid Dissociable Group:

Examples of the acid dissociable group for protecting the carboxy group as a polar group include the acid dissociable group represented by Formula (a1-r-2) shown below. Among the acid dissociable groups represented by Formula (a1-r-2), for convenience, a group which is constituted of alkyl groups is referred to as "tertiary alkyl ester type acid dissociable group".

(a1-r-2)

[In the formula, $Ra'^4$ to $Ra'^6$ each independently represent a hydrocarbon group, provided that $Ra'^5$ and $Ra'^6$ may be bonded to each other to form a ring.]

Examples of the hydrocarbon group as $Ra'^4$ include a linear or branched alkyl group, a chain-like or cyclic alkenyl group, and a cyclic hydrocarbon group.

Examples of the linear or branched alkyl group and the cyclic hydrocarbon group (an aliphatic hydrocarbon group which is a monocyclic group, an aliphatic hydrocarbon group which is a polycyclic group, or an aromatic hydrocarbon group) as $Ra'^4$ are the same as those exemplified above as $Ra'^3$.

As the chain-like or cyclic alkenyl group as $Ra'^4$, an alkenyl group having 2 to 10 carbon atoms is preferable.

Examples of the hydrocarbon group as $Ra'^5$ or $Ra'^6$ are the same as those exemplified above as $Ra'^3$.

In a case where $Ra'^5$ and $Ra'^6$ are bonded to form a ring, suitable examples thereof include a group represented by Formula (a1-r2-1), a group represented by Formula (a1-r2-2), and a group represented by Formula (a1-r2-3).

Meanwhile, $Ra'^4$ to $Ra'^6$ are not bonded to one another and represent an independent hydrocarbon group, suitable examples thereof include a group represented by Formula (a1-r2-4).

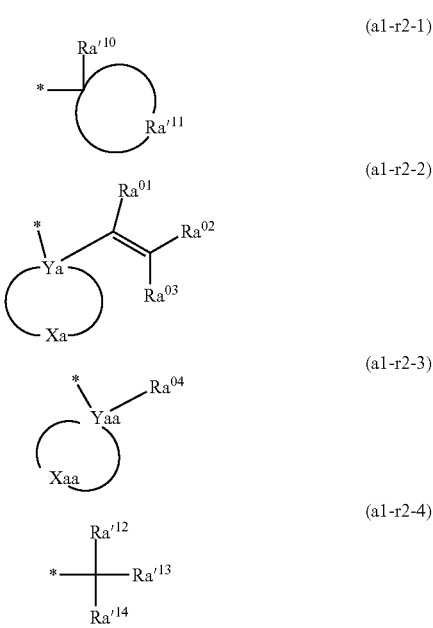

[In Formula (a1-r2-1), $Ra'^{10}$ represents an alkyl group having 1 to 10 carbon atoms, and $Ra'^{11}$ represents a group that forms an aliphatic cyclic group together with the carbon atom to which $Ra'^{10}$ is bonded. In Formula (a1-r2-2), Ya represents a carbon atom. Xa represents a group that forms a cyclic hydrocarbon group together with Ya. Some or all hydrogen atoms in this cyclic hydrocarbon group may be substituted.

$Ra^{01}$ to $Ra^{03}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in this cyclic saturated hydrocarbon group and the aliphatic cyclic saturated hydrocarbon group may be substituted. Two or more of $Ra^{01}$ to $Ra^{03}$ may be bonded to one another to form a cyclic structure. The symbol "*" represents a bonding site. In Formula (a1-r2-3), Yaa represents a carbon atom. Xaa represents a group that forms an aliphatic cyclic group together with Yaa (here, a monocyclic aliphatic hydrocarbon group is excluded). $Ra^{04}$ represents an aromatic hydrocarbon group which may have a substituent. The symbol "*" represents a bonding site. In Formula (a1-r2-4), $Ra'^{12}$ and $Ra'^{13}$ each independently represent a monovalent saturated hydrocarbon having 1 to 10 carbon atoms or a hydrogen atom. Some or all hydrogen atoms in this cyclic saturated hydrocarbon group may be substituted. $Ra'^{14}$ represents an aromatic hydrocarbon group which may have a substituent. The symbol "*" represents a bonding site (the same applies hereinafter).]

In Formula (a1-r2-1), as the alkyl group having 1 to 10 carbon atoms as $Ra'^{10}$, a group exemplified as the linear or branched alkyl group represented by $Ra'^{3}$ in Formula (a1-r-1) is preferable.

It is preferable that $Ra'^{10}$ represents an alkyl group having 1 to 5 carbon atoms. In Formula (a1-r2-1), as the aliphatic cyclic group that is formed by $Ra'^{11}$ together with the carbon atom to which $Ra'^{10}$ is bonded, a group exemplified as the aliphatic hydrocarbon group which is a monocyclic group or a polycyclic group as $Ra'^{3}$ in Formula (a1-r-1) is preferable.

In Formula (a1-r2-2), as the cyclic hydrocarbon group that is formed by Xa together with Ya, a group formed by further removing one or more hydrogen atoms from the cyclic monovalent hydrocarbon group (such as a monocyclic aliphatic hydrocarbon group, a polycyclic aliphatic hydrocarbon group, or an aromatic hydrocarbon group) as $Ra'^{3}$ in Formula (a1-r-1) is exemplified.

The cyclic hydrocarbon group that is formed by Xa together with Ya may have a substituent. Examples of the substituent are the same as those exemplified as the substituents which may be included in the cyclic hydrocarbon group as $Ra'^{3}$.

In Formula (a1-r2-2), examples of the cyclic monovalent hydrocarbon group having 1 to 10 carbon atoms as $Ra^{01}$ to $Ra^{03}$ include a methyl group, an ethyl group, a propyl group, a butyl group, a pentyl group, a hexyl group, a heptyl group, an octyl group, and a decyl group.

Examples of the monovalent aliphatic cyclic saturated hydrocarbon group having 3 to 20 carbon atoms as $Ra^{01}$ to $Ra^{03}$ include a monocyclic aliphatic saturated hydrocarbon group such as a cyclopropyl group, a cyclobutyl group, a cyclopentyl group, a cyclohexyl group, a cycloheptyl group, a cyclooctyl group, a cyclodecyl group, or a cyclododecyl group; and a polycyclic aliphatic saturated hydrocarbon group such as a bicycle[2.2.2]octanyl group, a tricycle [5.2.1.02,6]decanyl group, a tricycle[3.3.1.13,7]decanyl group, a tetracyclo[6.2.1.13,6.02,7]dodecanyl group, or an adamantyl group.

From the viewpoint of easily synthesizing a monomer compound from which the constitutional unit (a1) is derived, it is preferable that $Ra^{01}$ to $Ra^{03}$ represents a hydrogen atom or a chain-like monovalent saturated hydrocarbon group having 1 to 10 carbon atoms. Among these, a hydrogen atom, a methyl group, or an ethyl group is more preferable, and a hydrogen atom is particularly preferable.

Examples of the substituent included in the cyclic saturated hydrocarbon group or the aliphatic cyclic saturated hydrocarbon group represented by $Ra^{01}$ to $Ra^{03}$ are the same as those exemplified as $Ra^{05}$.

Examples of the group having a carbon-carbon double bond generated by two or more of $Ra^{01}$ to $Ra^{03}$ being bonded to one another to form a cyclic structure include a cyclopentenyl group, a cyclohexenyl group, a methylcyclopentenyl group, a methylcyclohexenyl group, a cyclopentylidenethenyl group, and a cyclohexylidenethenyl group. Among these, from the viewpoint of easily synthesizing a monomer compound from which the constitutional unit (a1) is derived, a cyclopentenyl group, a cyclohexenyl group, or a cyclopentylidenethenyl group is preferable.

In Formula (a1-r2-3), as the aliphatic cyclic group that is formed by Xaa together with Yaa, a group exemplified as the aliphatic hydrocarbon group which is a polycyclic group as $Ra'^{3}$ in Formula (a1-r-1) is preferable.

In Formula (a1-r2-3), examples of the aromatic hydrocarbon group as $Ra^{04}$ include a group formed by removing one or more hydrogen atoms from an aromatic hydrocarbon group having 5 to 30 carbon atoms. Among the examples, $Ra^{04}$ represents preferably a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from benzene or naphthalene, and most preferably a group formed by removing one or more hydrogen atoms from benzene.

Examples of the substituent which may be included in Ra04 in Formula (a1-r2-3) include a methyl group, an ethyl group, a propyl group, a hydroxyl group, a carboxyl group, a halogen atom (such as a fluorine atom, a chlorine atom, or a bromine atom), an alkoxy group (such as a methoxy group, an ethoxy group, a propoxy group, or a butoxy group), and an alkyloxycarbonyl group.

In Formula (a1-r2-4), $Ra'^{12}$ and $Ra'^{13}$ each independently represent a chain-like monovalent saturated hydrocarbon group having 1 to 10 carbon atoms or a hydrogen atom. Examples of the chain-like monovalent saturated hydrocarbon group having 1 to 10 carbon atoms as $Ra'^{12}$ and $Ra'^{13}$ are the same as those exemplified as the chain-like monovalent saturated hydrocarbon group having 1 to 10 carbon atoms as $Ra^{01}$ to $Ra^{03}$. Some or all hydrogen atoms in the chain-like saturated hydrocarbon group may be substituted.

$Ra'^{12}$ and $Ra'^{13}$ represent preferably a hydrogen atom or an alkyl group having 1 to 5 carbon atoms, more preferably an alkyl group having 1 to 5 carbon atoms, still more preferably a methyl group or an ethyl group, and particularly preferably a methyl group.

In a case where the chain-like saturated hydrocarbon group represented by $Ra'^{12}$ and $Ra'^{13}$ is substituted, examples of the substituent are the same as those exemplified as $Ra^{05}$.

In Formula (a1-r2-4), $Ra'^{14}$ represents an aromatic hydrocarbon group which may have a substituent. Examples of the aromatic hydrocarbon group as Ra'14 are the same as those exemplified as the aromatic hydrocarbon group as $Ra^{04}$. Among these, $Ra'^{14}$ represents preferably a group formed by removing one or more hydrogen atoms from an aromatic hydrocarbon group having 6 to 15 carbon atoms, more preferably a group formed by removing one or more hydrogen atoms from benzene, naphthalene, anthracene, or phenanthrene, still more preferably a group formed by removing one or more hydrogen atoms from benzene, naphthalene, or anthracene, particularly preferably a group formed by removing one or more hydrogen atoms from naphthalene or anthracene, and most preferably a group formed by removing one or more hydrogen atoms from naphthalene.

Examples of the substituent which may be included in $Ra'^{14}$ are the same as those exemplified as the substituent which may be included in $Ra^{04}$.

In a case where $Ra'^{14}$ in Formula (a1-r2-4) represents a naphthyl group, the position bonded to the tertiary carbon atom in Formula (a1-r2-4) may be the 1-position or the 2-position of the naphthyl group.

In a case where $Ra'^{14}$ in Formula (a1-r2-4) represents an anthryl group, the position bonded to the tertiary carbon atom in Formula (a1-r2-4) may be the 1-position or the 9-position of the anthryl group.

Specific examples of the group represented by Formula (a1-r2-1) are shown below.
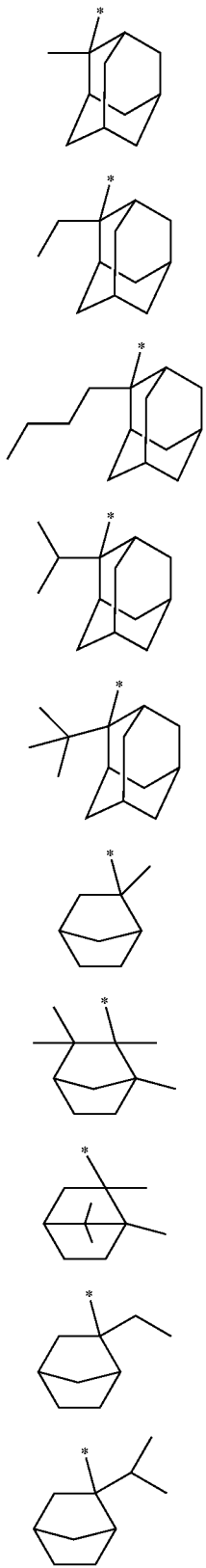
(r-pr-m1)
(r-pr-m2)
(r-pr-m3)
(r-pr-m4)
(r-pr-m5)
(r-pr-m6)
(r-pr-m7)
(r-pr-m8)
(r-pr-m9)
(r-pr-m10)
-continued
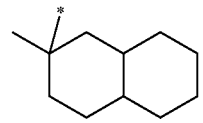
(r-pr-m11)
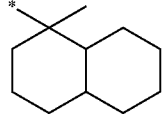
(r-pr-m12)
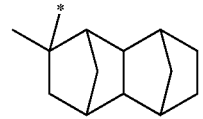
(r-pr-m13)
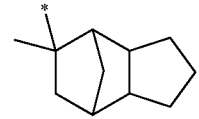
(r-pr-m14)
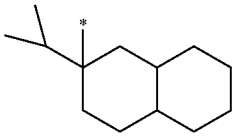
(r-pr-m15)
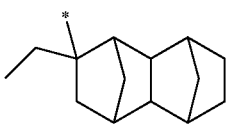
(r-pr-m16)
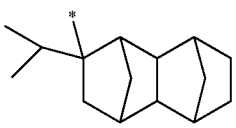
(r-pr-m17)
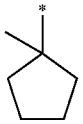
(r-pr-s1)
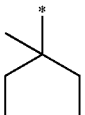
(r-pr-s2)
(r-pr-s3)
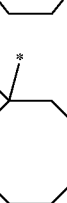
(r-pr-s4)

(r-pr-s5) 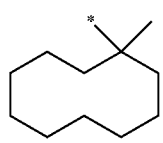
(r-pr-s6) 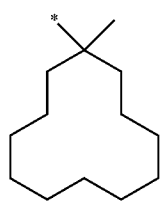
(r-pr-s7) 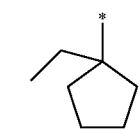
(r-pr-s8) 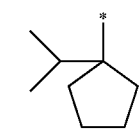
(r-pr-s9) 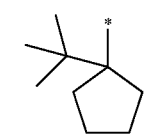
(r-pr-s10) 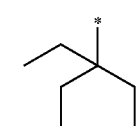
(r-pr-s11) 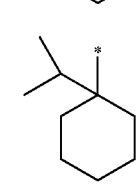
(r-pr-s12) 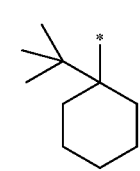
(r-pr-s13) 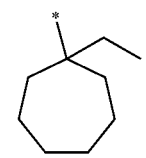
(r-pr-s14) 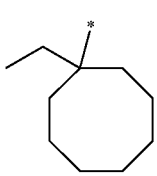
(r-pr-s15) 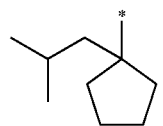
(r-pr-s16) 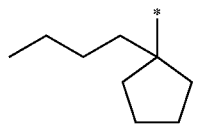
(r-pr-s17) 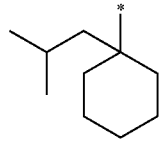
(r-pr-s18) 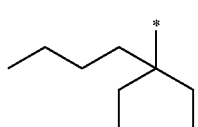
(r-pr-s21) 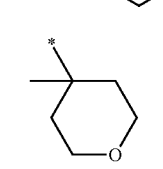
(r-pr-s22) 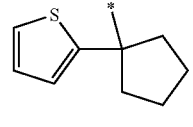
(r-pr-s23) 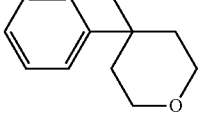
Specific examples of the group represented by Formula (a1-r2-2) are shown below.
(r-pr-mv1) 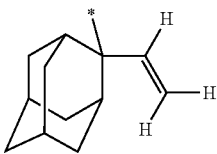
(r-pr-mv2) 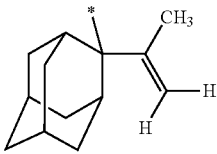
(r-pr-mv3) 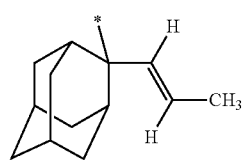

(r-pr-mv4)
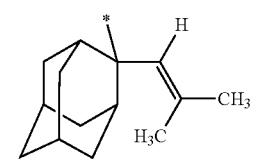
(r-pr-mv5)
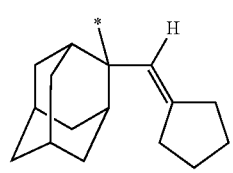
(r-pr-mv6)
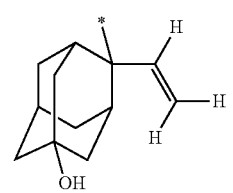
(r-pr-mv7)
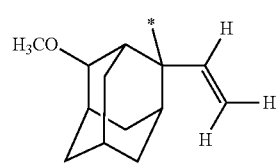
(r-pr-mv8)
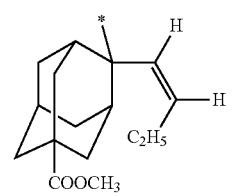
(r-pr-mv9)
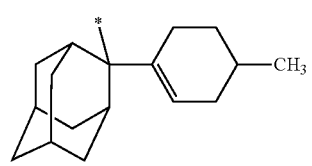
(r-pr-mv10)
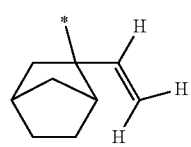
(r-pr-mv11)
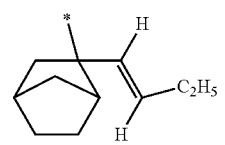
(r-pr-mv12)
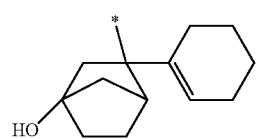
(r-pr-mv13)
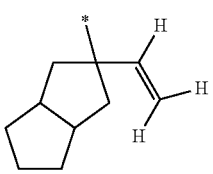
(r-pv-mv14)
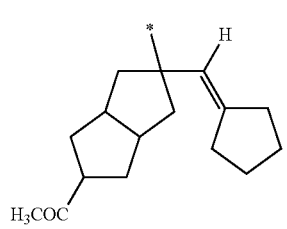
(r-pr-mv15)
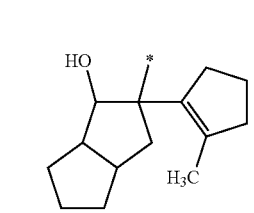
(r-pr-mv16)
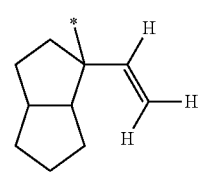
(r-pr-mv17)
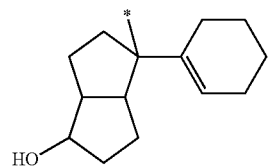
(r-pr-mv18)
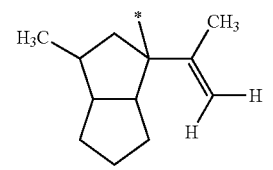
(r-pr-mv19)
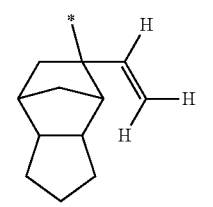
(r-pr-mv20)
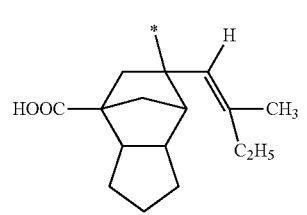

-continued (r-pr-mv21)

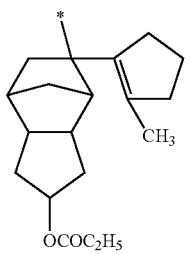

Specific examples of the group represented by Formula (a1-r2-3) are shown below.

(r-pr-ma1)

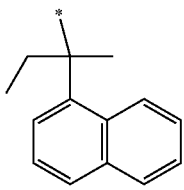

(r-pr-ma2)

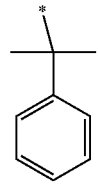

Specific examples of the group represented by Formula (a1-r2-4) are shown below.

(r-pr-cm1)

(r-pr-cm2)

(r-pr-cm3)

-continued (r-pr-cm4)

(r-pr-cs1)

(r-pr-cs2)

Tertiary Alkyloxycarbonyl Acid Dissociable Group

Examples of the acid dissociable group for protecting a hydroxyl group as a polar group include an acid dissociable group (hereinafter, for convenience, also referred to as "tertiary alkyloxycarbonyl type acid dissociable group") represented by Formula (a1-r-3) shown below.

(a1-r-3)

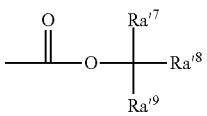

[In the formula, $Ra'^7$ to $Ra'^9$ each independently represent an alkyl group.]

In Formula (a1-r-3), $Ra'^7$ to $Ra'^9$ each independently represent preferably an alkyl group having 1 to 5 carbon atoms and more preferably an alkyl group having 1 to 3 carbon atoms.

Further, the total number of carbon atoms in each alkyl group is preferably in a range of 3 to 7, more preferably in a range of 3 to 5, and most preferably 3 or 4.

Examples of the constitutional unit (a1) include a constitutional unit derived from acrylic acid ester in which the hydrogen atom bonded to the carbon atom at the α-position may be substituted with a substituent; a constitutional unit derived from acrylamide; a constitutional unit in which at least some hydrogen atoms in a hydroxyl group of a constitutional unit derived from hydroxystyrene or a hydroxystyrene derivative are protected by a substituent containing the acid decomposable group; and a constitutional unit in which some hydrogen atoms in —C(=O)—OH of a constitutional unit derived from vinylbenzoic acid or a vinylbenzoic acid derivative are protected by a substituent containing the acid decomposable group.

Among the examples, as the constitutional unit (a1), a constitutional unit derived from acrylic acid ester in which the hydrogen atom bonded to the carbon atom at the α-position may be substituted with a substituent is preferable.

Specific preferred examples of such a constitutional unit (a1) include constitutional units represented by Formula (a1-1) or (a1-2) shown below.

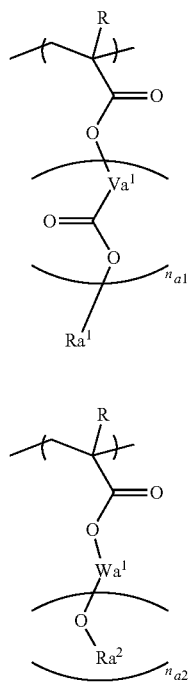

(a1-1)

(a1-2)

[In the formula, R represents a hydrogen atom, an alkyl group having 1 to 5 carbon atoms, or a halogenated alkyl group having 1 to 5 carbon atoms, $Va^1$ represents a divalent hydrocarbon group which may contain an ether bond, $n_{a1}$ represents an integer of 0 to 2, and $Ra^1$ represents an acid dissociable group represented by Formula (a1-r-1) or (a1-r-2). $Wa^1$ represents a $(n_{a2}+1)$-valent hydrocarbon group, $n_{a2}$ represents an integer of 1 to 3, and $Ra^2$ represents an acid dissociable group represented by Formula (a1-r-1) or (a1-r-3)].

In Formula (a1-1), R and $Va^1$ each have the same definition as that for R and $Va^1$ in Formula (a0-1-1).

In Formula (a1-1), Ra1 represents an acid dissociable group represented by Formula (a1-r-1) or (a1-r-2).

In Formula (a1-2), the $(n_{a2}+1)$-valent hydrocarbon group as $Wa^1$ may be an aliphatic hydrocarbon group or an aromatic hydrocarbon group. The aliphatic hydrocarbon group indicates a hydrocarbon group that has no aromaticity, and may be saturated or unsaturated, but is preferably saturated. Examples of the aliphatic hydrocarbon group include a linear or branched aliphatic hydrocarbon group, an aliphatic hydrocarbon group containing a ring in the structure thereof, and a combination of the linear or branched aliphatic hydrocarbon group and the aliphatic hydrocarbon group containing a ring in the structure thereof. The valency of $n_{a2}+1$ is preferably divalent, trivalent or tetravalent, and divalent or trivalent is more preferable.

Specific examples of the constitutional unit represented by Formula (a1-1) are shown below. In each formula shown below, $R^\alpha$ represents a hydrogen atom, a methyl group, or a trifluoromethyl group.

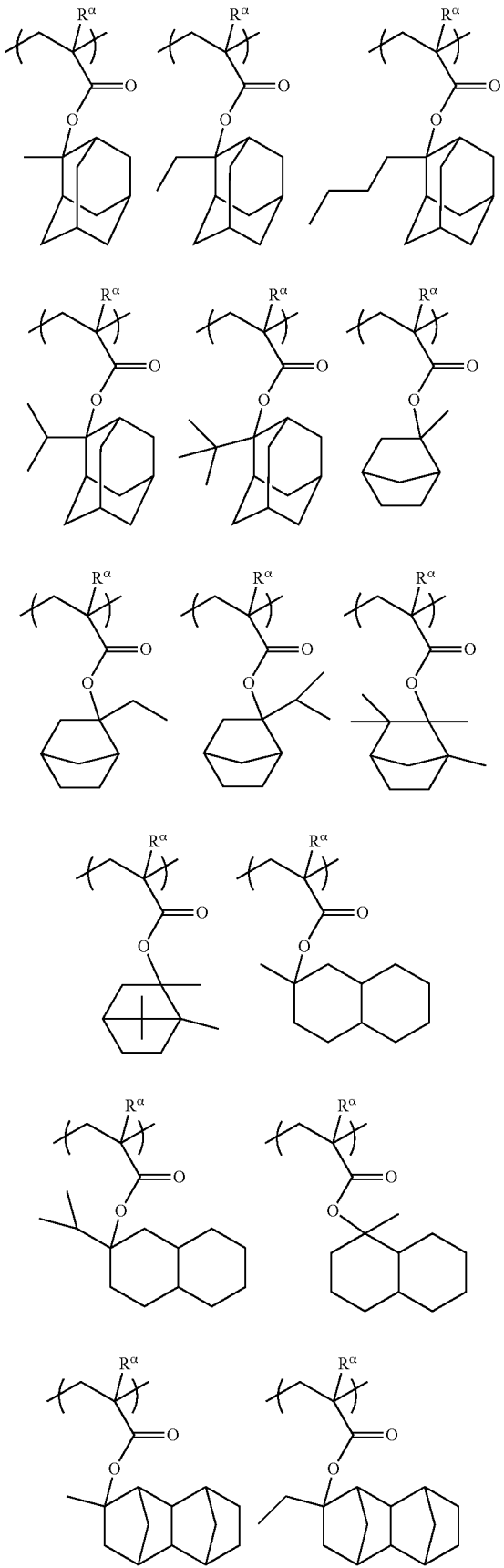

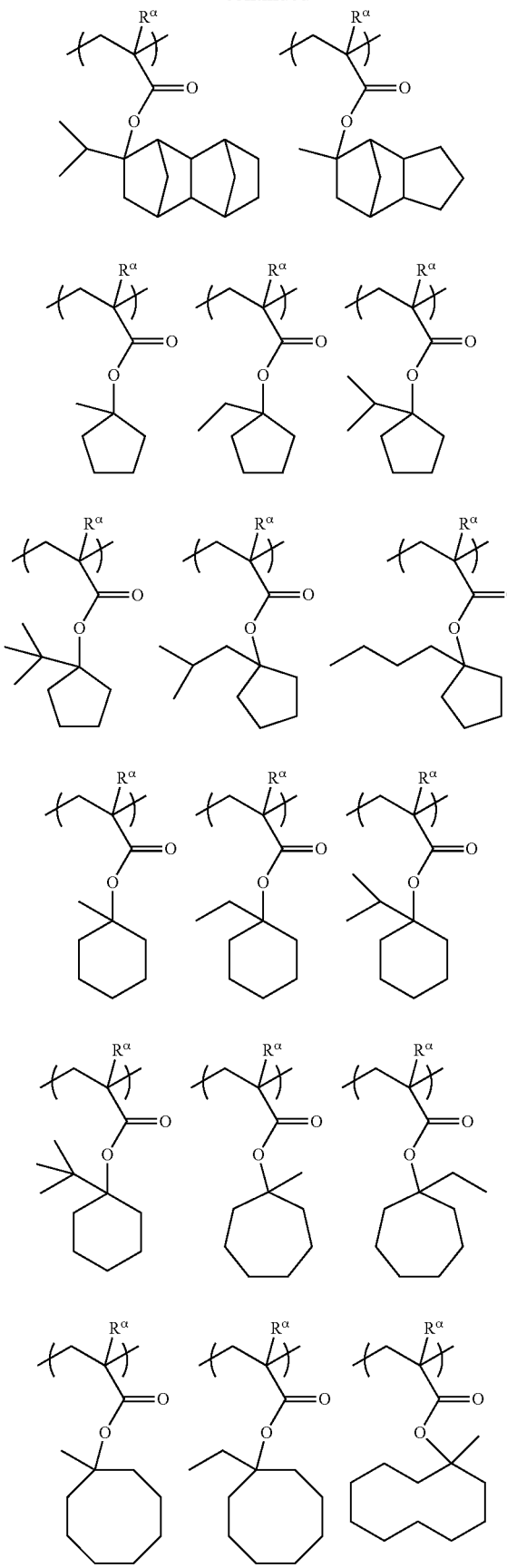
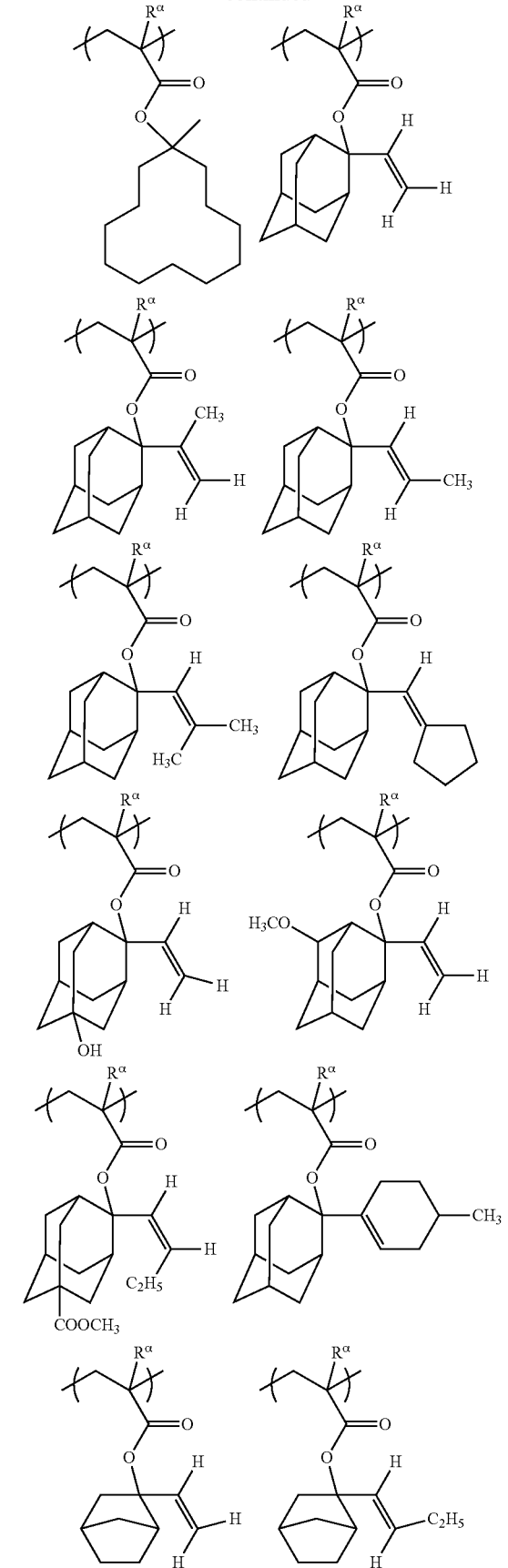

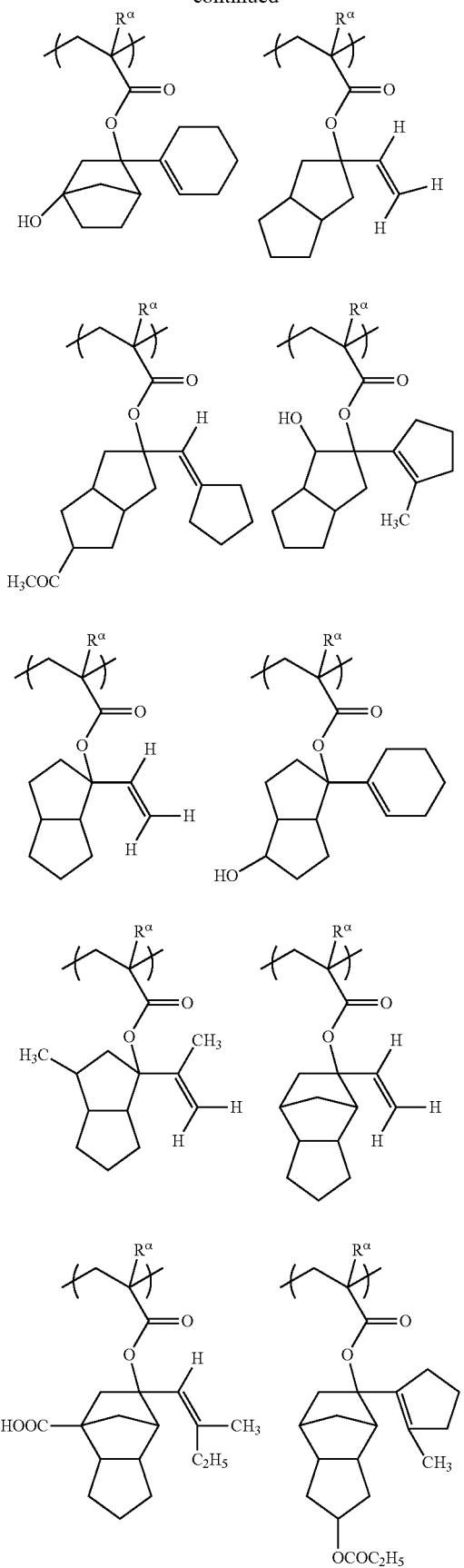
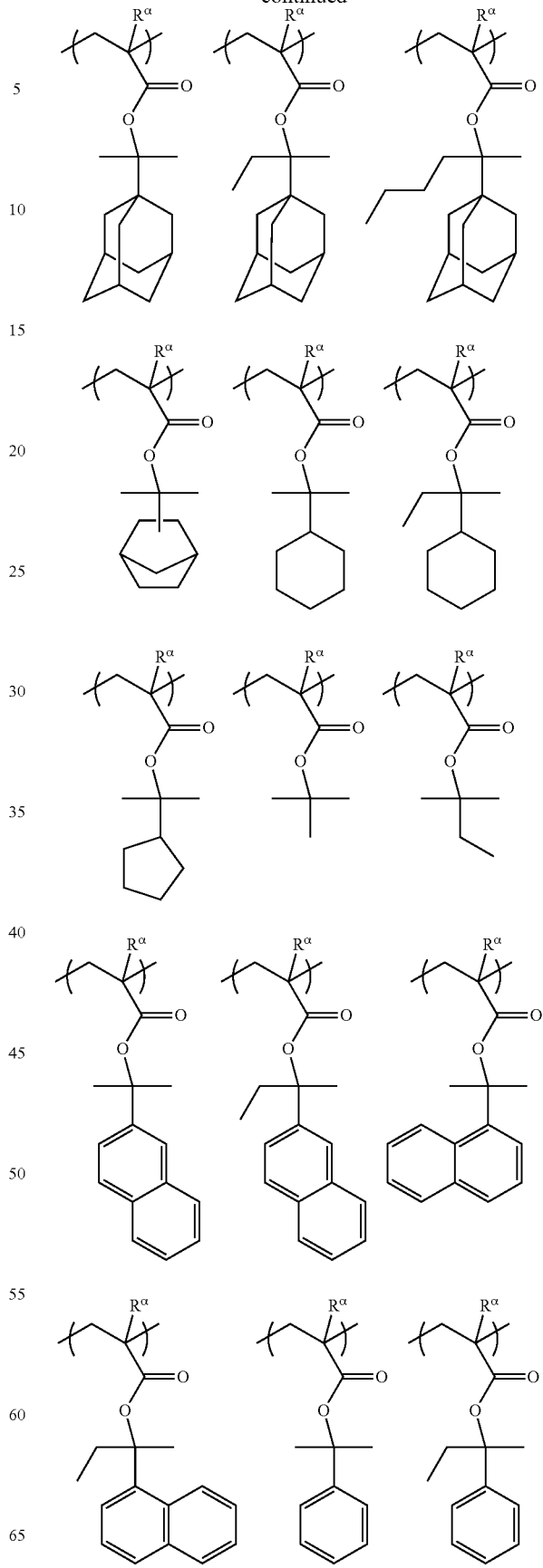

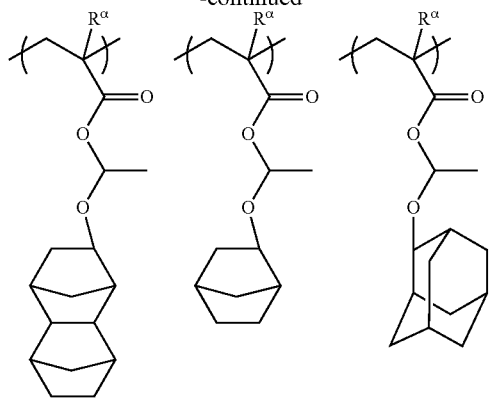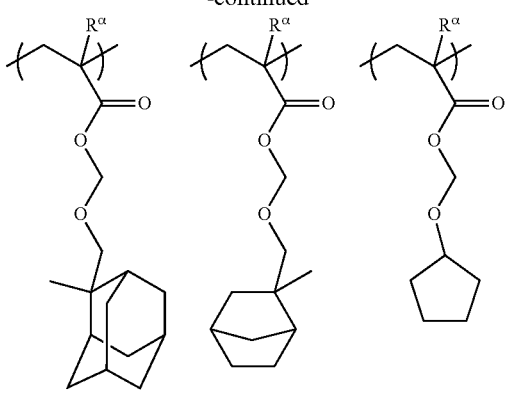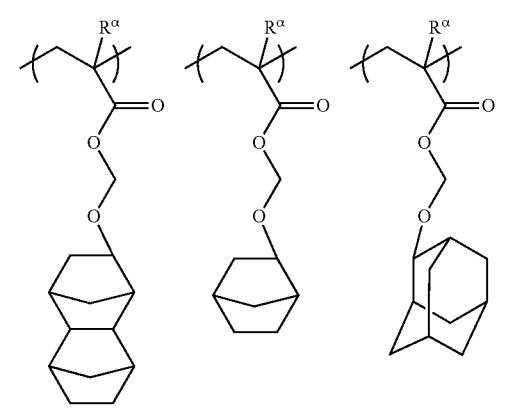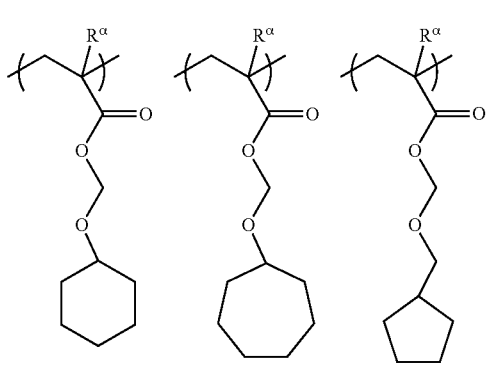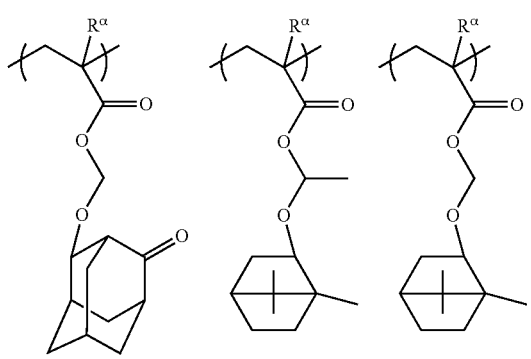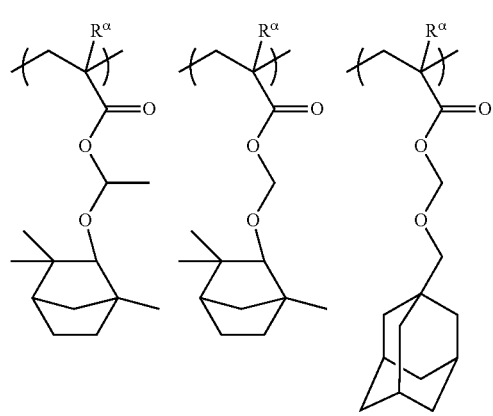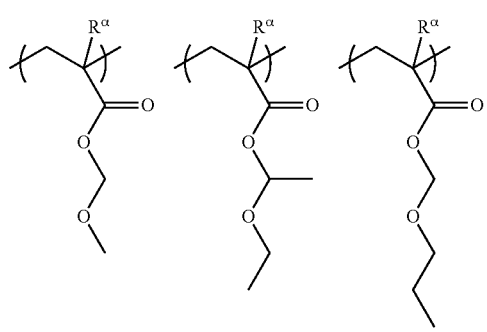

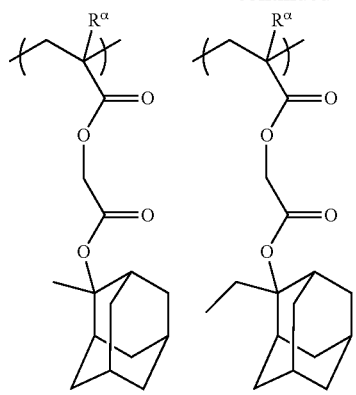
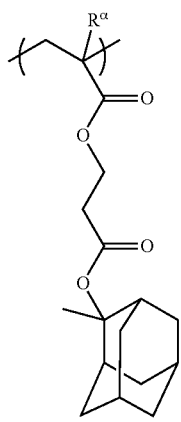
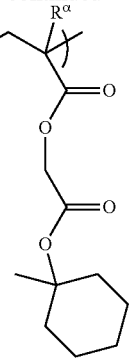
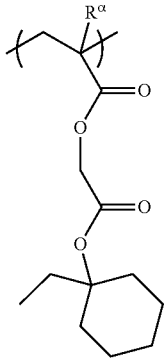
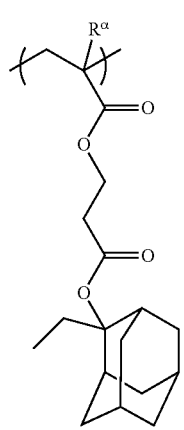
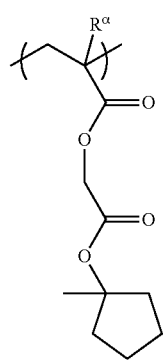
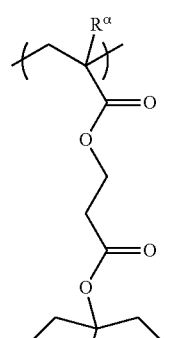
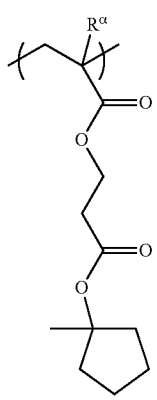
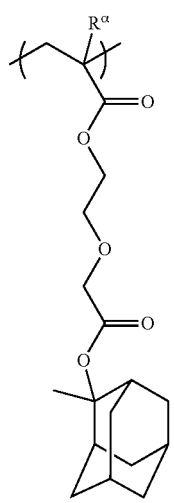
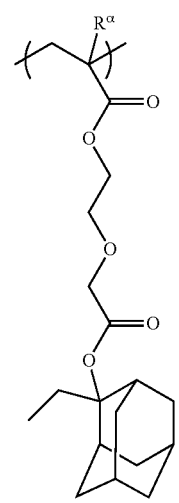
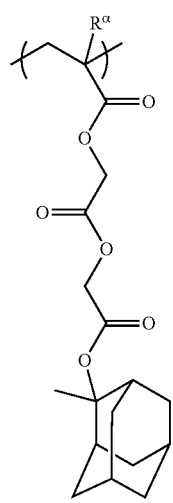
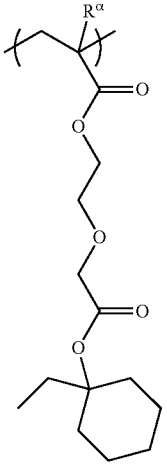
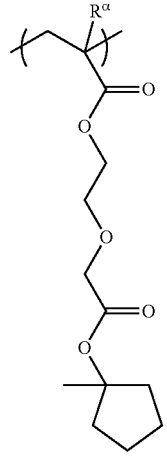
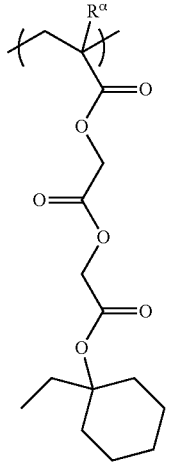

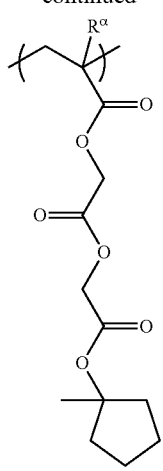

Specific examples of the constitutional unit represented by Formula (a1-2) are shown below.

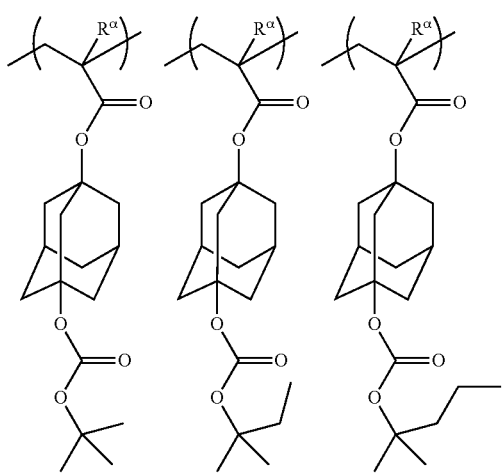

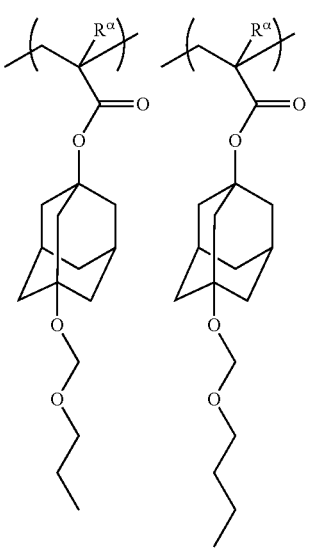

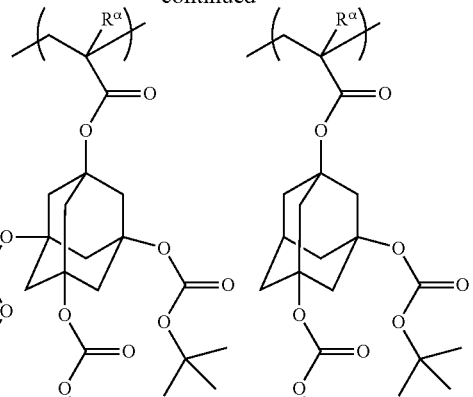

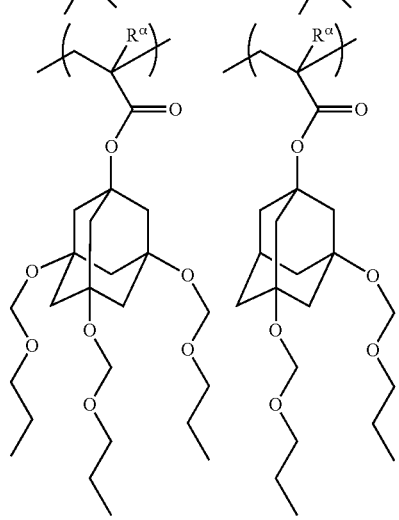

The constitutional unit (a1) included in the component (A1) may be used alone or two or more kinds thereof.

Since the lithography characteristics (the sensitivity, the shape, and the like) are easily improved using electron beams or EUV, a constitutional unit represented by Formula (a1-1) is preferable as the constitutional unit (a1).

Further, from the viewpoint of reducing the roughness, an acid dissociable group represented by Formula (a1-r2-11) or (a1-r2-21) is preferable as the acid dissociable group as $Ra^1$ in Formula (a1-1).

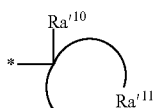

(a1-r2-11)

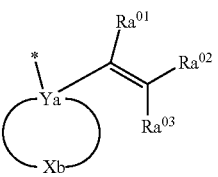

(a1-r2-21)

[In Formula (a1-r2-11), $Ra'^{10}$ represents an alkyl group having 1 to 10 carbon atoms, $Ra'^{111}$ represents a group that forms a monocyclic aliphatic cyclic group together with the carbon atom to which Ra'$^{10}$ is bonded. In Formula (a1-r2-2), Ya represents a carbon atom. Xb represents a group that forms a monocyclic aliphatic hydrocarbon group together with Ya. Some or all hydrogen atoms in this cyclic aliphatic hydrocarbon group may be substituted. Ra$^{01}$ to Ra$^{03}$ each independently represent a hydrogen atom, a chain-like monovalent saturated hydrocarbon group having 1 to 10 carbon atoms, or a monovalent aliphatic cyclic saturated hydrocarbon group having 3 to 20 carbon atoms. Some or all hydrogen atoms in the cyclic saturated hydrocarbon group and the aliphatic cyclic saturated hydrocarbon group may be substituted. Two or more of Ra$^{01}$ to Ra$^{03}$ may be bonded to one another to form a cyclic structure. The symbol "*" represents a bonding site.]

In Formula (a1-r2-11), Ra'$^{10}$ has the same definition as that for Ra'$^{10}$ in Formula (a1-r2-1).

In Formula (a1-r2-11), as the monocyclic aliphatic hydrocarbon group that is formed by Ra'$^{111}$ together with the carbon atom to which Ra'$^{10}$ is bonded, a group exemplified as the aliphatic hydrocarbon group which is a monocyclic group as Ra' in Formula (a1-r-1) is preferable.

In Formula (a1-r2-21), as the monocyclic aliphatic hydrocarbon group that is formed by Xb together with Ya, a group formed by further removing one or more hydrogen atoms from the monocyclic aliphatic hydrocarbon group as a cyclic monovalent hydrocarbon group represented by Ra'$^{3}$ in Formula (a1-r-1) is exemplified.

The monocyclic aliphatic hydrocarbon group that is formed by Xb together with Ya may have a substituent. Examples of the substituent are the same as those exemplified as the substituents which may be included in the cyclic hydrocarbon group as Ra'$^{3}$. Among these, as the monocyclic aliphatic hydrocarbon group that is formed by Xb together with Yb, a group formed by one hydrogen atom from a monocycloalkane is preferable, and a group formed by removing one hydrogen atom from cyclopentane or cyclohexane is more preferable.

In Formula (a1-r2-21), Ra$^{01}$ to Ra$^{03}$ each have the same definition as that for Ra$^{01}$ to Ra$^{03}$ in Formula (a1-r2-2).

The proportion of the constitutional unit (a1) in the component (A1) is preferably in a range of 5% to 70% by mole, more preferably in a range of 5% to 65% by mole, and still more preferably in a range of 5% to 50% by mole with respect to the total amount (100% by mole) of all constitutional units constituting the component (A1).

By setting the proportion of the constitutional unit (a1) to be greater than or equal to the lower limit, a resist pattern can be easily obtained, and lithography characteristics of enhancing the sensitivity, the resolution, the roughness, and the like are improved.

Further, by setting the proportion of the constitutional unit (a1) to be lower than or equal to the upper limit, the constitutional unit (a1) and other constitutional units can be balanced.

The proportion (molar ratio) of the constitutional unit (a0) to the constitutional unit (a1) (constitutional unit (a0)/constitutional unit (a1)) in the component (A1) is preferably in a range of 8/2 to 1/9, more preferably in a range of 8/2 to 4/6, and still more preferably in a range of 7/3 to 5/5.

Further, the total content of the constitutional unit (a0) and the constitutional unit (a1) in the component (A1) is preferably in a range of 20% to 80% by mole, more preferably in a range of 30% to 70% by mole, and still more preferably in a range of 40% to 60% by mole with respect to the content of all constitutional units (100% by mole) constituting the resin component (A1).

In regard to other constitutional units:

Such a component (A1) may have other constitutional units as necessary in addition to the constitutional unit (a0).

Examples of other constitutional units include a constitutional unit (a10) represented by Formula (a10-1); a constitutional unit (a2) containing a lactone-containing cyclic group, a —SO$_2$-containing cyclic group, or a carbonate-containing cyclic group; a constitutional unit (a3) containing a polar group-containing aliphatic hydrocarbon group (here, excluding the constitutional unit (a1) or the constitutional unit (a2)); a constitutional unit (a4) containing an acid undissociable aliphatic cyclic group; and a constitutional unit derived from styrene or a derivative thereof.

In regard to constitutional unit (a10):

The constitutional unit (a10) is a constitutional unit represented by Formula (a10-1).

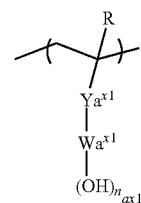

(a10-1)

[In the formula, R represents a hydrogen atom, an alkyl group having 1 to 5 carbon atoms, or a halogenated alkyl group having 1 to 5 carbon atoms. Ya$^{x1}$ represents a single bond or a divalent linking group. Wa$^{x1}$ represents an ($n_{ax1}$+1)-valent aromatic hydrocarbon group. $n_{ax1}$ represents an integer of 1 or greater.]

In Formula (a10-1), R represents a hydrogen atom, an alkyl group having 1 to 5 carbon atoms, or a halogenated alkyl group having 1 to 5 carbon atoms.

As the alkyl group having 1 to 5 carbon atoms represented by R, a linear or branched alkyl group having 1 to 5 carbon atoms is preferable, and specific examples thereof include a methyl group, an ethyl group, a propyl group, an isopropyl group, an n-butyl group, an isobutyl group, a tert-butyl group, a pentyl group, an isopentyl group, and a neopentyl group.

The halogenated alkyl group having 1 to 5 carbon atoms as R is a group in which some or all hydrogen atoms of the above-described alkyl group having 1 to 5 carbon atoms have been substituted with halogen atoms. Examples of the halogen atom include a fluorine atom, a chlorine atom, a bromine atom, and an iodine atom, and a fluorine atom is particularly preferable.

As R, a hydrogen atom, an alkyl group having 1 to 5 carbon atoms, or a fluorinated alkyl group having 1 to 5 carbon atoms is preferable, a hydrogen atom, a methyl group, or a trifluoromethyl group is more preferable, a hydrogen atom or methyl group is still more preferable, and a methyl group is particularly preferable in terms of industrial availability.

In Formula (a10-1), Ya$^{x1}$ represents a single bond or a divalent linking group.

In the chemical formula shown above, the divalent linking group as Ya$^{x1}$ is not particularly limited, and suitable examples thereof include a divalent hydrocarbon group which may have a substituent and a divalent linking group having hetero atoms.

Divalent Hydrocarbon Group which May have Substituent:

In a case where $Ya^{x1}$ represents a divalent hydrocarbon group which may have a substituent, the hydrocarbon group may be an aliphatic hydrocarbon group or an aromatic hydrocarbon group.

Aliphatic Hydrocarbon Group as $Ya^{x1}$

The aliphatic hydrocarbon group indicates a hydrocarbon group that has no aromaticity. The aliphatic hydrocarbon group may be saturated or unsaturated. In general, the aliphatic hydrocarbon group is preferably saturated.

Examples of the aliphatic hydrocarbon group include a linear or branched aliphatic hydrocarbon group, and an aliphatic hydrocarbon group containing a ring in the structure thereof.

Linear or Branched Aliphatic Hydrocarbon Group

The linear aliphatic hydrocarbon group has preferably 1 to 10 carbon atoms, more preferably 1 to 6 carbon atoms, still more preferably 1 to 4 carbon atoms, and most preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—], and a pentamethylene group [—$(CH_2)_5$—].

The branched aliphatic hydrocarbon group has preferably 2 to 10 carbon atoms, more preferably 3 to 6 carbon atoms, still more preferably 3 or 4 carbon atoms, and most preferably 3 carbon atoms.

As the branched aliphatic hydrocarbon group, a branched alkylene group is preferred, and specific examples thereof include alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$—, and —$CH_2CH(CH_3)CH_2$—; and alkyltetramethylene groups such as —$CH(CH_3)CH_2CH_2CH_2$—, and —$CH_2CH(CH_3)CH_2CH_2$—. As the alkyl group in the alkylalkylene group, a linear alkyl group having 1 to 5 carbon atoms is preferable.

The linear or branched aliphatic hydrocarbon group may or may not have a substituent. Examples of the substituent include a fluorine atom, a fluorinated alkyl group having 1 to 5 carbon atoms which has been substituted with a fluorine atom, and a carbonyl group.

Aliphatic Hydrocarbon Group Containing Ring in Structure Thereof

Examples of the aliphatic hydrocarbon group containing a ring in the structure thereof include a cyclic aliphatic hydrocarbon group which may have a substituent containing a hetero atom in the ring structure thereof (a group in which two hydrogen atoms have been removed from an aliphatic hydrocarbon ring), a group in which the cyclic aliphatic hydrocarbon group is bonded to the terminal of a linear or branched aliphatic hydrocarbon group, and a group in which the cyclic aliphatic hydrocarbon group is interposed in a linear or branched aliphatic hydrocarbon group. As the linear or branched aliphatic hydrocarbon group, the same groups as those described above can be exemplified.

The cyclic aliphatic hydrocarbon group has preferably 3 to 20 carbon atoms and more preferably 3 to 12 carbon atoms.

The cyclic aliphatic hydrocarbon group may be a polycyclic group or a monocyclic group. As the monocyclic alicyclic hydrocarbon group, a group in which two hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which two hydrogen atoms have been removed from a polycycloalkane is preferable. As the polycycloalkane, a group having 7 to 12 carbon atoms is preferable. Examples of the polycycloalkane include adamantane, norbornane, isobornane, tricyclodecane, and tetracyclododecane.

The cyclic aliphatic hydrocarbon group may or may not have a substituent. Examples of the substituent include an alkyl group, an alkoxy group, a halogen atom, a halogenated alkyl group, a hydroxyl group, and a carbonyl group.

The alkyl group as the substituent is preferably an alkyl group having 1 to 5 carbon atoms, and a methyl group, an ethyl group, a propyl group, an n-butyl group, or a tert-butyl group is particularly preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom as the substituent include a fluorine atom, a chlorine atom, a bromine atom, and an iodine atom, and a fluorine atom is preferable.

Examples of the halogenated alkyl group as the substituent include groups in which some or all hydrogen atoms in the above-described alkyl groups have been substituted with the above-described halogen atoms.

In the cyclic aliphatic hydrocarbon group, some carbon atoms constituting the ring structure thereof may be substituted with a substituent containing a hetero atom. As the substituent containing a hetero atom, —O—, —C(=O)—O—, —S—, —S(=O)$_2$—, or —S(=O)$_2$—O— is preferable.

Aromatic Hydrocarbon Group as $Ya^{x1}$

The aromatic hydrocarbon group is a hydrocarbon group having at least one aromatic ring.

The aromatic ring is not particularly limited as long as it is a cyclic conjugated system having $(4n+2)\pi$ electrons, and may be monocyclic or polycyclic. The aromatic ring has preferably 5 to 30 carbon atoms, more preferably 5 to 20 carbon atoms, still more preferably 6 to 15 carbon atoms, and most preferably 6 to 12 carbon atoms. Here, the number of carbon atoms in a substituent is not included in the number of carbon atoms.

Examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Specific examples of the aromatic hydrocarbon group include a group in which two hydrogen atoms have been removed from the above-described aromatic hydrocarbon ring or aromatic hetero ring (an arylene group or a heteroarylene group); a group in which two hydrogen atoms have been removed from an aromatic compound having two or more aromatic rings (biphenyl, fluorene or the like); and a group in which one hydrogen atom of a group (an aryl group or a heteroaryl group) obtained by removing one hydrogen atom from the above-described aromatic hydrocarbon ring or aromatic hetero ring has been substituted with an alkylene group (a group in which one hydrogen atom has been removed from the aryl group in the above-described arylalkyl group such as a benzyl group, a phenethyl group, a 1-naphthylmethyl group, a 2-naphthylmethyl group, a 1-naphthylethyl group, or a 2-naphthylethyl group). The alkylene group which is bonded to the above-described aryl group or heteroaryl group has preferably 1 to 4 carbon atoms, more preferably 1 or 2 carbon atoms, and most preferably 1 carbon atom.

With respect to the aromatic hydrocarbon group, the hydrogen atom in the aromatic hydrocarbon group may be substituted with a substituent. For example, the hydrogen atom bonded to the aromatic ring in the aromatic hydrocarbon group may be substituted with a substituent. Examples of substituents include an alkyl group, an alkoxy group, a halogen atom, a halogenated alkyl group, and a hydroxyl group.

The alkyl group as the substituent is preferably an alkyl group having 1 to 5 carbon atoms, and a methyl group, an ethyl group, a propyl group, an n-butyl group, or a tert-butyl group is more preferable.

As the alkoxy group, the halogen atom, and the halogenated alkyl group as the substituents, the same groups as the above-described substituent groups for substituting a hydrogen atom in the cyclic aliphatic hydrocarbon group can be exemplified.

Divalent Linking Group Containing Hetero Atom:

In a case where $Ya^{x1}$ represents a divalent linking group containing a hetero atom, preferred examples of the linking group include —O—, —C(=O)—O—, —O—C(=O)—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by Formula: —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$— or —Y$^{21}$—S(=O)$_2$—O—Y$^{22}$—[in the formulae, Y$^{21}$ and Y$^{22}$ each independently represent a divalent hydrocarbon group which may have a substituent, 0 represents an oxygen atom, and m" represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and most preferably 1 to 5 carbon atoms.

In Formula —Y$^{21}$—O—Y$^{22}$—, —Y$^{21}$—O—, —Y$^{21}$—C(=O)—O—, —C(=O)—O—Y$^{21}$—, —[Y$^{21}$—C(=O)—O]$_{m''}$—Y$^{22}$—, —Y$^{21}$—O—C(=O)—Y$^{22}$—, or —Y$^{21}$—S(=O)$_2$—O—Y$^{22}$—, Y$^{21}$ and Y$^{22}$ each independently represent a divalent hydrocarbon group which may have a substituent.

Examples of the divalent hydrocarbon group include the same groups as those described above as the "divalent hydrocarbon group which may have a substituent" in the explanation of the above-described divalent linking group As $Ya^{x1}$.

As Y$^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As Y$^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[Y$^{21}$—C(=O)—O]$_{m''}$—Y$^{22}$—m" represents an integer of 0 to 3, preferably an integer of 0 to 2, more preferably 0 or 1, and particularly preferably 1. In other words, it is particularly preferable that the group represented by Formula —[Y$^{21}$—C(=O)—O]$_{m''}$—Y$^{22}$— represents a group represented by Formula —Y$^{21}$—C(=O)—O—Y$^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

In the description above, as $Ya^{x1}$, a single bond, an ester bond [—C(=O)—O— or —O—C(=O)—], an ether bond (—O—), a linear or branched alkylene group, or a combination of these is preferable, and a single bond or an ester bond [—C(=O)—O— or —O—C(=O)—] is more preferable.

In Formula (a10-1), $Wa^{x1}$ represents an ($n_{ax1}$+1)-valent aromatic hydrocarbon group.

Examples of the aromatic hydrocarbon group as $Wa^{x1}$ include a group formed by removing ($n_{ax1}$+1) hydrogen atoms from an aromatic ring. The aromatic ring is not particularly limited as long as it is a cyclic conjugated system having (4n+2)π electrons, and may be monocyclic or polycyclic. The aromatic ring has preferably 5 to 30 carbon atoms, more preferably 5 to 20 carbon atoms, still more preferably 6 to 15 carbon atoms, and particularly preferably 6 to 12 carbon atoms. Specific examples of the aromatic ring include aromatic hydrocarbon rings such as benzene, naphthalene, anthracene, and phenanthrene; and aromatic hetero rings in which some carbon atoms constituting the above-described aromatic hydrocarbon rings have been substituted with hetero atoms. Examples of the hetero atom in the aromatic hetero rings include an oxygen atom, a sulfur atom, and a nitrogen atom. Specific examples of the aromatic hetero ring include a pyridine ring and a thiophene ring.

Examples of the aromatic hydrocarbon group as $Wa^{x1}$ include a group formed by removing ($n_{ax1}$+1) hydrogen atoms from an aromatic compound (such as biphenyl or fluorene) having two or more aromatic ring.

Among these, as $Wa^{x1}$, a group formed by removing ($n_{ax1}$+1) hydrogen atoms from benzene, naphthalene, anthracene, or biphenyl is preferable, a group formed by removing ($n_{ax1}$+1) hydrogen atoms from benzene or naphthalene is more preferable, and a group formed by removing ($n_{ax1}$+1) hydrogen atoms from benzene.

In Formula (a10-1), $n_{ax1}$ represents an integer of 1 or greater, preferably an integer of 1 to 10, more preferably an integer of 1 to 5, still more preferably 1, 2, or 3, and particularly preferably 1 or 2.

Hereinafter, specific examples of the constitutional unit (a10) represented by Formula (a10-1) are described.

In each formula shown below, $R^\alpha$ represents a hydrogen atom, a methyl group, or a trifluoromethyl group.

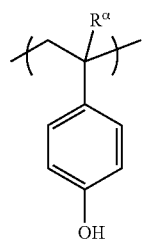 (a10-1-11)
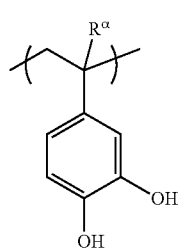 (a10-1-12)
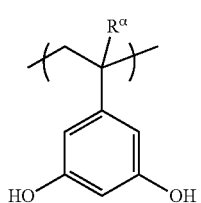 (a10-1-13)
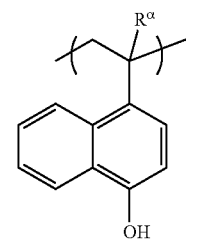 (a10-1-14)
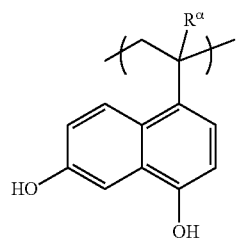 (a10-1-15)
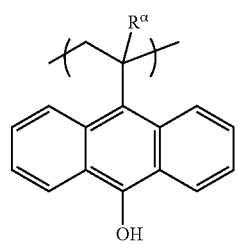 (a10-1-16)
-continued
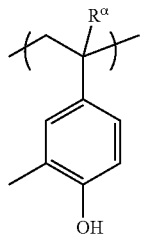 (a10-1-17)
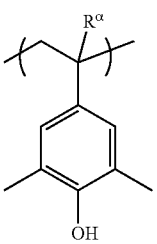 (a10-1-18)
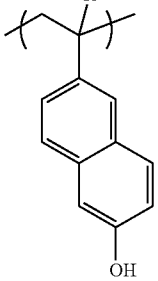 (a10-1-21)
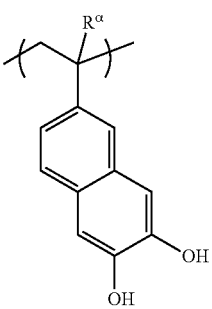 (a10-1-22)
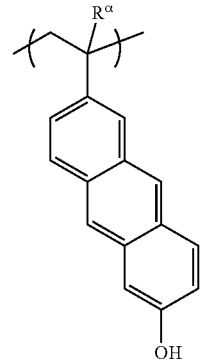 (a10-1-23)

(a10-1-24)
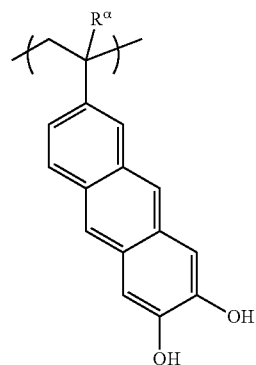
(a10-1-31)
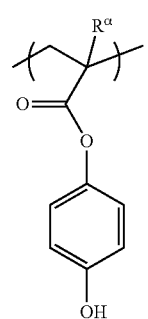
(a10-1-32)
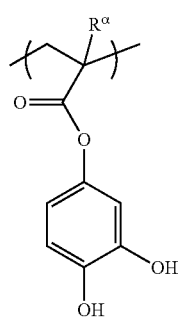
(a10-1-33)
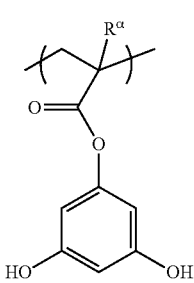
(a10-1-34)
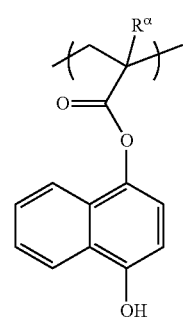
(a10-1-35)
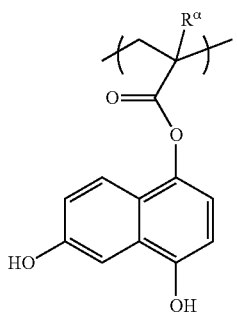
(a10-1-36)
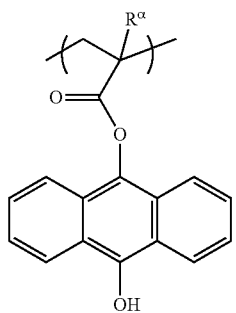
(a10-1-41)
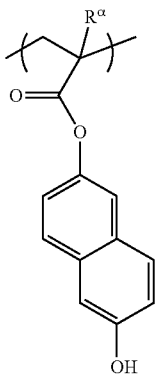
(a10-1-42)
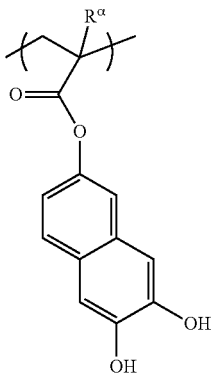

-continued (a10-1-43)
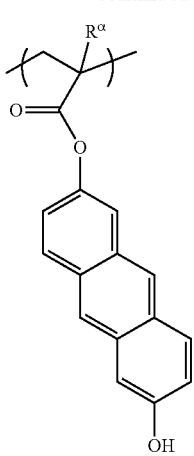

(a10-1-44)
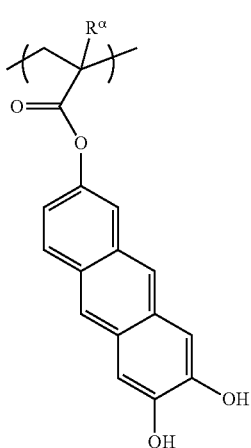

The constitutional unit (a10) included in the component (A1) may be used alone or two or more kinds thereof.

In a case where the component (A1) has the constitutional unit (a10), the proportion of the constitutional unit (a10) in the component (A1) is preferably in a range of 20% to 80% by mole, more preferably in a range of 20% to 70% by mole, still more preferably in a range of 25% to 60% by mole, and particularly preferably in a range of 30% to 50% by mole with respect to the total amount (100% by mole) of all constitutional units in the component (A1).

By setting the proportion of the constitutional unit (a10) to be greater than or equal to the lower limit, the sensitivity can be easily improved. Further, by setting the proportion of the constitutional unit (a10) to be lower than or equal to the upper limit, the constitutional unit (a10) and other constitutional units can be balanced.

In regard to constitutional unit (a2):

The component (A1) may have a constitutional unit (a2) containing a lactone-containing cyclic group, a —$SO_2$- containing cyclic group, or a carbonate-containing cyclic group in addition to the constitutional units (a0-1) and (a0-2).

In a case where the component (A1) is used for forming a resist film, the lactone-containing cyclic group, the —$SO_2$- containing cyclic group, or the carbonate-containing cyclic group in the constitutional unit (a2) is effective for improving the adhesiveness of the resist film to the substrate. Further, by virtue of including the constitutional unit (a2), in an alkali developing process, during developing, the solubility of the resist film in an alkali developing solution is enhanced.

The term "lactone-containing cyclic group" indicates a cyclic group that contains a ring (lactone ring) containing a —O—C(=O)— in the ring structure. In a case where the lactone ring is counted as the first ring and the group contains only the lactone ring, the group is referred to as a monocyclic group. Further, in a case where the group has other ring structures, the group is referred to as a polycyclic group regardless of the structures. The lactone-containing cyclic group may be a monocyclic group or a polycyclic group.

The lactone-containing cyclic group for the constitutional unit (a2) is not particularly limited, and an optional constitutional unit may be used. Specific examples thereof include groups represented by Formulae (a2-r-1) to (a2-r-7) shown below.

(a2-r-1)
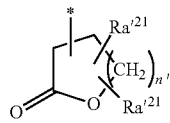

(a2-r-2)
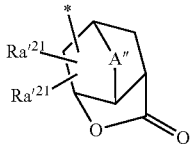

(a2-r-3)
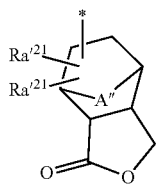

(a2-r-4)
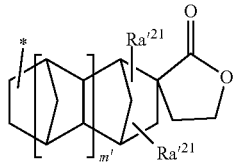

(a2-r-5)
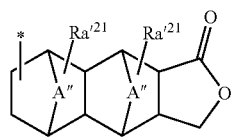

(a2-r-6)
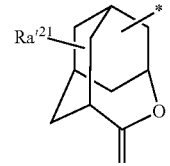

(a2-r-7)
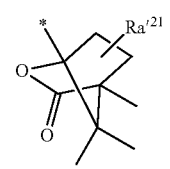

[In the formulae, each $Ra'^{21}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group; and R" represents a hydrogen atom, an alkyl group, a lactone-containing cyclic group, a carbonate-containing cyclic group, or a —SO$_2$-containing cyclic group; A" represents an oxygen atom (—O—), a sulfur atom (—S—) or an alkylene group having 1 to 5 carbon atoms which may contain an oxygen atom or a sulfur atom; n' represents an integer of 0 to 2; and m' represents 0 or 1.]

In Formulae (a2-r-1) to (a2-r-7), the alkyl group as $Ra'^{21}$ is preferably an alkyl group having 1 to 6 carbon atoms. Further, the alkyl group is preferably a linear alkyl group or a branched alkyl group. Specific examples thereof include a methyl group, an ethyl group, a propyl group, an isopropyl group, an n-butyl group, an isobutyl group, a tert-butyl group, a pentyl group, an isopentyl group, a neopentyl group and a hexyl group. Among these, a methyl group or ethyl group is preferable, and a methyl group is particularly preferable.

The alkoxy group as $Ra'^{21}$ is preferably an alkoxy group having 1 to 6 carbon atoms.

Further, the alkoxy group is preferably a linear or branched alkoxy group.

Specific examples of the alkoxy groups include a group formed by linking the above-described alkyl group as $Ra'^{21}$ to an oxygen atom (—O—).

Examples of the halogen atom as $Ra'^{21}$ include a fluorine atom, a chlorine atom, a bromine atom, and an iodine atom. Among these, a fluorine atom is preferable.

Examples of the halogenated alkyl group as $Ra'^{21}$ include groups in which some or all hydrogen atoms in the above-described alkyl group as $Ra'^{21}$ have been substituted with the above-described halogen atoms. As the halogenated alkyl group, a fluorinated alkyl group is preferable, and a perfluoroalkyl group is particularly preferable.

In —COOR" and —OC(=O)R" as $Ra'^{21}$, R" represents a hydrogen atom, an alkyl group, a lactone-containing cyclic group, a carbonate-containing cyclic group, or a —SO$_2$-containing cyclic group.

The alkyl group as R" may be linear, branched, or cyclic, and preferably has 1 to 15 carbon atoms.

In a case where R" represents a linear or branched alkyl group, it is preferably an alkyl group having 1 to 10 carbon atoms, more preferably an alkyl group having 1 to 5 carbon atoms, and most preferably a methyl group or an ethyl group.

In a case where R" represents a cyclic alkyl group, the number of carbon atoms thereof is preferably in a range of 3 to 15, more preferably in a range of 4 to 12, and still more preferably in a range of 5 to 10. Specific examples thereof include groups in which one or more hydrogen atoms have been removed from a monocycloalkane, which may or may not be substituted with a fluorine atom or a fluorinated alkyl group; and groups in which one or more hydrogen atoms have been removed from a polycycloalkane such as bicycloalkane, tricycloalkane, or tetracycloalkane. More specific examples thereof include groups in which one or more hydrogen atoms have been removed from a monocycloalkane such as cyclopentane or cyclohexane; and groups in which one or more hydrogen atoms have been removed from a polycycloalkane such as adamantane, norbornane, isobornane, tricyclodecane, or tetracyclododecane.

Examples of the lactone-containing cyclic group as R" include those exemplified as the groups represented by Formulae (a2-r-1) to (a2-r-7).

The carbonate-containing cyclic group as R" has the same definition as that for the carbonate-containing cyclic group described below. Specific examples of the carbonate-containing cyclic group include groups represented by Formulae (ax3-r-1) to (ax3-r-3).

The —SO$_2$-containing cyclic group as R" has the same definition as that for the —SO$_2$-containing cyclic group described below. Specific examples of the —SO$_2$-containing cyclic group include groups represented by Formulae (a5-r-1) to (a5-r-4).

The hydroxyalkyl group as $Ra'^{21}$ has preferably 1 to 6 carbon atoms, and specific examples thereof include a group in which at least one hydrogen atom in the alkyl group as $Ra'^{21}$ has been substituted with a hydroxyl group.

In Formulae (a2-r-2), (a2-r-3) and (a2-r-5), as the alkylene group having 1 to 5 carbon atoms as A", a linear or branched alkylene group is preferable, and examples thereof include a methylene group, an ethylene group, an n-propylene group, and an isopropylene group. Examples of alkylene groups that contain an oxygen atom or a sulfur atom include groups in which —O— or —S— is interposed in the terminal of the alkylene group or between the carbon atoms of the alkylene group, and examples thereof include —O—CH$_2$—, —CH$_2$—O—CH$_2$—, —S—CH$_2$—, and —CH$_2$—S—CH$_2$—. As A", an alkylene group having 1 to 5 carbon atoms or —O— is preferable, an alkylene group having 1 to 5 carbon atoms is more preferable, and a methylene group is most preferable.

Specific examples of the groups represented by Formulae (a2-r-1) to (a2-r-7) are shown below.

(r-lc-1-1)

(r-lc-1-2)

(r-lc-1-3)

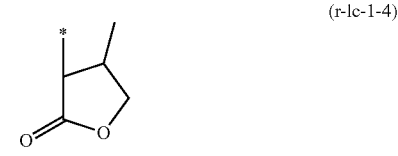

(r-lc-1-4)

(r-lc-1-5)

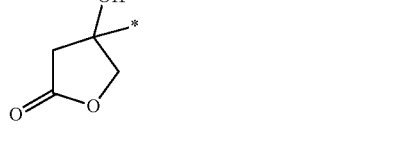

(r-lc-1-6)

(r-lc-1-7)
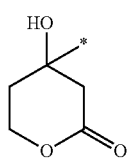
(r-lc-2-1)
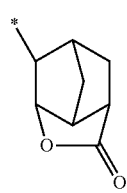
(r-lc-2-2)
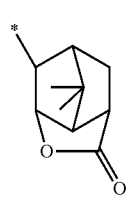
(r-lc-2-3)
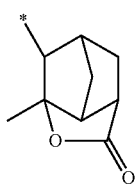
(r-lc-2-4)
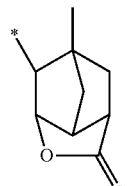
(r-lc-2-5)
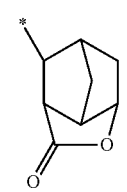
(r-lc-2-6)
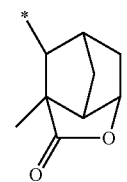
(r-lc-2-7)
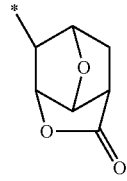
(r-lc-2-8)
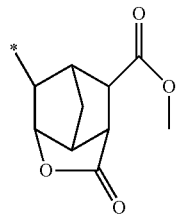
(r-lc-2-9)
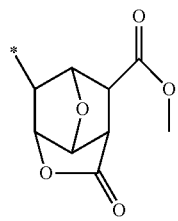
(r-lc-2-10)
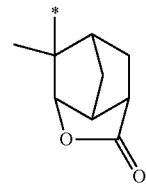
(r-lc-2-11)
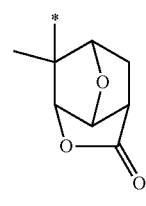
(r-lc-2-12)
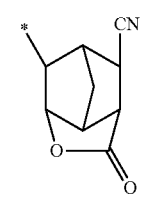
(r-lc-2-13)
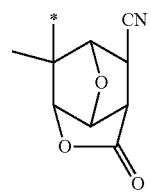
(r-lc-2-14)
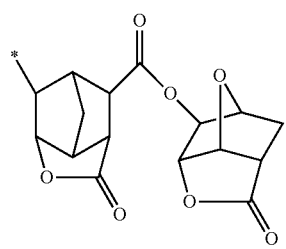

(r-lc-2-15)
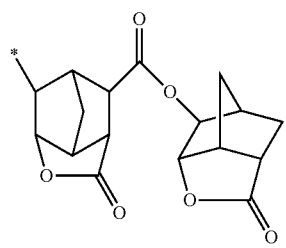
(r-lc-2-16)
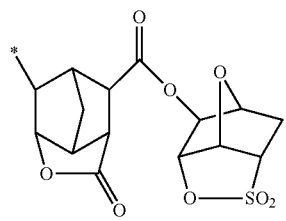
(r-lc-2-17)
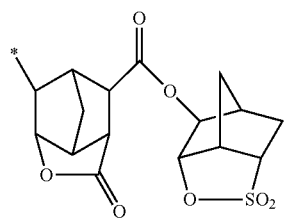
(r-lc-2-18)
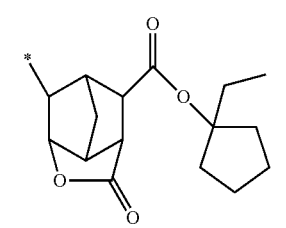
(r-lc-3-1)
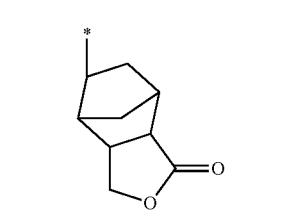
(r-lc-3-2)
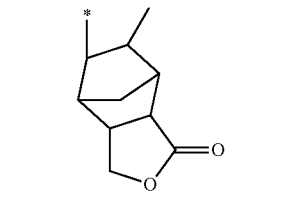
(r-lc-3-3)
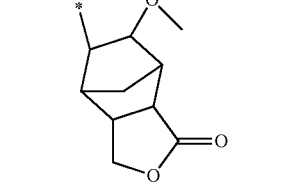
(r-lc-3-4)
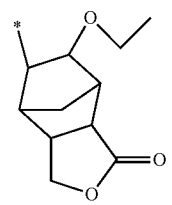
(r-lc-3-5)
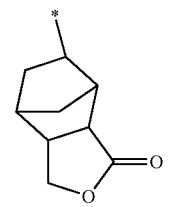
(r-lc-4-1)
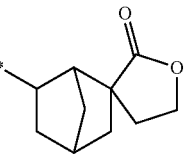
(r-lc-4-2)
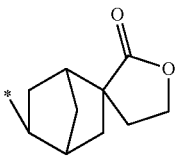
(r-lc-4-3)
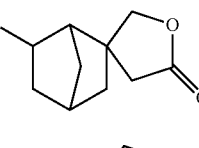
(r-lc-4-4)
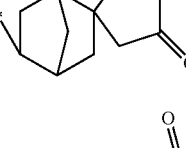
(r-lc-4-5)
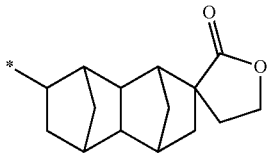
(r-lc-4-6)
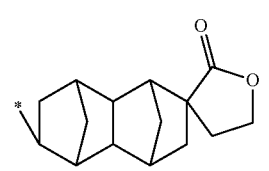
(r-lc-4-7)
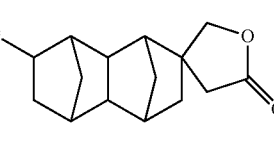
(r-lc-4-8)
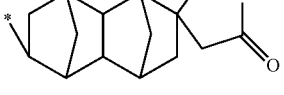

(r-lc-4-9)
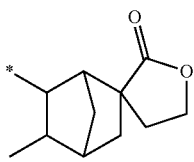

(r-lc-5-1)
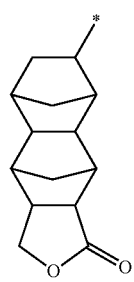

(r-lc-5-2)
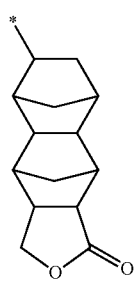

(r-lc-5-3)
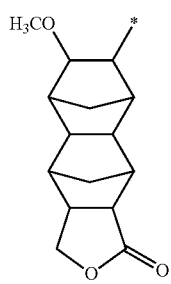

(r-lc-5-4)
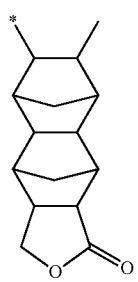

(r-lc-6-1)
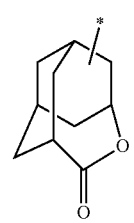

(r-lc-7-1)
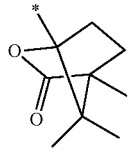

The "—$SO_2$-containing cyclic group" indicates a cyclic group having a ring containing —$SO_2$— in the ring structure thereof. Specifically, the —$SO_2$-containing cyclic group is a cyclic group in which the sulfur atom (S) in —$SO_2$— forms a part of the ring skeleton of the cyclic group. In a case where the ring containing —$SO_2$— in the ring skeleton thereof is counted as the first ring and the group contains only the ring, the group is referred to as a monocyclic group. Further, in a case where the group has other ring structures, the group is referred to as a polycyclic group regardless of the structures. The —$SO_2$-containing cyclic group may be a monocyclic group or a polycyclic group.

As the —$SO_2$-containing cyclic group, a cyclic group containing —O—$SO_2$— in the ring skeleton thereof, in other words, a cyclic group containing a sultone ring in which —O—S— in the —O—$SO_2$— group forms a part of the ring skeleton thereof is particularly preferable.

More specific examples of the —$SO_2$-containing cyclic group include groups represented by Formulae (a5-r-1) to (a5-r-4) shown below.

(a5-r-1)
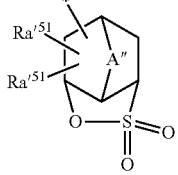

(a5-r-2)
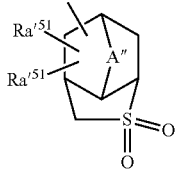

(a5-r-3)
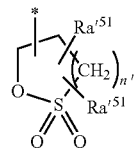

(a5-r-4)
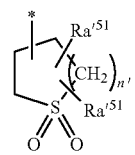

[In the formulae, each $Ra'^{51}$ independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. n' represents an integer of 0 to 2.]

In Formulae (a5-r-1) and (a5-r-2), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as $Ra'^{51}$ include the same groups as those described above in the explanation of $Ra'^{21}$ in Formulae (a2-r-1) to (a2-r-7).

Specific examples of the groups represented by Formulae (a5-r-1) to (a5-r-4) are shown below. In the formulae shown below, "Ac" represents an acetyl group.

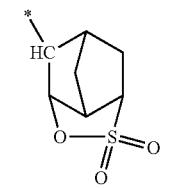 (r-sl-1-1)

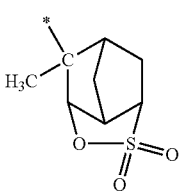 (r-sl-1-2)

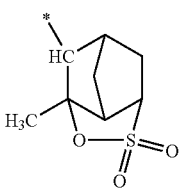 (r-sl-1-3)

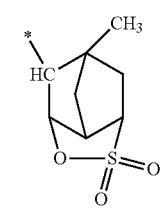 (r-sl-1-4)

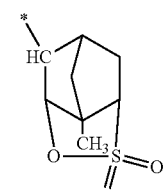 (r-sl-1-5)

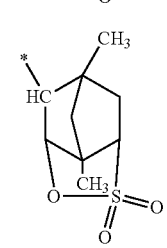 (r-sl-1-6)

-continued

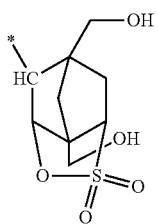 (r-sl-1-7)

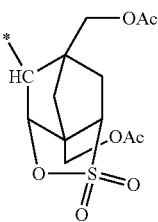 (r-sl-1-8)

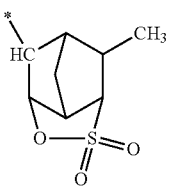 (r-sl-1-9)

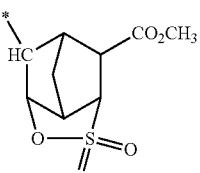 (r-sl-1-10)

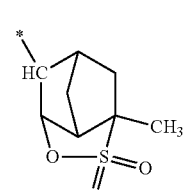 (r-sl-1-11)

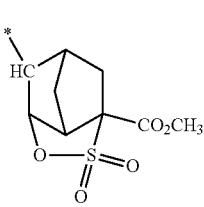 (r-sl-1-12)

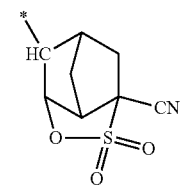 (r-sl-1-13)

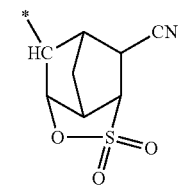 (r-sl-1-14)

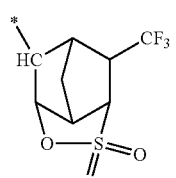 (r-sl-1-15)
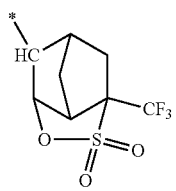 (r-sl-1-16)
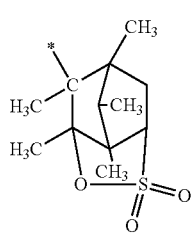 (r-sl-1-17)
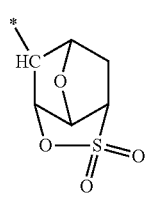 (r-sl-1-18)
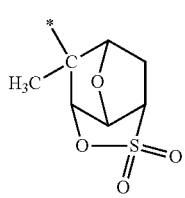 (r-sl-1-19)
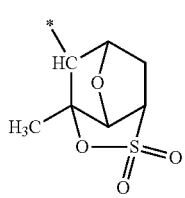 (r-sl-1-20)
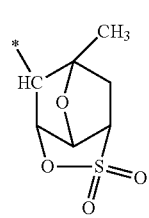 (r-sl-1-21)
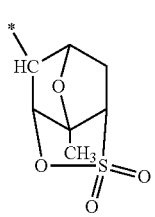 (r-sl-1-22)
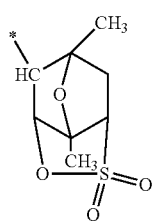 (r-sl-1-23)
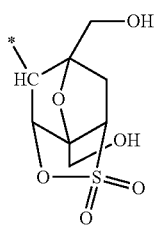 (r-sl-1-24)
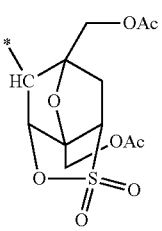 (r-sl-1-25)
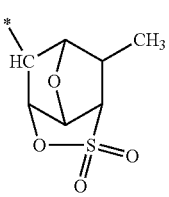 (r-sl-1-26)
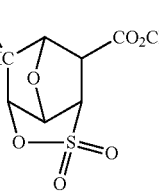 (r-sl-1-27)
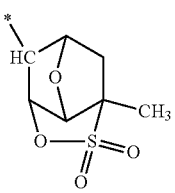 (r-sl-1-28)
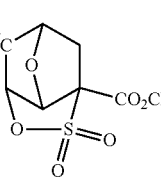 (r-sl-1-29)

(r-sl-1-30)
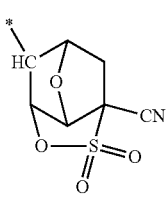

(r-sl-1-31)
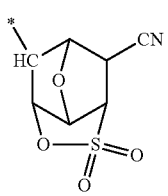

(r-sl-1-32)
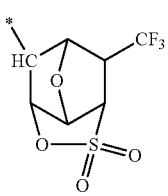

(r-sl-1-33)
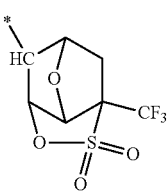

(r-sl-2-1)
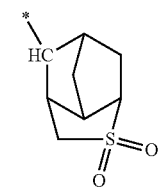

(r-sl-2-2)
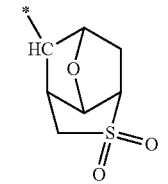

(r-sl-3-1)
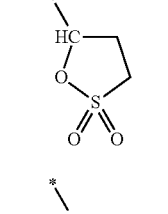

(r-sl-4-1)
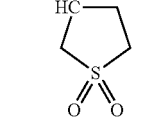

The "carbonate-containing cyclic group" indicates a cyclic group having a ring (a carbonate ring) containing —O—C(=O)—O— in the ring structure thereof. In a case where the carbonate ring is counted as the first ring and the group contains only the carbonate ring, the group is referred to as a monocyclic group. Further, in a case where the group has other ring structures, the group is referred to as a polycyclic group regardless of the structures. The carbonate-containing cyclic group may be a monocyclic group or a polycyclic group.

The carbonate ring-containing cyclic group is not particularly limited, and an optional group may be used. Specific examples thereof include groups represented by Formulae (ax3-r-1) to (ax3-r-3) shown below.

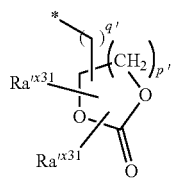
(ax3-r-1)

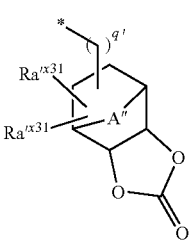
(ax3-r-2)

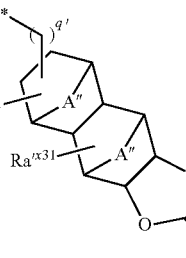
(ax3-r-3)

[In the formulae, each Ra" independently represents a hydrogen atom, an alkyl group, an alkoxy group, a halogen atom, a halogenated alkyl group, a hydroxyl group, —COOR", —OC(=O)R", a hydroxyalkyl group, or a cyano group. R" represents a hydrogen atom, an alkyl group, a lactone-containing cyclic group, a carbonate-containing cyclic group, or a —SO$_2$-containing cyclic group. A" represents an oxygen atom, a sulfur atom or an alkylene group having 1 to 5 carbon atoms which may contain an oxygen atom or a sulfur atom. p' represents an integer of 0 to 3, and q' represents 0 or 11

In Formulae (ax3-r-2) and (ax3-r-3), A" has the same definition as that for A" in Formulae (a2-r-2), (a2-r-3) and (a2-r-5).

Examples of the alkyl group, the alkoxy group, the halogen atom, the halogenated alkyl group, —COOR", —OC(=O)R", and the hydroxyalkyl group as Ra'$^{31}$ include the same groups as those described above in the explanation of Ra'$^{21}$ in Formulae (a2-r-1) to (a2-r-7).

Specific examples of the groups represented by Formulae (ax3-r-1) to (ax3-r-3) are shown below.

-continued
(r-cr-1-1)
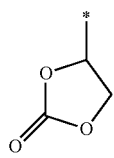
(r-cr-1-2)
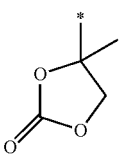
(r-cr-1-3)
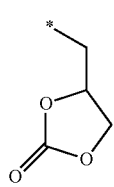
(r-cr-1-4)
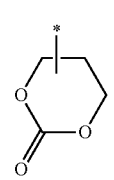
(r-cr-1-5)
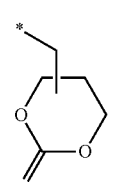
(r-cr-1-6)
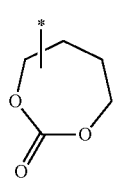
(r-cr-1-7)
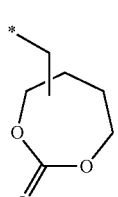
(r-cr-2-1)
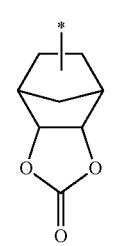
(r-cr-2-2)
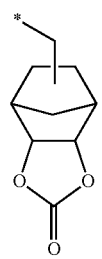
(r-cr-2-3)
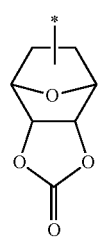
(r-cr-2-4)
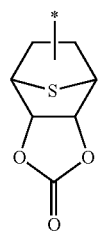
(r-cr-3-1)
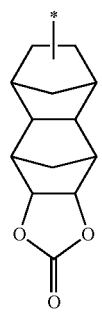
(r-cr-3-2)
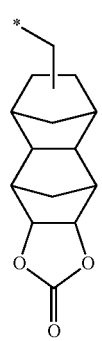

(r-cr-3-3)

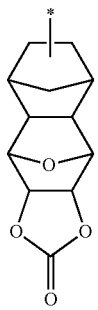

(r-cr-3-4)

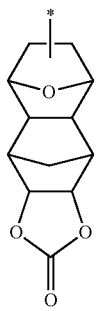

(r-cr-3-5)

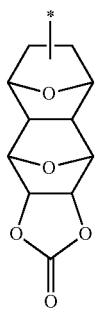

As the constitutional unit (a2), a constitutional unit derived from acrylic acid ester in which the hydrogen atom bonded to the carbon atom at the α-position may be substituted with a substituent is preferable.

Specific preferred examples of such a constitutional unit (a2) include a constitutional unit represented by Formula (a2-1) shown below.

(a2-1)

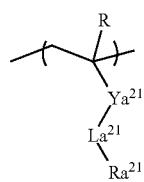

In the formula, R represents a hydrogen atom, an alkyl group having 1 to 5 carbon atoms, or a halogenated alkyl group having 1 to 5 carbon atoms. $Ya^{21}$ represents a single bond or a divalent linking group. $La^{21}$ represents —O—, —COO—, —CON(R')—, —OCO—, —CONHCO— or —CONHCS—. R' represents a hydrogen atom or a methyl group; provided that, in a case where $La^{21}$ represents —O—, $Ya^{21}$ does not represents —CO—. $Ra^{21}$ represents a lactone-containing cyclic group, a carbonate-containing cyclic group, or a —SO$_2$-containing cyclic group.]

In Formula (a2-1), R has the same definition as described above.

As R, a hydrogen atom, an alkyl group having 1 to 5 carbon atoms, or a fluorinated alkyl group having 1 to 5 carbon atoms is preferable, and a hydrogen atom or a methyl group is particularly preferable in terms of industrial availability.

In Formula (a2-1), the divalent linking group as $Ya^{21}$ is not particularly limited, and suitable examples thereof include a divalent hydrocarbon group which may have a substituent and a divalent linking group having hetero atoms.

Examples of the divalent hydrocarbon group as $Ya^{21}$ include the same groups exemplified for the divalent hydrocarbon group as $Va^1$ in Formula (a1-1). Examples of the substituent which may be included in the divalent hydrocarbon group as $Ya^{21}$ include an alkyl group having 1 to 5 carbon atoms, an alkoxy group, a halogen atom, a halogenated alkyl group having 1 to 5 carbon atoms, a hydroxyl group, and a carbonyl group.

Preferred examples of the divalent linking group having a hetero atom as $Ya^{21}$ include —O—, —C(=O)—O—, —C(=O)—, —O—C(=O)—O—, —C(=O)—NH—, —NH—, —NH—C(=NH)— (H may be substituted with a substituent such as an alkyl group, an acyl group, or the like), —S—, —S(=O)$_2$—, —S(=O)$_2$—O—, and a group represented by Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$— [in the formulae, $Y^{21}$ and $Y^{22}$ each independently represent a divalent hydrocarbon group which may have a substituent, O represents an oxygen atom, and m" represents an integer of 0 to 3].

In a case where the divalent linking group containing a hetero atom is —C(=O)—NH—, —C(=O)—NH—C(=O)—, —NH—, or —NH—C(=NH)—, H may be substituted with a substituent such as an alkyl group, an acyl group, or the like. The substituent (an alkyl group, an acyl group, or the like) has preferably 1 to 10 carbon atoms, more preferably 1 to 8 carbon atoms, and most preferably 1 to 5 carbon atoms.

In Formula —$Y^{21}$—O—$Y^{22}$—, —$Y^{21}$—O—, —$Y^{21}$—C(=O)—O—, —C(=O)—O—$Y^{21}$—, —[$Y^{21}$—C(=O)—O]$_{m''}$—$Y^{22}$—, —$Y^{21}$—O—C(=O)—$Y^{22}$—, or —$Y^{21}$—S(=O)$_2$—O—$Y^{22}$—, $Y^{21}$ and $Y^{22}$ each independently represent a divalent hydrocarbon group which may have a substituent. Examples of the divalent hydrocarbon group include the same groups as those described above as the "divalent hydrocarbon group which may have a substituent" in the explanation of the above-described divalent linking group.

As $Y^{21}$, a linear aliphatic hydrocarbon group is preferable, a linear alkylene group is more preferable, a linear alkylene group having 1 to 5 carbon atoms is still more preferable, and a methylene group or an ethylene group is particularly preferable.

As $Y^{22}$, a linear or branched aliphatic hydrocarbon group is preferable, and a methylene group, an ethylene group, or an alkylmethylene group is more preferable. The alkyl group in the alkylmethylene group is preferably a linear alkyl group having 1 to 5 carbon atoms, more preferably a linear alkyl group having 1 to 3 carbon atoms, and most preferably a methyl group.

In the group represented by Formula —[$Y^{21}$—C(=O)—O]$_{m''}$—$Y^{22}$—, m" represents an integer of 0 to 3, preferably an integer of 0 to 2, more preferably 0 or 1, and particularly preferably 1. In other words, it is particularly preferable that the group represented by Formula —[$Y^{21}$—C(=O)—O]$_{m''}$—$Y^{22}$— is a group represented by Formula —$Y^{21}$—C(=O)—O—$Y^{22}$—. Among these, a group represented by Formula —(CH$_2$)$_{a'}$—C(=O)—O—(CH$_2$)$_{b'}$— is preferable. In the formula, a' represents an integer of 1 to 10, preferably an integer of 1 to 8, more preferably an integer of 1 to 5, still more preferably 1 or 2, and most preferably 1. b' represents an integer of 1 to 10, preferably an integer of 1 to 8, more preferably an integer of 1 to 5, still more preferably 1 or 2, and most preferably 1.

As Ya$^{21}$, a single bond, an ester bond [—C(=O)—O—], an ether bond (—O—), a linear or branched alkylene group, or a combination of these is preferable.

In Formula (a2-1), La$^{21}$ represents —O—, —COO—, —CON(R')—, —OCO—, —CONHCO—, or —CONHCS—.

R' represents a hydrogen atom or a methyl group.

Here, in a case where La$^{21}$ represents —O—, Ya$^{21}$ does not represent —CO—.

In Formula (a2-1), Ra$^{21}$ represents a lactone-containing cyclic group, a —SO$_2$-containing cyclic group, or a carbonate-containing cyclic group.

Preferred examples of the lactone-containing cyclic group, the —SO$_2$-containing cyclic group, and the carbonate-containing cyclic group as Ra$^{21}$ include groups represented by Formulae (a2-r-1) to (a2-r-7), groups represented by Formulae (a5-r-1) to (a5-r-4), and groups represented by Formulae (ax3-r-1) to (ax3-r-3).

Among the examples, Ra$^{21}$ represents preferably a lactone-containing cyclic group or a —SO$_2$-containing cyclic group and more preferably a group represented by Formula (a2-r-1), (a2-r-2), (a2-r-6) or (a5-r-1). Specifically, a group represented by any of chemical Formulae (r-1c-1-1) to (r-1c-1-7), (r-1c-2-1) to (r-1c-2-18), (r-1c-6-1), (r-s1-1-1), and (r-s1-1-18) is still more preferable.

The constitutional unit (a2) included in the component (A1) may be used alone or two or more kinds thereof.

In a case where the component (A1) has the constitutional unit (a2), the proportion of the constitutional unit (a2) in the component (A1) is preferably in a range of 1% to 80% by mole, more preferably in a range of 3% to 70% by mole, still more preferably in a range of 5% to 60% by mole, and even more preferably in a range of 10% to 50% by mole with respect to the total amount (100% by mole) of all constitutional units constituting the component (A1).

In a case where the proportion of the constitutional unit (a2) is greater than or equal to the lower limit of the above preferable range, the effect obtained by allowing the component (A1) to contain the constitutional unit (a2) can be satisfactorily achieved. On the contrary, in a case where the proportion of the constitutional unit (a2) is less than or equal to the upper limit of the above preferable range, the constitutional unit (a2) and other constitutional units can be balanced, and various lithography characteristics and the pattern shape can be improved.

In regard to constitutional unit (a3):

The component (A1) may further have a constitutional unit (a3) containing a polar group-containing aliphatic hydrocarbon group in addition to the constitutional units (a0-1) and (a0-2) (here, a constitutional unit corresponding to any of the above-described constitutional unit (a1) or (a2) is excluded).

In a case where the component (A1) includes the constitutional unit (a3), the hydrophilicity of the component (A1) is enhanced, thereby contributing to improvement of the resolution.

Examples of the polar group include a hydroxyl group, a cyano group, a carboxyl group, or a hydroxyalkyl group in which some hydrogen atoms of the alkyl group have been substituted with fluorine atoms. Among these, a hydroxyl group is particularly preferable.

Examples of the aliphatic hydrocarbon group include linear or branched hydrocarbon groups (preferably alkylene groups) having 1 to 10 carbon atoms, and cyclic aliphatic hydrocarbon groups (cyclic groups). The cyclic group may be a monocyclic group or a polycyclic group. For example, these cyclic groups can be selected appropriately from the multitude of groups that have been proposed for the resins of resist compositions for ArF excimer lasers. The cyclic group is preferably a polycyclic group and more preferably a polycyclic group having 7 to 30 carbon atoms.

Among the examples, constitutional units derived from acrylic acid ester that include an aliphatic polycyclic group containing a hydroxyl group, cyano group, carboxyl group, or a hydroxyalkyl group in which some hydrogen atoms of the alkyl group have been substituted with fluorine atoms are particularly preferable. Examples of the polycyclic group include groups in which two or more hydrogen atoms have been removed from a bicycloalkane, tricycloalkane, tetracycloalkane or the like. Specific examples thereof include groups in which two or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane or groups in which two or more hydrogen atoms have been removed from tetracyclododecane are preferred industrially.

The constitutional unit (a3) is not particularly limited as long as the constitutional unit contains a polar group-containing aliphatic hydrocarbon group, and an optional constitutional unit may be used.

The constitutional unit (a3) is a constitutional unit derived from acrylic acid ester in which the hydrogen atom bonded to the carbon atom at the α-position may be substituted with a substituent, and a constitutional unit containing a polar group-containing aliphatic hydrocarbon group is preferable.

In a case where the hydrocarbon group in the polar group-containing aliphatic hydrocarbon group is a linear or branched hydrocarbon group having 1 to 10 carbon atoms, the constitutional unit (a3) is preferably a constitutional unit derived from hydroxyethyl ester of acrylic acid. On the other hand, in a case where the hydrocarbon group is a polycyclic group, a constitutional unit represented by Formula (a3-1), a constitutional unit represented by Formula (a3-2), and a constitutional unit represented by Formula (a3-3) shown below are preferable.

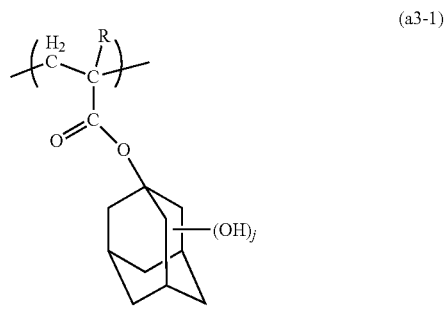

(a3-1)

(a3-2)

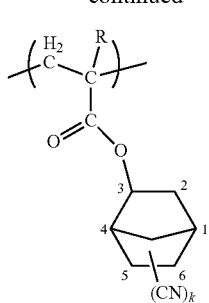

(a3-3)

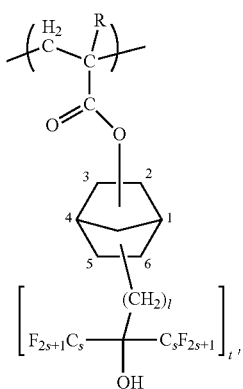

[In the formulae, R has the same definition as described above, j represents an integer of 1 to 3, k represents an integer of 1 to 3, t' represents an integer of 1 to 3, l represents an integer of 1 to 5, and s represents an integer of 1 to 3.]

In Formula (a3-1), j represents preferably 1 or 2 and more preferably 1. In a case where j represents 2, it is preferable that the hydroxyl groups is bonded to the 3rd and 5th positions of the adamantyl group. In a case where j represents 1, it is preferable that the hydroxyl group is bonded to the 3rd position of the adamantyl group.

j represents preferably 1, and it is particularly preferable that the hydroxyl group is bonded to the 3rd position of the adamantyl group.

In Formula (a3-2), k represents preferably 1. The cyano group is preferably bonded to the 5th or 6th position of the norbornyl group.

In Formula (a3-3), t' represents preferably 1. l represents preferably 1. s represents preferably 1. Further, it is preferable that a 2-norbornyl group or 3-norbornyl group is bonded to the terminal of the carboxy group of the acrylic acid. The fluorinated alkyl alcohol is preferably bonded to the 5th or 6th position of the norbornyl group.

The constitutional unit (a3) included in the component (A1) may be used alone or two or more kinds thereof.

In a case where the component (A1) has the constitutional unit (a3), the proportion of the constitutional unit (a3) in the component (A1) is preferably in a range of 1% to 50% by mole, more preferably in a range of 3% to 40% by mole, still more preferably in a range of 5% to 30% by mole, and particularly preferably in a range of 10% to 30% by mole with respect to the total amount (100% by mole) of all constitutional units constituting the component (A1).

By setting the proportion of the constitutional unit (a3) to be greater than or equal to the lower limit, the resolution in the formation of a resist pattern is further improved. Further, by setting the proportion of the constitutional unit (a3) to be lower than or equal to the upper limit, the constitutional unit (a3) and other constitutional units can be balanced.

In regard to constitutional unit (a4):

The component (A1) may further have a constitutional unit (a4) containing an acid undissociable aliphatic cyclic group in addition to the constitutional unit (a0).

In a case where the component (A1) includes the constitutional unit (a4), the dry etching resistance of the resist pattern to be formed is improved. Further, the hydrophobicity of the component (A1) is improved. An increase in the hydrophobicity contributes to improvement of the resolution, the shape of the resist pattern, and the like particularly in a case of a solvent developing process.

The "acid undissociable aliphatic cyclic group" in the constitutional unit (a4) indicates a cyclic group which remains in the constitutional unit without being dissociated even at the time of an action of an acid in a case where an acid is generated in the resist composition upon exposure (for example, an acid is generated from the constitutional unit that generates an acid upon exposure or the component (B)).

As the constitutional unit (a4), a constitutional unit which contains an acid undissociable aliphatic cyclic group and is also derived from acrylic acid ester is preferable. As the cyclic group, any of the multitude of conventional polycyclic groups used in the resin component of resist compositions for ArF excimer lasers or KrF excimer lasers (preferably for ArF excimer lasers) can be used.

In consideration of industrial availability and the like, at least one polycyclic group selected from among a tricyclodecyl group, an adamantyl group, a tetracyclododecyl group, an isobornyl group, and a norbornyl group is particularly preferable. These polycyclic groups may include a linear or branched alkyl group having 1 to 5 carbon atoms as a substituent.

Specific examples of the constitutional unit (a4) include constitutional units represented by Formulae (a4-1) to (a4-7) shown below.

(a4-1)

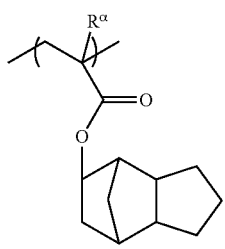

(a4-2)

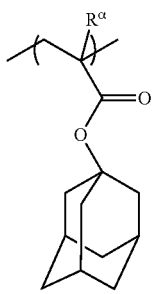

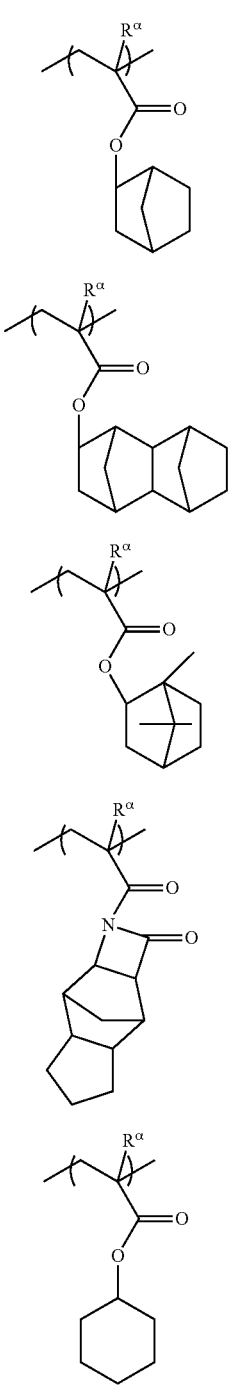

[In the formula, $R^\alpha$ has the same definition as described above.]

The constitutional unit (a4) included in the component (A1) may be used alone or two or more kinds thereof.

In a case where the component (A1) has the constitutional unit (a4), the proportion of the constitutional unit (a4) in the component (A1) is preferably in a range of 1% to 40% by mole and more preferably in a range of 5% to 20% by mole with respect to the total amount (100% by mole) of all constitutional units constituting the component (A1).

By setting the proportion of the constitutional unit (a4) to be greater than or equal to the lower limit of the above preferable range, the effect obtained by allowing the component (A1) to contain the constitutional unit (a4) can be satisfactorily achieved. On the contrary, by setting the proportion of the constitutional unit (a4) to be less than or equal to the upper limit of the above preferable range, the constitutional unit (a4) and other constitutional units can be balanced, and various lithography characteristics and the pattern shape can be improved.

In regard to constitutional unit (constitutional unit (st)) derived from styrene or derivative thereof:

The term "styrene" is a concept including those obtained by substitution of styrene and a hydrogen atom at the α-position of styrene with other substituents such as an alkyl group and a halogenated alkyl group. Here, examples of the alkyl group as the substituent include an alkyl group having 1 to 5 carbon atoms, and examples of the halogenated alkyl group as the substituent include a halogenated alkyl group having 1 to 5 carbon atoms.

Examples of the "styrene derivative" include those in which the hydrogen atom at the α-position may be substituted with a substituent and the substituent is bonded to a benzene ring of styrene.

Further, the α-position (the carbon atom at the α-position) indicates the carbon atom to which the benzene ring is bonded, unless otherwise specified.

The "constitutional unit derived from styrene" or "constitutional unit derived from a styrene derivative" indicates a constitutional unit that is formed by the cleavage of the ethylenic double bond of styrene or a styrene derivative.

The constitutional unit (st) included in the component (A1) may be used alone or two or more kinds thereof.

In a case where the component (A1) has the constitutional unit (st), the proportion of the constitutional unit (st) in the component (A1) is preferably in a range of 1% to 30% by mole and more preferably in a range of 3% to 20% by mole with respect to the total amount (100% by mole) of all constitutional units constituting the component (A1).

In the resist composition of the present embodiment, the resin component which is the component (A1) contains a polymer (hereinafter, also referred to as a "component (A1-1)") having the constitutional unit (a0) and the constitutional unit (a1), and the polymer may be used alone or in combination of two or more kinds thereof.

As the component (A1-1), a component that contains a copolymer having the constitutional unit (a0), the constitutional unit (a1), and the constitutional unit (a10), and other constitutional units as necessary is preferably exemplified. Such a component (A1-1), a copolymer formed of repeating structures which are the constitutional unit (a0), the constitutional unit (a1), and the constitutional unit (a10); and a copolymer formed of repeating structures which are the constitutional unit (a0), the constitutional unit (a1), the constitutional unit (a10), and the constitutional unit (a3) are suitably exemplified.

<<Component (A2)>>

In the resist composition of the present embodiment, a base material component (hereinafter, referred to as a "component (A2)") which does not correspond to the component (A1) and whose solubility in a developing solution is changed due to the action of an acid may be used in combination as the component (A).

The component (A2) is not particularly limited, and may be optionally selected from those known in the related art as the base material components for a chemically amplified resist composition.

In the component (A2), a high molecular weight compound or a low molecular weight compound may be used alone or in combination of two or more kinds thereof.

The proportion of the component (A1) in the component (A) is preferably 50% by mass or greater, more preferably 75% by mass or greater, still more preferably 90% by mass or greater, and may be 100% by mass with respect to the total mass of the component (A).

In a case where the proportion of the component (A1) is greater than or equal to the lower limit of the above-described preferable range, a resist pattern with improved lithography characteristics, such as high sensitivity, the resolution, and roughness reduction, can be reliably formed.

In the resist composition of the present embodiment, the content of the component (A) may be appropriately adjusted according to the film thickness of a resist intended to be formed.

<Other Components>

The resist composition of the present embodiment may further contain components other than the component (A) in addition to the above-described component (A). As other components, a component (B), a component (D), a component (E), a component (F), and a component (S) described below are exemplified.

<<Acid Generator Component (B)>>

The resist composition of the present embodiment may further contain an acid generator component (hereinafter, referred to as a "component (B)") in addition to the component (A).

The component (B) is not particularly limited, and those which have been proposed as an acid generator for a chemically amplified resist in the related art can be used.

Examples of these acid generators are numerous and include onium salt acid generators such as iodonium salts and sulfonium salts; oxime sulfonate-based acid generators; diazomethane-based acid generators such as bisalkyl or bisaryl sulfonyl diazomethanes and poly(bis-sulfonyl)diazomethanes; nitrobenzylsulfonate-based acid generators; iminosulfonate-based acid generators; and disulfone-based acid generators. Among these examples, it is preferable to use an onium salt acid generator.

As the onium salt acid generator, a compound represented by Formula (b-1) (hereinafter, also referred to as "component (b-1)"), a compound represented by Formula (b-2) (hereinafter, also referred to as "component (b-2)") or a compound represented by Formula (b-3) (hereinafter, also referred to as "component (b-3)") can be used.

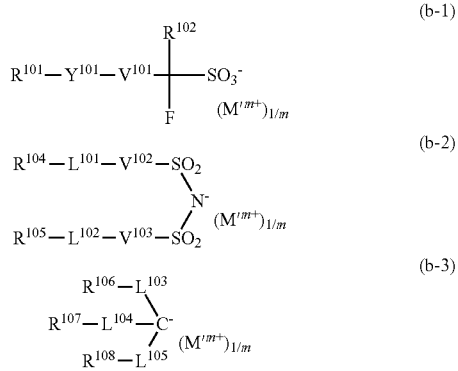

[In the formulae, $R^{101}$ and $R^{104}$ to $R^{108}$ each independently represent a cyclic group which may have a substituent, a chain-like alkyl group which may have a substituent, or a chain-like alkenyl group which may have a substituent, provided that $R^{104}$ and $R^{105}$ may be bonded to each other to form a ring.

$R^{102}$ represents a fluorine atom or a fluorinated alkyl group having 1 to 5 carbon atoms. $Y^{101}$ represents a single bond or a divalent linking group containing an oxygen atom. $V^{101}$ to $V^{103}$ each independently represent a single bond, an alkylene group, or a fluorinated alkylene group. $L^{101}$ and $L^{102}$ each independently represent a single bond or an oxygen atom. $L^{103}$ to $L^{105}$ each independently represent a single bond, —CO— or —SO$_2$—. m represents an integer of 1 or greater, and $M^{m+}$ represents an m-valent onium cation.]

{Anion Moiety}

Anion Moiety of Component (B-1)

In Formula (b-1), $R^{101}$ represents a cyclic group which may have a substituent, a chain-like alkyl group which may have a substituent, or a chain-like alkenyl group which may have a substituent.

Cyclic group which may have substituent:

The cyclic group is preferably a cyclic hydrocarbon group, and the cyclic hydrocarbon group may be an aromatic hydrocarbon group or an aliphatic hydrocarbon group. The aliphatic hydrocarbon group indicates a hydrocarbon group that has no aromaticity. The aliphatic hydrocarbon group may be saturated or unsaturated, but in general, the aliphatic hydrocarbon group is preferably saturated.

The aromatic hydrocarbon group as $R^{101}$ is a hydrocarbon group having an aromatic ring. The aromatic hydrocarbon group has preferably 3 to 30 carbon atoms, more preferably 5 to 30, still more preferably 5 to 20, particularly preferably 6 to 15, and most preferably 6 to 10. Here, the number of carbon atoms in a substituent is not included in the number of carbon atoms.

Specific examples of the aromatic ring contained in the aromatic hydrocarbon group as $R^{101}$ include benzene, fluorene, naphthalene, anthracene, phenanthrene, biphenyl, or an aromatic hetero ring in which some carbon atoms constituting any of these aromatic rings have been substituted with hetero atoms. Examples of the hetero atom in the aromatic hetero rings include an oxygen atom, a sulfur atom, and a nitrogen atom.

Specific examples of the aromatic hydrocarbon group as $R^{101}$ include a group in which one hydrogen atom has been removed from the above-described aromatic ring (an aryl group such as a phenyl group or a naphthyl group), and a group in which one hydrogen atom in the aromatic ring has been substituted with an alkylene group (an arylalkyl group such as a benzyl group, a phenethyl group, a 1-naphthylmethyl group, a 2-naphthylmethyl group, 1-naphthylethyl group, or a 2-naphthylethyl group). The alkylene group (an alkyl chain in the arylalkyl group) has preferably 1 to 4 carbon atom, more preferably 1 or 2 carbon atoms, and particularly preferably 1 carbon atom.

Examples of the cyclic aliphatic hydrocarbon group as $R^{101}$ include aliphatic hydrocarbon groups containing a ring in the structure thereof.

Examples of the aliphatic hydrocarbon group containing a ring in the structure thereof include an alicyclic hydrocarbon group (a group in which one hydrogen atom has been removed from an aliphatic hydrocarbon ring), a group in which the alicyclic hydrocarbon group is bonded to the terminal of a linear or branched aliphatic hydrocarbon group, and a group in which the alicyclic hydrocarbon group is interposed in a linear or branched aliphatic hydrocarbon group.

The alicyclic hydrocarbon group has preferably 3 to 20 carbon atoms and more preferably 3 to 12 carbon atoms.

The alicyclic hydrocarbon group may be a polycyclic group or a monocyclic group. As the monocyclic alicyclic hydrocarbon group, a group in which one or more hydrogen atoms have been removed from a monocycloalkane is preferable. The monocycloalkane has preferably 3 to 6 carbon atoms, and specific examples thereof include cyclopentane and cyclohexane. As the polycyclic alicyclic hydrocarbon group, a group in which one or more hydrogen atoms have been removed from a polycycloalkane is preferable, and the number of carbon atoms of the polycycloalkane is preferably in a range of 7 to 30. Among polycycloalkanes, a polycycloalkane having a bridged ring polycyclic skeleton, such as adamantane, norbornane, isobornane, tricyclodecane, or tetracyclododecane, and a polycycloalkane having a fused ring polycyclic skeleton, such as a cyclic group having a steroid skeleton are preferable.

Among these examples, as the cyclic aliphatic hydrocarbon group as IV″, a group in which one or more hydrogen atoms have been removed from a monocycloalkane or a polycycloalkane is preferable, a group in which one hydrogen atom has been removed from a polycycloalkane is more preferable, an adamantyl group or a norbornyl group is particularly preferable, and an adamantyl group is most preferable.

The linear or branched aliphatic hydrocarbon group which may be bonded to the alicyclic hydrocarbon group has preferably 1 to 10 carbon atoms, more preferably 1 to 6 carbon atoms, still more preferably 1 to 4 carbon atoms, and particularly preferably 1 to 3 carbon atoms.

As the linear aliphatic hydrocarbon group, a linear alkylene group is preferable. Specific examples thereof include a methylene group [—$CH_2$—], an ethylene group [—$(CH_2)_2$—], a trimethylene group [—$(CH_2)_3$—], a tetramethylene group [—$(CH_2)_4$—] and a pentamethylene group [—$(CH_2)_5$—].

As the branched aliphatic hydrocarbon group, branched alkylene groups are preferable, and specific examples thereof include various alkylalkylene groups, for example, alkylmethylene groups such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, and —$C(CH_2CH_3)_2$—; alkylethylene groups such as —$CH(CH_3)CH_2$—, —$CH(CH_3)CH(CH_3)$—, —$C(CH_3)_2CH_2$—, —$CH(CH_2CH_3)CH_2$—, and —$C(CH_2CH_3)_2$—$CH_2$—; alkyltrimethylene groups such as —$CH(CH_3)CH_2CH_2$— and —$CH_2CH(CH_3)CH_2$—; and alkyltetramethylene groups such as —$CH(CH_3)CH_2CH_2CH_2$— and —$CH_2CH(CH_3)CH_2CH_2$—. As the alkyl group in the alkylalkylene group, a linear alkyl group having 1 to 5 carbon atoms is preferable.

The cyclic hydrocarbon group as $R^{101}$ may contain a hetero atom such as a hetero ring. Specific examples thereof include lactone-containing cyclic groups represented by Formulae (a2-r-1) to (a2-r-7), the —$SO_2$-containing cyclic group represented by Formulae (a5-r-1) to (a5-r-4), and other heterocyclic groups represented by Chemical Formulae (r-hr-1) to (r-hr-16).

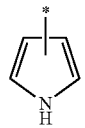

(r-hr-1)

(r-hr-2)

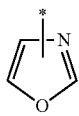

(r-hr-3)

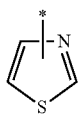

(r-hr-4)

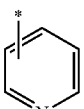

(r-hr-5)

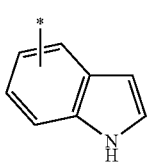

(r-hr-6)

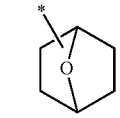

(r-hr-7)

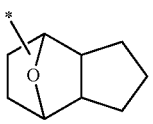

(r-hr-8)

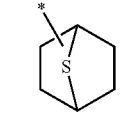

(r-hr-9)

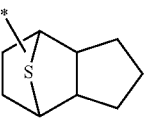

(r-hr-10)

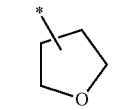

(r-hr-11)

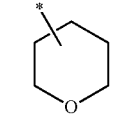

(r-hr-12)

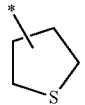

(r-hr-13)

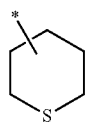
(r-hr-14)

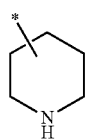
(r-hr-15)

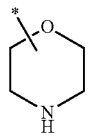
(r-hr-16)

Examples of the substituent for the cyclic group as $R^{101}$ include an alkyl group, an alkoxy group, a halogen atom, a halogenated alkyl group, a hydroxyl group, a carbonyl group, and a nitro group.

The alkyl group as the substituent is preferably an alkyl group having 1 to 5 carbon atoms, and a methyl group, an ethyl group, a propyl group, an n-butyl group, or a tert-butyl group is most preferable.

The alkoxy group as the substituent is preferably an alkoxy group having 1 to 5 carbon atoms, more preferably a methoxy group, an ethoxy group, an n-propoxy group, an iso-propoxy group, an n-butoxy group, or a tert-butoxy group, and most preferably a methoxy group or an ethoxy group.

Examples of the halogen atom for the substituent include a fluorine atom, a chlorine atom, a bromine atom, and an iodine atom, and a fluorine atom is preferable.

Example of the above-described halogenated alkyl group as the substituent includes a group in which some or all hydrogen atoms in an alkyl group having 1 to 5 carbon atoms such as a methyl group, an ethyl group, a propyl group, an n-butyl group, or a tert-butyl group have been substituted with the above-described halogen atoms.

The carbonyl group as the substituent is a group that substitutes a methylene group (—CH$_2$—) constituting the cyclic hydrocarbon group.

Chain-like alkyl group which may have substituent:

The chain-like alkyl group as $R^{101}$ may be linear or branched.

The linear alkyl group has preferably 1 to 20 carbon atoms, more preferably 1 to 15 carbon atoms, and most preferably 1 to 10 carbon atoms. Specific examples thereof include a methyl group, an ethyl group, a propyl group, a butyl group, a pentyl group, a hexyl group, a heptyl group, an octyl group, a nonyl group, a decanyl group, an undecyl group, a dodecyl group, a tridecyl group, an isotridecyl group, a tetradecyl group, a pentadecyl group, a hexadecyl group, an isohexadecyl group, a heptadecyl group, an octadecyl group, a nonadecyl group, an icosyl group, a henicosyl group, and a docosyl group.

The branched alkyl group has preferably 3 to 20 carbon atoms, more preferably 3 to 15, and most preferably 3 to 10. Specific examples thereof include a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, and a 4-methylpentyl group.

Chain-like alkenyl group which may have substituent:

Such a chain-like alkenyl group as $R^{101}$ may be linear or branched, and the number of carbon atoms thereof is preferably in a range of 2 to 10, more preferably in a range of 2 to 5, still more preferably in a range of 2 to 4, and particularly preferably 3. Examples of the linear alkenyl group include a vinyl group, a propenyl group (an allyl group), and a butynyl group. Examples of the branched alkenyl group include a 1-methylvinyl group, a 2-methylvinyl group, a 1-methylpropenyl group, and a 2-methylpropenyl group.

Among the examples, as the chain-like alkenyl group, a linear alkenyl group is preferable, a vinyl group or a propenyl group is more preferable, and a vinyl group is particularly preferable.

As the substituent for the chain-like alkyl group or alkenyl group as $R^{101}$, an alkoxy group, a halogen atom, a halogenated alkyl group, a hydroxyl group, a carbonyl group, a nitro group, an amino group, a cyclic group as $R^{101}$ or the like can be used.

Among the examples, as $R^{101}$, a cyclic group which may have a substituent is preferable, and a cyclic hydrocarbon group which may have a substituent is more preferable. More specific preferred examples thereof include a phenyl group, a naphthyl group, a group in which one or more hydrogen atoms have been removed from a polycycloalkane, a lactone-containing cyclic group represented by any of Formulae (a2-r-1) to (a2-r-7), and a —SO$_2$-containing cyclic group represented by any of Formulae (a5-r-1) to (a5-r-4).

In Formula (b-1), $Y^{101}$ represents a single bond or a divalent linking group containing an oxygen atom.

In a case where $Y^{101}$ represents a divalent linking group containing an oxygen atom, $Y^{101}$ may contain an atom other than an oxygen atom. Examples of atoms other than an oxygen atom include a carbon atom, a hydrogen atom, a sulfur atom, and a nitrogen atom.

Examples of divalent linking groups containing an oxygen atom include non-hydrocarbon oxygen atom-containing linking groups such as an oxygen atom (an ether bond; —O—), an ester bond (—C(=O)—O—), an oxycarbonyl group (—O—C(=O)—), an amide bond (—C(=O)—NH—), a carbonyl group (—C(=O)—), or a carbonate bond (—O—C(=O)—O—); and combinations of the above-described non-hydrocarbon oxygen atom-containing linking groups with an alkylene group. Furthermore, a sulfonyl group (—SO$_2$—) may be linked to the combination. Examples of divalent linking groups containing an oxygen atom include linking groups represented by Formulae (y-a1-1) to (y-a1-7) shown below.

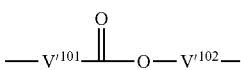
(y-a1-1)

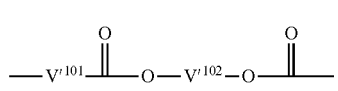
(y-a1-2)

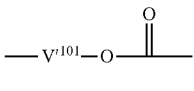
(y-a1-3)

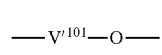
(y-a1-4)

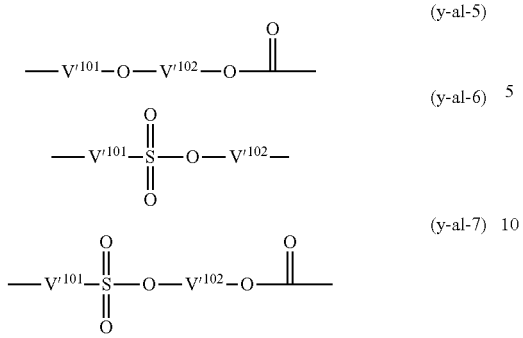

(y-al-5)

(y-al-6)

(y-al-7)

[In the formulae, $V'^{101}$ represents a single bond or an alkylene group having 1 to 5 carbon atoms, and $V'^{102}$ represents a divalent saturated hydrocarbon group having 1 to 30 carbon atoms.]

The divalent saturated hydrocarbon group as $V'^{102}$ is preferably an alkylene group having 1 to 30 carbon atoms, more preferably an alkylene group having 1 to 10 carbon atoms, and still more preferably an alkylene group having 1 to 5 carbon atoms.

The alkylene group as $V'^{101}$ and $v'^{102}$ may be a linear alkylene group or a branched alkylene group, and a linear alkylene group is preferable.

Specific examples of the alkylene group as $V'^{101}$ and $V'^{102}$ include a methylene group [—$CH_2$—]; an alkylmethylene group such as —$CH(CH_3)$—, —$CH(CH_2CH_3)$—, —$C(CH_3)_2$—, —$C(CH_3)(CH_2CH_3)$—, —$C(CH_3)(CH_2CH_2CH_3)$—, or —$C(CH_2CH_3)_2$—; an ethylene group [—$CH_2CH_2$—]; an alkylethylene group such as —$CH(CH_3)CH_2$—, —$CH(CH_3)CH(CH_3)$—, —$C(CH_3)_2CH_2$—, or —$CH(CH_2CH_3)CH_2$—; a trimethylene group (n-propylene group) [—$CH_2CH_2CH_2$—]; an alkyltrimethylene group such as —$CH(CH_3)CH_2CH_2$— or —$CH_2CH(CH_3)CH_2$—; a tetramethylene group [—$CH_2CH_2CH_2CH_2$—]; an alkyltetramethylene group such as —$CH(CH_3)CH_2CH_2CH_2$—, —$CH_2CH(CH_3)CH_2CH_2$—; and a pentamethylene group [—$CH_2CH_2CH_2CH_2CH_2$—].

Further, a part of methylene group in the alkylene group as $V'_{101}$ and $v'^{102}$ may be substituted with a divalent aliphatic cyclic group having 5 to 10 carbon atoms. The aliphatic cyclic group is preferably a divalent group in which one hydrogen atom has been removed from the cyclic aliphatic hydrocarbon group (a monocyclic alicyclic hydrocarbon group or a polycyclic alicyclic hydrocarbon group) as $Ra_{101}$ in Formula (b-1), and a cyclohexylene group, a 1,5-adamantylene group, or a 2,6-adamantylene group is more preferable.

$Y^{101}$ represents preferably a divalent linking group containing an ester bond or a divalent linking group containing an ether bond and more preferably linking groups represented by Formulae (y-al-1) to (y-al-5).

In Formula (b-1), $V^{101}$ represents a single bond, an alkylene group, or a fluorinated alkylene group. The alkylene group and the fluorinated alkylene group as $v^{101}$ preferably have 1 to 4 carbon atoms. Examples of the fluorinated alkylene group as $V^{101}$ include a group in which some or all hydrogen atoms in the alkylene group as $V^{101}$ have been substituted with fluorine atoms. Among these examples, as $V^{101}$, a single bond or a fluorinated alkylene group having 1 to 4 carbon atoms is preferable.

In Formula (b-1), $R^{102}$ represents a fluorine atom or a fluorinated alkyl group having 1 to 5 carbon atoms. $R^{102}$ represents preferably a fluorine atom or a perfluoroalkyl group having 1 to 5 carbon atoms and more preferably a fluorine atom.

As a specific example of the anion moiety for the component (b-1), in a case where $Y^{101}$ represents a single bond, a fluorinated alkylsulfonate anion such as a trifluoromethanesulfonate anion or a perfluorobutanesulfonate anion can be exemplified; and in a case where $Y^{101}$ represents a divalent linking group containing an oxygen atom, anions represented by Formulae (an-1) to (an-3) shown below can be exemplified.

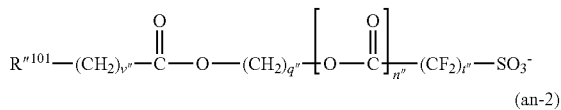

(an-1)

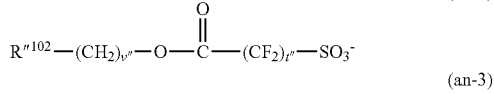

(an-2)

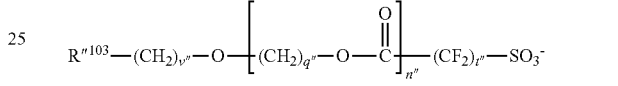

(an-3)

[In the formulae, $R'''^{101}$ represents an aliphatic cyclic group which may have a substituent, a group represented by any of Formulae (r-hr-1) to (r-hr-6), or a chain-like alkyl group which may have a substituent; $R'''^{102}$ represents an aliphatic cyclic group which may have a substituent, a lactone-containing cyclic group represented by any of Formulae (a2-r-1) to (a2-r-7), or a —$SO_2$-containing cyclic group represented by any of Formulae (a5-r-1) to (a5-r-4); $R'''^{103}$ represents an aromatic cyclic group which may have a substituent, an aliphatic cyclic group which may have a substituent, or a chain-like alkenyl group which may have a substituent; each v" independently represents an integer of 0 to 3; each q" independently represents an integer of 1 to 20; t" represents an integer of 1 to 3; and n" represents 0 or 1.]

As the aliphatic cyclic group as $R'''^{101}$, $R'''^{102}$, and $R'''^{103}$ which may have a substituent, the same groups as the cyclic aliphatic hydrocarbon group as $R^{101}$ described above are preferable. As the substituent, the same groups as the substituents which may substitute the cyclic aliphatic hydrocarbon group as $R^{101}$ can be exemplified.

As the aromatic cyclic group as $R'''^{103}$ which may have a substituent, the same groups as the aromatic hydrocarbon group for the cyclic hydrocarbon group represented by $R^{101}$ described above are preferable. As the substituent, the same groups as the substituents which may substitute the aromatic hydrocarbon group as $R^{101}$ can be exemplified.

As the chain-like alkyl group as $R'''^{101}$ which may have a substituent, the same groups exemplified as the chain-like alkyl groups represented by $R^{101}$ are preferable. As the chain-like alkenyl group as $R'''^{103}$ which may have a substituent, the same groups exemplified as the chain-like alkenyl groups represented by $R^{101}$ are preferable.

Anion Moiety of Component (b-2)

In Formula (b-2), $R^{104}$ and $R^{105}$ each independently represent a cyclic group which may have a substituent, a chain-like alkyl group which may have a substituent or a chain-like alkenyl group which may have a substituent, and has the same definition as that for $R^{101}$ in Formula (b-1). $R^{104}$ and $R^{105}$ may be bonded to each other to form a ring.

As $R^{104}$ and $R^{105}$, a chain-like alkyl group which may have a substituent is preferable, and a linear or branched alkyl group or a linear or branched fluorinated alkyl group is more preferable.

The chain-like alkyl group has preferably 1 to 10 carbon atoms, more preferably 1 to 7 carbon atoms, and still more preferably 1 to 3 carbon atoms. It is preferable that the number of carbon atoms in the chain-like alkyl group as $R^{104}$ and $R^{105}$ is small because the solubility in a solvent for a resist is also excellent in the range of the number of carbon atoms. Further, in the chain-like alkyl group as $R^{104}$ and $R^{105}$, it is preferable that the number of hydrogen atoms substituted with fluorine atoms is as large as possible because the acid strength increases and the transparency to high energy radiation of 200 nm or less or electron beams is improved.

The proportion of fluorine atoms in the chain-like alkyl group, that is, the fluorination ratio is preferably in a range of 70% to 100% and more preferably in a range of 90% to 100%, and it is most preferable that the chain-like alkyl group is a perfluoroalkyl group in which all hydrogen atoms are substituted with fluorine atoms.

In Formula (b-2), $V^{102}$ and $V^{103}$ each independently represent a single bond, an alkylene group, or a fluorinated alkylene group, and has the same definition as that for $V^{101}$ in Formula (b-1).

In Formula (b-2), $L^{101}$ and $L^{102}$ each independently represent a single bond or an oxygen atom.

Anion Moiety of Component (b-3)

In Formula (b-3), $R^{106}$ to $R^{108}$ each independently represent a cyclic group which may have a substituent or a chain-like alkyl group which may have a substituent or a chain-like alkenyl group which may have a substituent, and has the same definition as that for $R^{101}$ in Formula (b-1).

$L^{103}$ to $L^{105}$ each independently represent a single bond, —CO—, or —SO$_2$—.

{Cation Moiety}

In Formulae (b-1), (b-2), and (b-3), m represents an integer of 1 or greater, $M^{m+}$ represents an m-valent onium cation and preferably a sulfonium cation or an iodonium cation. Further, an organic cation represented by any of Formulae (ca-1) to (ca-5) is particularly preferable.

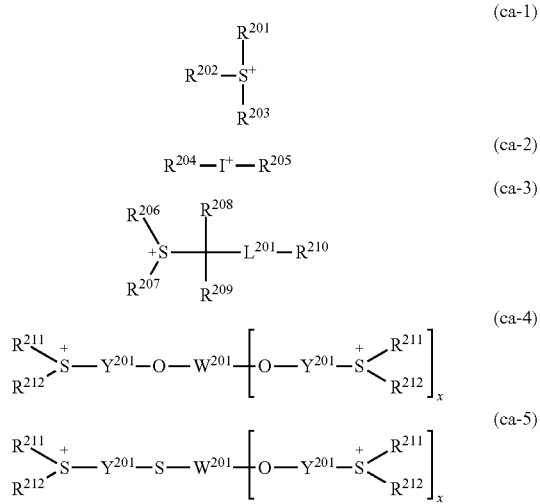

[In the formulae, $R^{201}$ to $R^{207}$, $R^{211}$, and $R^{212}$ each independently represent an aryl group, an alkyl group, or an alkenyl group which may have a substituent, provided that two of $R^{201}$ to $R^{203}$, $R^{206}$ and $R^{207}$, and $R^{211}$ and $R^{212}$ may be bonded to each other to form a ring with the sulfur atom in the formula; $R^{208}$ and $R^{209}$ each independently represent a hydrogen atom or an alkyl group having 1 to 5 carbon atoms; $R^{210}$ represents an aryl group which may have a substituent, an alkyl group which may have a substituent, an alkenyl group which may have a substituent, or a —SO$_2$-containing cyclic group which may have a substituent; $L^{201}$ represents —C(=O)— or —C(=O)—O—; $Y^{201}$ each independently represent an arylene group, an alkylene group, or an alkenylene group; x represents 1 or 2; and $W^{201}$ represents a (x+1)-valent linking group.]

Examples of the aryl group as $R^{201}$ to $R^{207}$, $R^{211}$, and $R^{212}$ include an unsubstituted aryl group having 6 to 20 carbon atoms, and a phenyl group or a naphthyl group is preferable.

The alkyl group as $R^{201}$ to $R^{207}$, $R^{211}$, and $R^{212}$ is a chain-like or cyclic alkyl group, and the number of carbon atoms thereof is preferably in a range of 1 to 30.

The alkenyl group as $R^{201}$ to $R^{207}$, $R^{211}$, and $R^{212}$ preferably has 2 to 10 carbon atoms.

Examples of the substituent which $R^{201}$ to $R^{207}$ and $R^{210}$ to $R^{212}$ may have include an alkyl group, a halogen atom, a halogenated alkyl group, a carbonyl group, a cyano group, an amino group, an aryl group, an alkylsulfonyl group, and groups represented by Formulae (ca-r-1) to (ca-r-7) shown below.

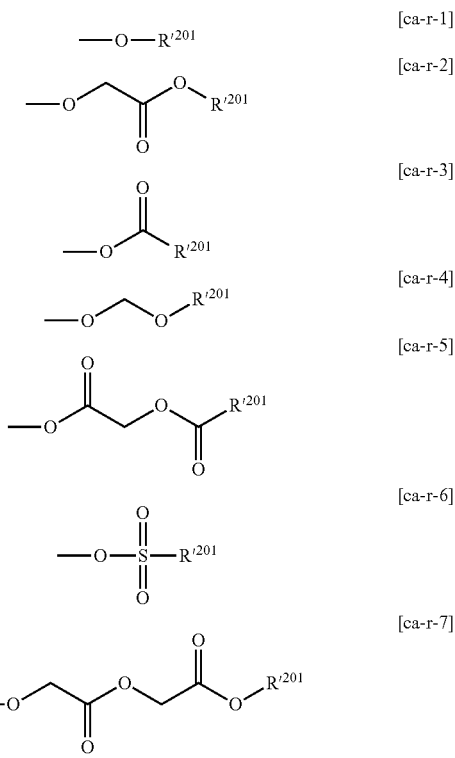

[In the formulae, each $R'^{201}$ independently represents a hydrogen atom, a cyclic group which may have a substituent, a chain-like alkyl group which may have a substituent, or a chain-like alkenyl group which may have a substituent.]

As the cyclic group which may have a substituent, the chain-like alkyl group which may have a substituent, and the chain-like alkenyl group which may have a substituent as $R'^{201}$, the same groups as those described above as $R^{101}$ in Formula (b-1) can be exemplified. As the cyclic group which may have a substituent or a chain-like alkyl group which may have a substituent, the same groups as those described above for the acid dissociable group represented by Formula (a1-r-2) can be exemplified.

In a case where $R^{201}$ to $R^{203}$, $R^{206}$, $R^{207}$, $R^{211}$, and $R^{212}$ are bonded to one another to form a ring with a sulfur atom in the formula, these groups may be bonded to one another via a hetero atom such as a sulfur atom, an oxygen atom or a nitrogen atom, or a functional group such as a carbonyl group, —SO—, —SO$_2$—, —SO$_3$—, —COO—, —CONH— or —N(R$_N$)— (here, R$_N$ represents an alkyl group having 1 to 5 carbon atoms). As a ring to be formed, a ring containing the sulfur atom in the formula in the skeleton thereof is preferably a 3- to 10-membered ring and most preferably a 5- to 7-membered ring including the sulfur atom. Specific examples of the ring to be formed include a thiophene ring, a thiazole ring, a benzothiophene ring, a thianthrene ring, a benzothiophene ring, a dibenzothiophene ring, a 9H-thioxanthene ring, a thioxanthone ring, a phenoxathiin ring, a tetrahydrothiophenium ring, and a tetrahydrothiopyranium ring.

$R^{208}$ and $R^{209}$ each independently represent a hydrogen atom or an alkyl group having 1 to 5 carbon atoms and preferably a hydrogen atom or an alkyl group having 1 to 3 carbon atoms. In a case where $R^{208}$ and $R^{209}$ each represents an alkyl group, $R^{208}$ and $R^{209}$ may be bonded to each other to form a ring.

$R^{210}$ represents an aryl group which may have a substituent, an alkyl group which may have a substituent, an alkenyl group which may have a substituent, or a —SO$_2$-containing cyclic group which may have a substituent.

Examples of the aryl group as $R^{210}$ include an unsubstituted aryl group having 6 to 20 carbon atoms, and a phenyl group or a naphthyl group is preferable.

As the alkyl group as $R^{210}$, a chain-like or cyclic alkyl group having 1 to 30 carbon atoms is preferable.

The alkenyl group as $R^{210}$ preferably has 2 to 10 carbon atoms.

As the —SO$_2$-containing cyclic group as $R^{210}$ which may have a substituent, the same groups as the —SO$_2$-containing cyclic group represented by Formulae (a5-r-1) to (a5-r-4) are exemplified. Among these, a "—SO$_2$-containing polycyclic group" is preferable, and a group represented by Formula (a5-r-1) is more preferable.

In Formulae (ca-4) and (ca-5), each $Y^{201}$ independently represents an arylene group, an alkylene group, or an alkenylene group.

Examples of the arylene group as $Y^{201}$ include groups in which one hydrogen atom has been removed from an aryl group exemplified as the aromatic hydrocarbon group represented by $R^{101}$ in Formula (b-1).

Examples of the alkylene group and alkenylene group as $Y^{201}$ include groups in which one hydrogen atom has been removed from the chain-like alkyl group or the chain-like alkenyl group as $R^{101}$ in Formula (b-1).

In Formulae (ca-4) and (ca-5), x represents 1 or 2.

$W^{201}$ represents a (v+1)-valent linking group, that is, a divalent or trivalent linking group.

As the divalent linking group represented by $W^{201}$, a divalent hydrocarbon group which may have a substituent is preferable, and as examples thereof, the same divalent hydrocarbon groups (which may have a substituent) as those described above represented by $Ya^{21}$ in Formula (a2-1) can be exemplified. The divalent linking group as $W^{201}$ may be linear, branched or cyclic, and cyclic is more preferable. Among these, an arylene group having two carbonyl groups, each bonded to the terminal thereof is preferable. Examples of the arylene group include a phenylene group, and a naphthylene group, and a phenylene group is particularly preferable.

As the trivalent linking group as $W^{201}$, a group in which one hydrogen atom has been removed from the above-described divalent linking group as $W^{201}$ and a group in which the divalent linking group has been bonded to another divalent linking group can be exemplified. The trivalent linking group as $W^{201}$ is preferably a group in which two carbonyl groups are bonded to an arylene group.

Specific suitable examples of the cation represented by Formula (ca-1) include cations represented by Formulae (ca-1-1) to (ca-1-72) shown below.

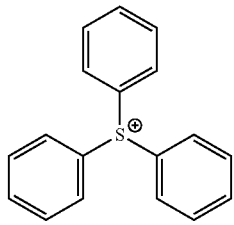

(ca-1-1)

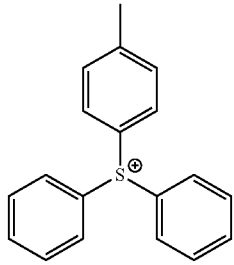

(ca-1-2)

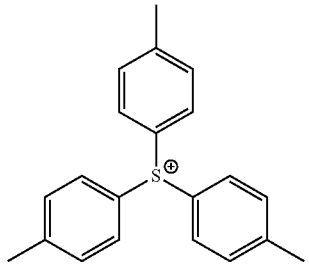

(ca-1-3)

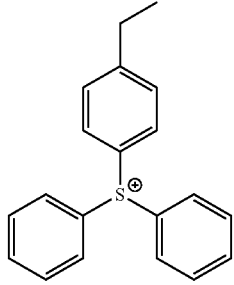

(ca-1-4)

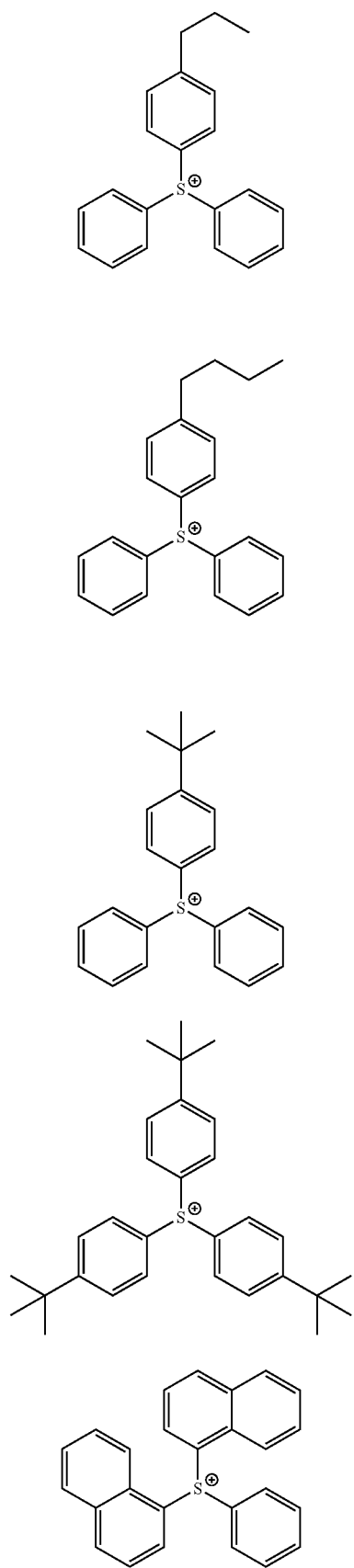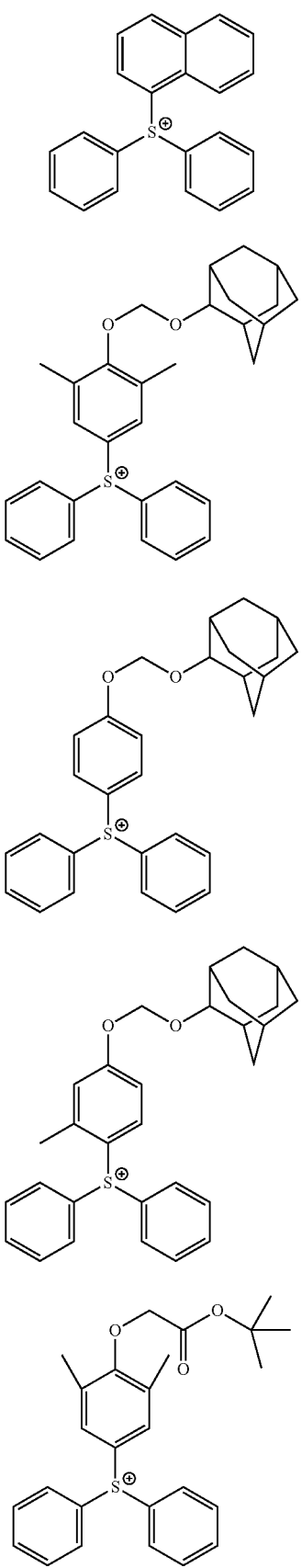

(ca-1-15)
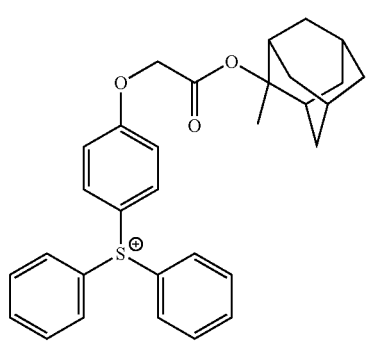
(ca-1-16)
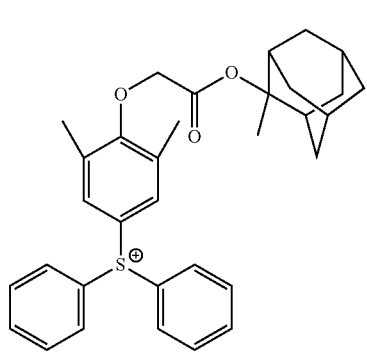
(ca-1-17)
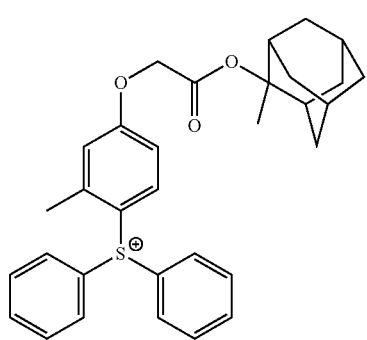
(ca-1-18)
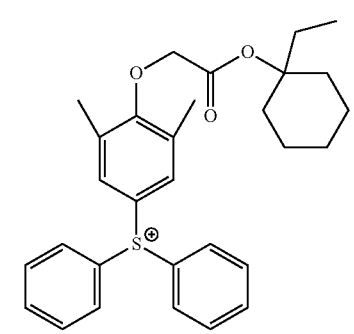
(ca-1-19)
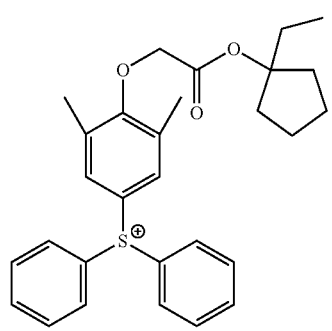
(ca-1-20)
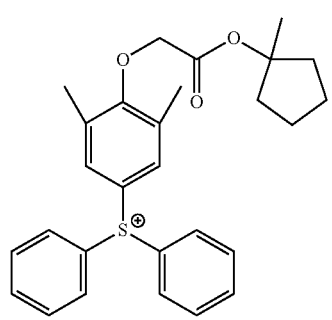
(ca-1-21)
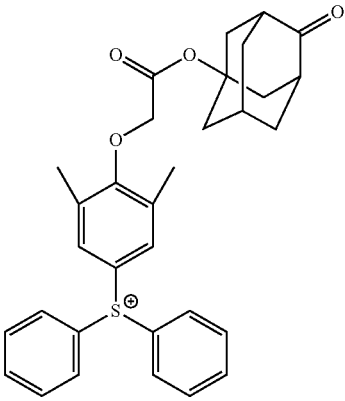
(ca-1-22)
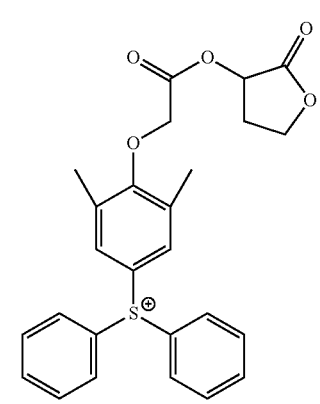

-continued
(ca-1-23)
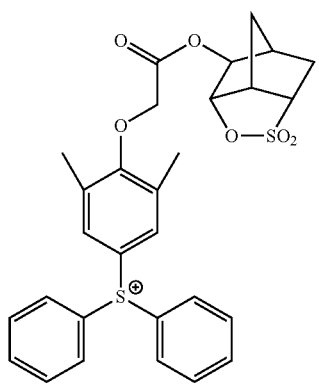
(ca-1-24)
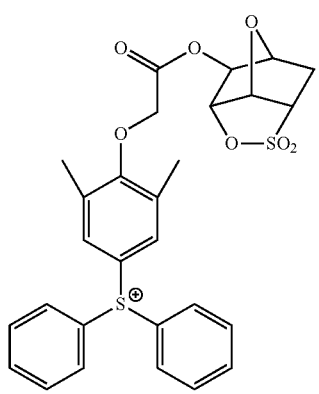
(ca-1-25)
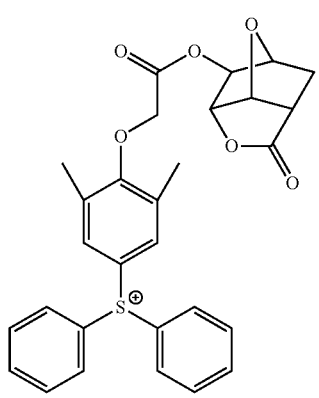
(ca-1-26)
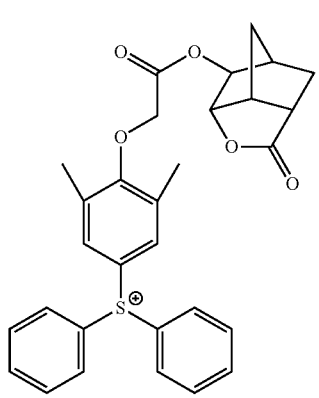
-continued
(ca-1-27)
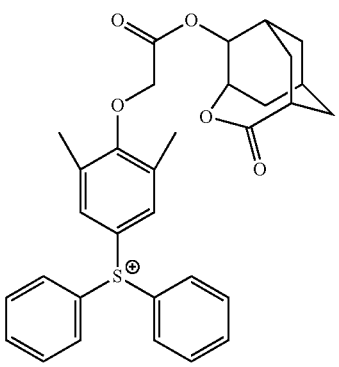
(ca-1-28)
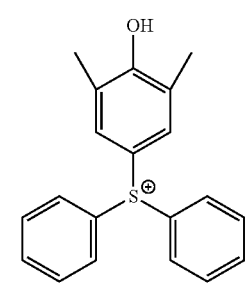
(ca-1-29)
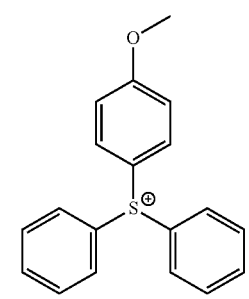
(ca-1-30)
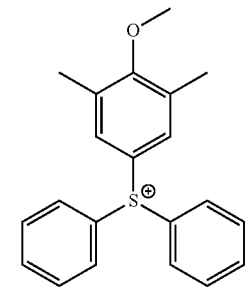
(ca-1-31)

(ca-1-32)
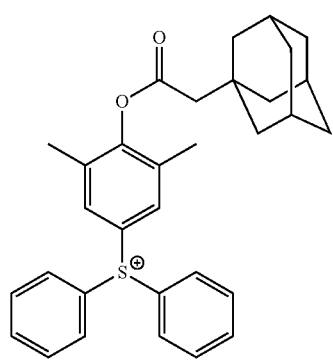
(ca-1-33)
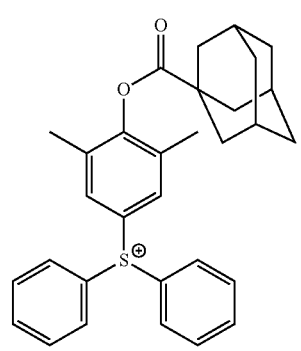
(ca-1-34)
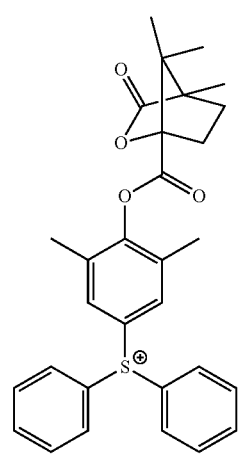
(ca-1-35)
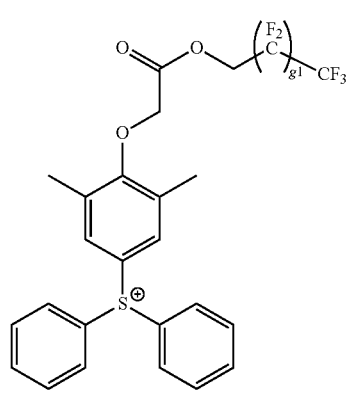
(ca-1-36)
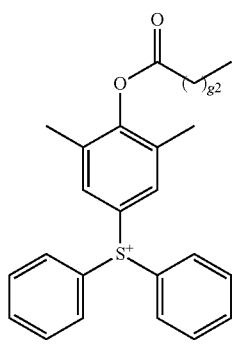
(ca-1-37)
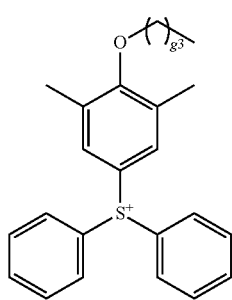
(ca-1-38)
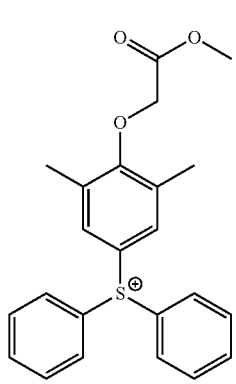
(ca-1-39)
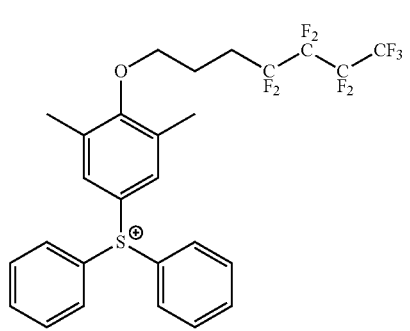

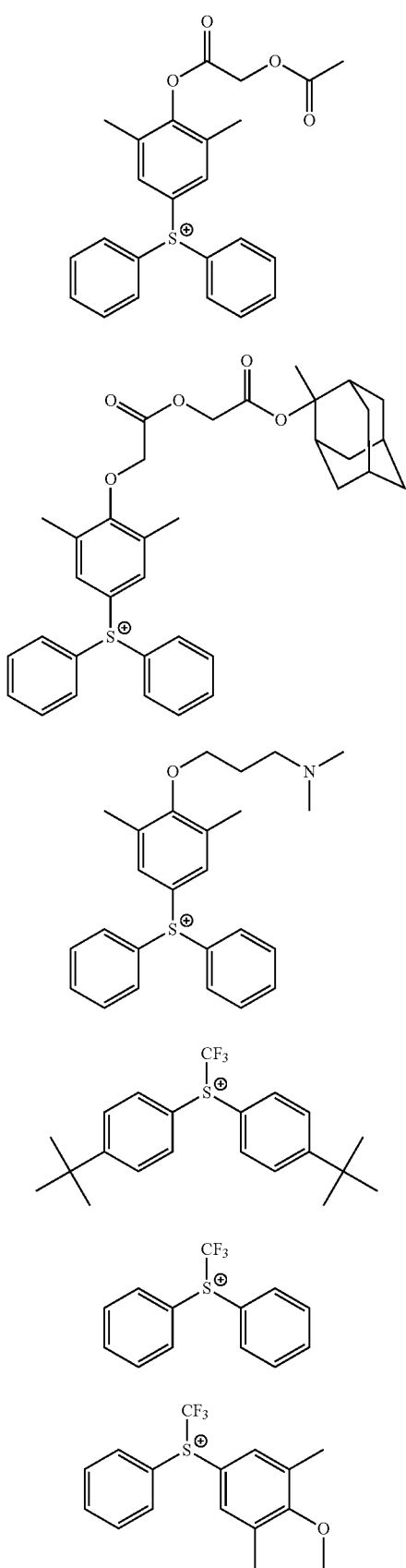
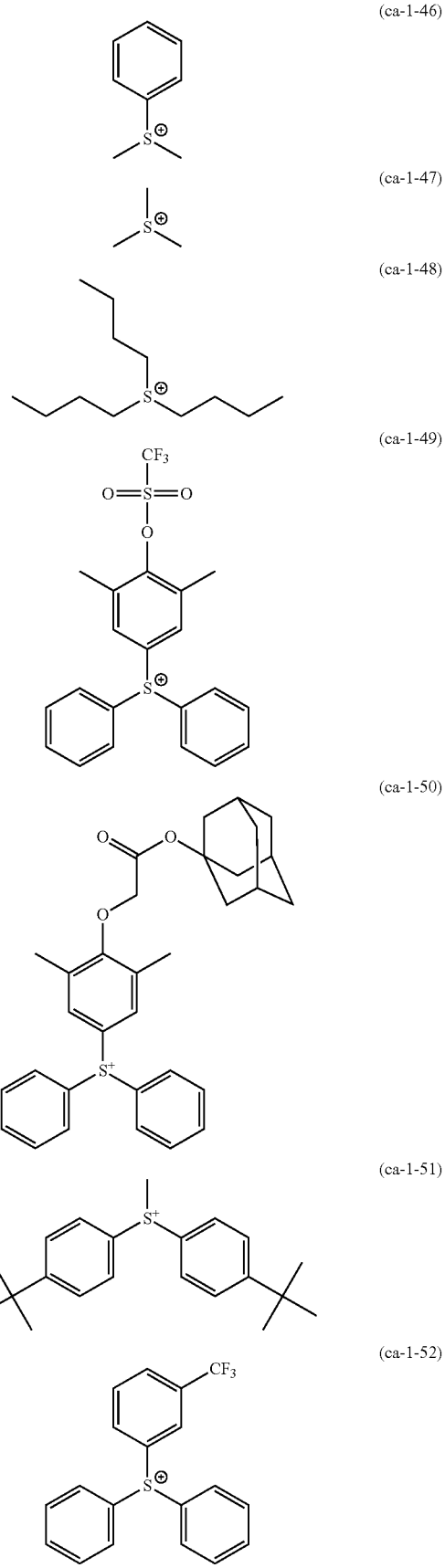

-continued
(ca-1-53)
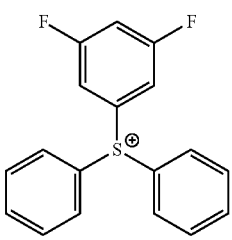
(ca-1-54)
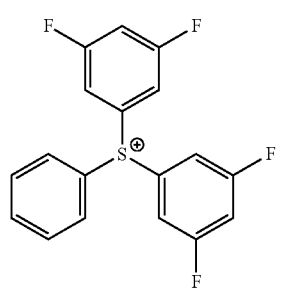
(ca-1-55)
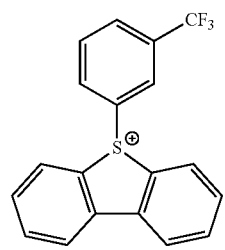
(ca-1-56)
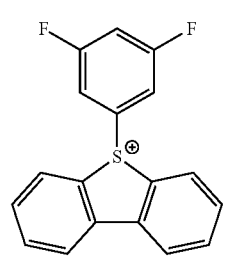
[In the formulae, g1, g2 and g3 represent a repeating number, g1 represents an integer of 1 to 5, g2 represents an integer of 0 to 20, and g3 represents an integer of 0 to 20.]
(ca-1-57)
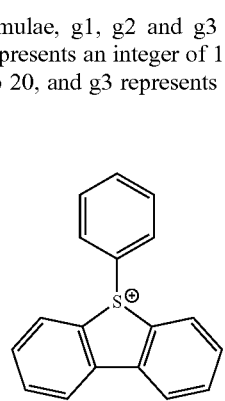
-continued
(ca-1-58)
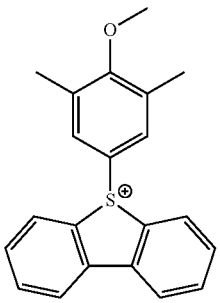
(ca-1-59)
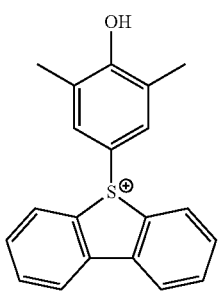
(ca-1-60)
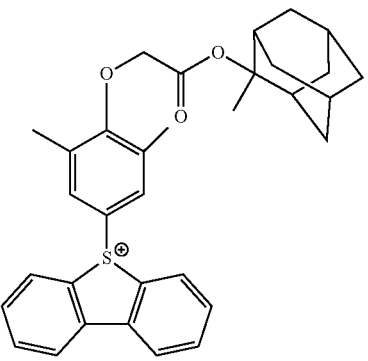
(ca-1-61)
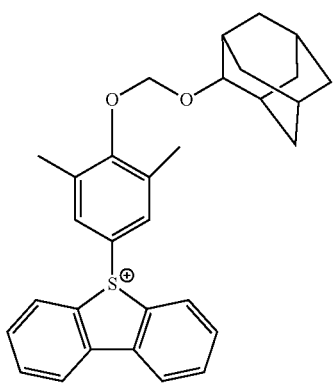
(ca-1-62)
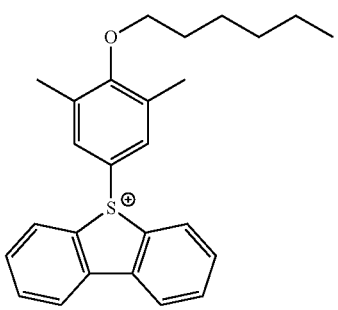

(ca-1-63)
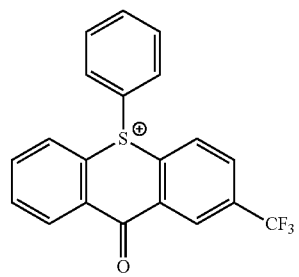
(ca-1-64)
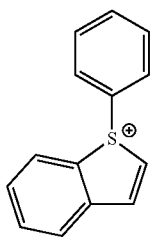
(ca-1-65)
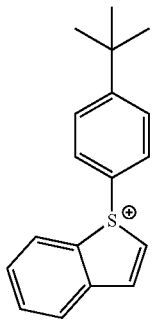
(ca-1-66)
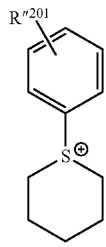
(ca-1-67)
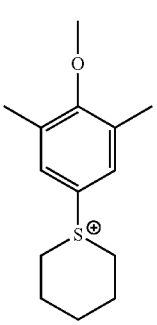
(ca-1-68)
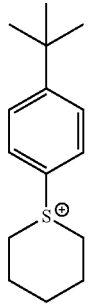
(ca-1-69)
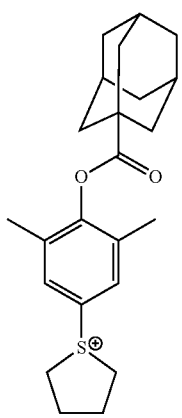
(ca-1-70)
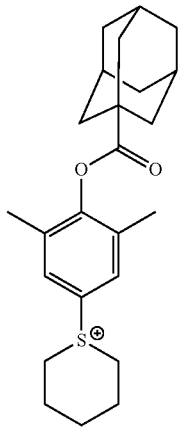
(ca-1-71)
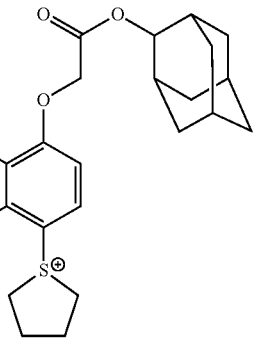

(ca-1-72)

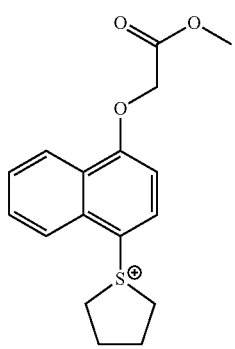

[In the formulae, R"²" represents a hydrogen atom or a substituent, and as the substituent, the same groups as those described above for substituting $R^{201}$ to $R^{207}$ and $R^{210}$ to $R^{212}$ can be exemplified.]

Specific examples of suitable cations represented by Formula (ca-2) include a dihphenyliodonium cation and a bis(4-tert-butylphenyl)iodonium cation.

Specific examples of suitable cations represented by Formula (ca-3) include cations represented by Formulae (ca-3-1) to (ca-3-6) shown below.

(ca-3-1)

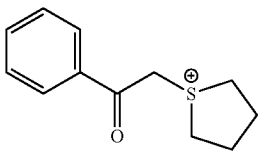

(ca-3-2)

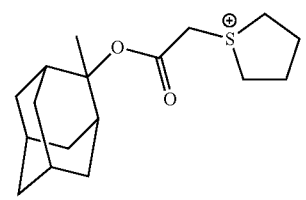

(ca-3-3)

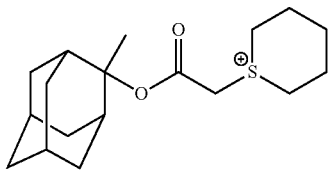

(ca-3-4)

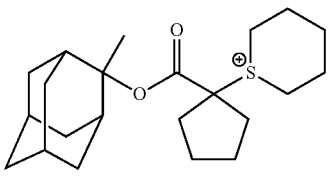

(ca-3-5)

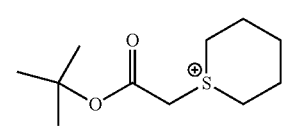

(ca-3-6)

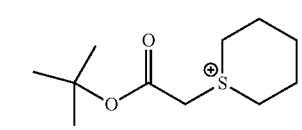

Specific examples of suitable cations represented by Formula (ca-4) include cations represented by Formulae (ca-4-1) and (ca-4-2) shown below.

(ca-4-1)

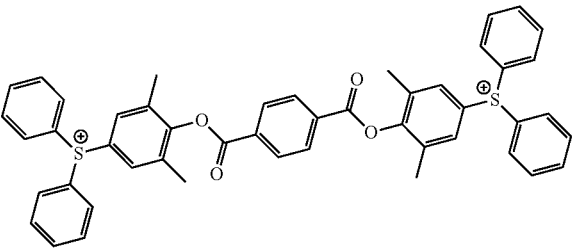

(ca-4-2)

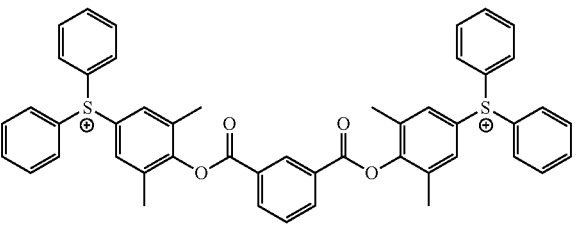

Further, as the cation represented by Formula (ca-5), cations represented by Formulae (ca-5-1) to (ca-5-3) are also preferable.

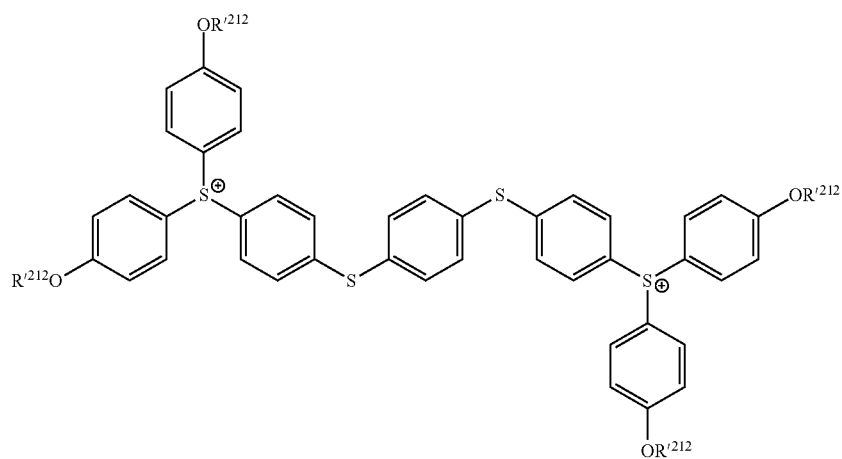

(ca-5-1)

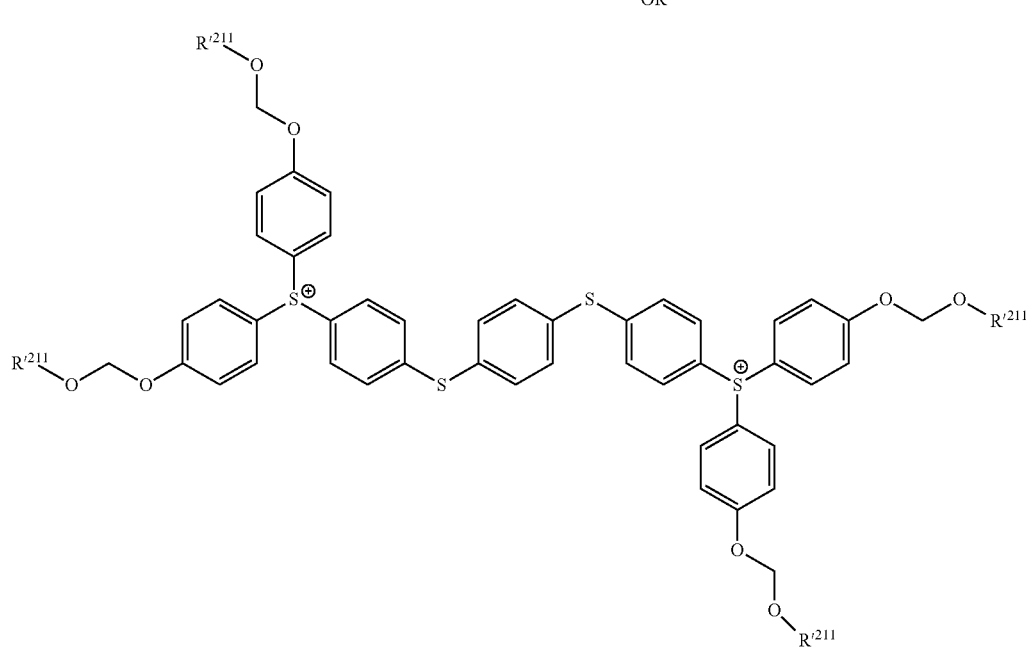

(ca-5-2)

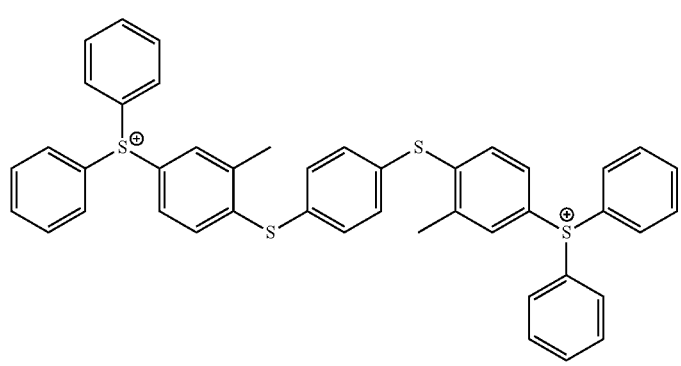

(ca-5-3)

Among the examples, as the cation moiety $[(M^{m+})_{1/m}]$, a cation represented by Formula (ca-1) is preferable, and a cation represented by any of Formulae (ca-1-1) to (ca-1-72) is more preferable.

In the component (B), the above-described acid generator may be used alone or in combination of two or more kinds thereof.

In a case where the resist composition contains the component (B), the content of the component (B) is preferably in a range of 5 to 50 parts by mass, more preferably in a range of 10 to 40 parts by mass, and still more preferably in a range of 10 to 30 parts by mass with respect to 100 parts by mass of the component (A).

In a case where the content of the component (B) is in the above-described range, pattern formation can be satisfactorily performed. Further, it is preferable that the content thereof is in the above-described range because a uniform solution is easily obtained at the time of dissolving each component of the resist composition in an organic solvent, and the storage stability of the resist composition becomes excellent.

<<Acid Diffusion Control Agent Component (D)>>

The resist composition of the present embodiment may further contain an acid diffusion control agent component (hereinafter, referred to as a "component (D)") in addition to the component (A) or the component (A) and the component (B). The component (D) acts as a quencher (an acid diffusion control agent) which traps the acid generated in the resist composition upon exposure.

The component (D) may be a photodecomposable base (D1) (hereinafter, referred to as "component (D1)") which is decomposed upon exposure and then loses the acid diffusion controllability or a nitrogen-containing organic compound (D2) (hereinafter, referred to as "component (D2)") which does not correspond to the component (D1).

In Regard to Component (D1)

In a case where a resist composition containing the component (D1) is obtained, the contrast between exposed portions and unexposed portions of the resist film can be improved at the time of formation of a resist pattern.

The component (D1) is not particularly limited as long as decomposition is made upon exposure so that the acid diffusion controllability is lost, and one or more compounds selected from the group consisting of a compound represented by Formula (d1-1) (hereinafter, referred to as a "component (d1-1)"), a compound represented by Formula (d1-2) (hereinafter, referred to as "component (d1-2)"), and a compound represented by Formula (d1-3) (hereinafter, referred to as "component (d1-3)") are preferable.

At exposed portions of the resist film, the components (d1-1) to (d1-3) are decomposed and then lose the acid diffusion controllability (basicity), and therefore the components (d1-1) to (d1-3) cannot act as a quencher, whereas at unexposed portions, the components (d1-1) to (d1-3) acts as a quencher.

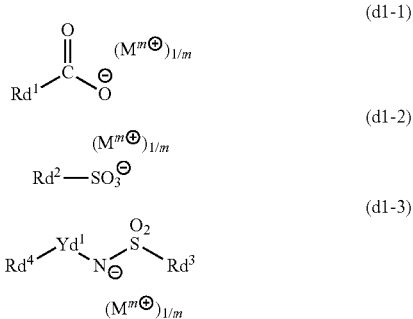

[In the formulae, $Rd^1$ to $Rd^4$ represent a cyclic group which may have a substituent, a chain-like alkyl group which may have a substituent or a chain-like alkenyl group which may have a substituent, provided that, the carbon atom adjacent to the sulfur atom in the $Rd^2$ in Formula (d1-2) has no fluorine atom bonded thereto; $Yd^1$ represents a single bond or a divalent linking group; m represents an integer of 1 or greater; and each $M^{m+}$ independently represents an m-valent organic cation.]

{Component (d1-1)}

Anion Moiety

In Formula (d1-1), $Rd^1$ represents a cyclic group which may have a substituent, a chain-like alkyl group which may have a substituent or a chain-like alkenyl group which may have a substituent, and examples thereof are the same as those described above as $R^{101}$ in Formula (b-1).

Among these, as the group as $Rd^1$, an aromatic hydrocarbon group which may have a substituent, an aliphatic cyclic group which may have a substituent and a chain-like alkyl group which may have a substituent are preferable. Examples of the substituent for these groups include a hydroxyl group, an oxo group, an alkyl group, an aryl group, a fluorine atom, a fluorinated alkyl group, a lactone-containing cyclic group represented by any of Formulae (a2-r-1) to (a2-r-7), an ether bond, an ester bond, and a combination thereof. In a case where an ether bond or an ester bond is included as the substituent, the substituent may be bonded via an alkylene group, and a linking group represented by any of Formulae (y-a1-1) to (y-a1-5) is preferable as the substituent.

The aromatic hydrocarbon group is preferably a phenyl group or a naphthyl group.

Examples of the aliphatic cyclic group include groups in which one or more hydrogen atoms have been removed from a polycycloalkane such as adamantane, norbornane, isobornane, tricyclodecane or tetracyclododecane.

The chain-like alkyl group preferably has 1 to 10 carbon atoms, and specific examples thereof include a linear alkyl group such as a methyl group, an ethyl group, a propyl group, a butyl group, a pentyl group, a hexyl group, a heptyl group, an octyl group, a nonyl group, or a decyl group, and a branched alkyl group such as a 1-methylethyl group, a 1-methylpropyl group, a 2-methylpropyl group, a 1-methylbutyl group, a 2-methylbutyl group, a 3-methylbutyl group, a 1-ethylbutyl group, a 2-ethylbutyl group, a 1-methylpentyl group, a 2-methylpentyl group, a 3-methylpentyl group, or a 4-methylpentyl group.

In a case where the chain-like alkyl group is a fluorinated alkyl group having a fluorine atom or a fluorinated alkyl group as a substituent, the fluorinated alkyl group has preferably 1 to 11 carbon atoms, more preferably 1 to 8 carbon atoms, and still more preferably 1 to 4 carbon atoms. The fluorinated alkyl group may contain an atom other than fluorine. Examples of the atom other than fluorine include an oxygen atom, a sulfur atom, and a nitrogen atom.

As $Rd^1$, a fluorinated alkyl group in which some or all hydrogen atoms constituting a linear alkyl group have been substituted with fluorine atom(s) is preferable, and a fluorinated alkyl group in which all of the hydrogen atoms constituting a linear alkyl group have been substituted with fluorine atoms (a linear perfluoroalkyl group) is particularly preferable.

Specific examples of preferable anion moieties for the component (d1-1) are shown below.

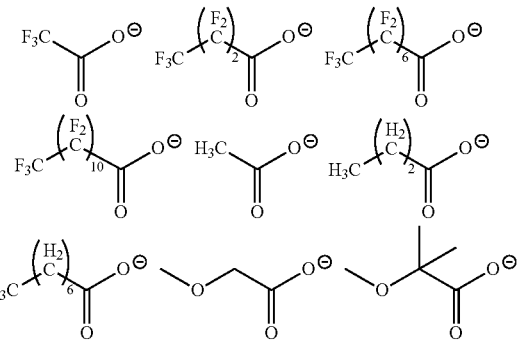

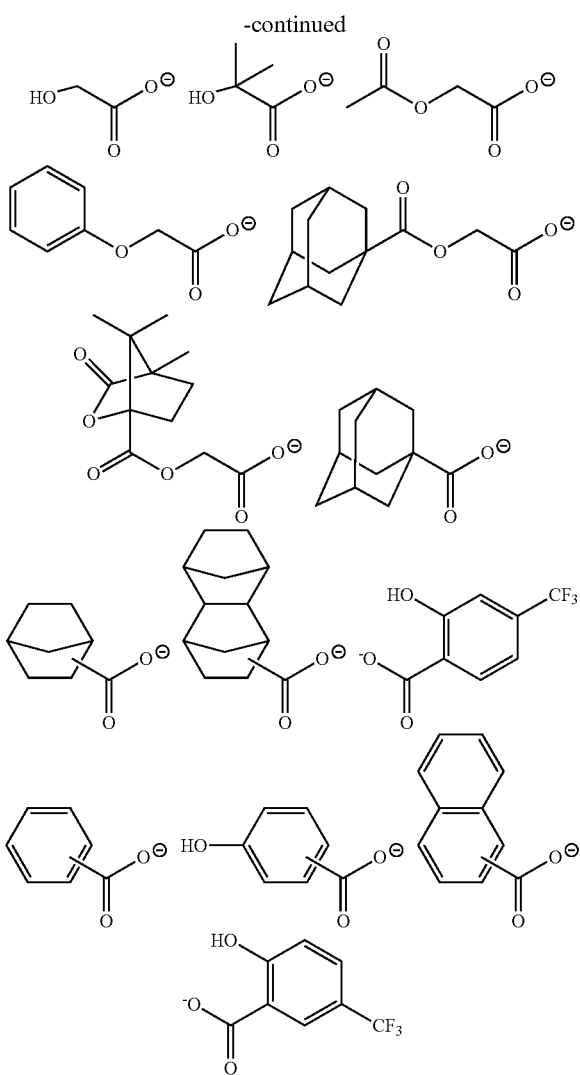

Cation Moiety

In Formula (d1-1), $M^{m+}$ represents an m-valent organic cation.

As the organic cation as $M^{m+}$, the same cations as those represented by Formulae (ca-1) to (ca-5) are suitably exemplified, a cation represented by the above-described Formulae (ca-1) is more preferable, and cations represented Formulae (ca-1-1) to (ca-1-72) are still more preferable.

The component (d1-1) may be used alone or in combination of two or more kinds thereof.

{Component (d1-2)}

Anion Moiety

In Formula (d1-2), $Rd^2$ represents a cyclic group which may have a substituent, a chain-like alkyl group which may have a substituent, or a chain-like alkenyl group which may have a substituent, and the same groups as those described above as $R^{101}$ in Formula (b-1) are exemplified.

Here, the carbon atom adjacent to the S atom in $Rd^2$ has no fluorine atom bonded thereto (the carbon atom adjacent to the sulfur atom in $Rd^2$ is not substituted with a fluorine atom). As a result, the anion of the component (d1-2) becomes an appropriately weak acid anion, thereby improving the quenching ability of the component (D).

As $Rd^2$, a chain-like alkyl group which may have a substituent or an aliphatic cyclic group which may have a substituent is preferable. The chain-like alkyl group has preferably 1 to 10 carbon atoms and more preferably 3 to 10 carbon atoms. As the aliphatic cyclic group, a group in which one or more hydrogen atoms have been removed from adamantane, norbornane, isobornane, tricyclodecane, or tetracyclododecane (which may have a substituent) and a group in which one or more hydrogen atoms have been removed from camphor are more preferable.

The hydrocarbon group as $Rd^2$ may have a substituent. As the substituent, the same groups as the substituents which may be included in the hydrocarbon group (such as an aromatic hydrocarbon group, an aliphatic cyclic group, or a chain-like alkyl group) as $Rd^1$ in Formula (d1-1) can be exemplified.

Specific examples of preferable anion moieties for the component (d1-2) are shown below.

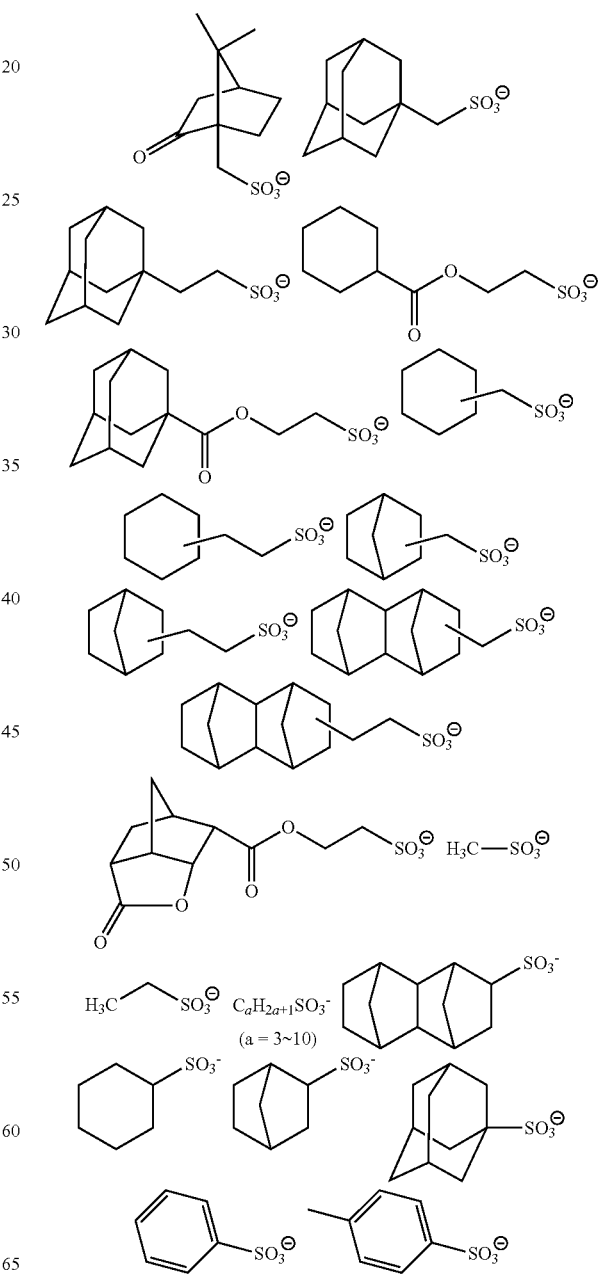

Cation Moiety

In Formula (d1-2), $M^{m+}$ represents an m-valent organic cation, and has the same definition as that for $M^{m+}$ in the above-described Formula (d1-1).

The component (d1-2) may be used alone or in combination of two or more kinds thereof.

{Component (d1-3)}

Anion Moiety

In Formula (d1-3), $Rd^3$ represents a cyclic group which may have a substituent, a chain-like alkyl group which may have a substituent, or a chain-like alkenyl group which may have a substituent, and the same groups as those described above as $R^{101}$ in Formula (b-1) are exemplified, and a cyclic group containing a fluorine atom, a chain-like alkyl group, or a chain-like alkenyl group is preferable. Among these, a fluorinated alkyl group is preferable, and the same fluorinated alkyl groups as those described above as $Rd^1$ are more preferable.

In Formula (d1-3), $Rd^4$ represents a cyclic group which may have a substituent, a chain-like alkyl group which may have a substituent or a chain-like alkenyl group which may have a substituent, and the same groups as those described above as $R^{101}$ in Formula (b-1) are exemplified.

Among these, an alkyl group which may have substituent, an alkoxy group which may have substituent, an alkenyl group which may have substituent, or a cyclic group which may have substituent is preferable.

The alkyl group as $Rd^4$ is preferably a linear or branched alkyl group having 1 to 5 carbon atoms, and specific examples thereof include a methyl group, an ethyl group, a propyl group, an isopropyl group, an n-butyl group, an isobutyl group, a tert-butyl group, a pentyl group, an iso-pentyl group, and a neopentyl group. Some hydrogen atoms in the alkyl group as $Rd^4$ may be substituted with a hydroxyl group, a cyano group, or the like.

The alkoxy group as $Rd^4$ is preferably an alkoxy group having 1 to 5 carbon atoms, and specific examples thereof include a methoxy group, an ethoxy group, an n-propoxy group, an iso-propoxy group, an n-butoxy group, and a tert-butoxy group. Among these, a methoxy group and an ethoxy group are preferable.

As the alkenyl group as $Rd^4$, the same groups as those described above as $R^{101}$ in Formula (b-1) can be exemplified, and a vinyl group, a propenyl group (an allyl group), a 1-methylpropenyl group, and a 2-methylpropenyl group are preferable. These groups may have an alkyl group having 1 to 5 carbon atoms or a halogenated alkyl group having 1 to 5 carbon atoms as a substituent.

As the cyclic group as $Rd^4$, the same groups as those described above as $R^{101}$ in Formula (b-1) can be exemplified. Among these, as the cyclic group, an alicyclic group in which one or more hydrogen atoms have been removed from a cycloalkane such as cyclopentane, cyclohexane, adamantane, norbornane, isobornane, tricyclodecane or tetracyclododecane or an aromatic group such as a phenyl group or a naphthyl group is preferable. In a case where $Rd^4$ represents an alicyclic group, the resist composition can be satisfactorily dissolved in an organic solvent, thereby improving the lithography characteristics. Further, in a case where $Rd^4$ represents an aromatic group, the resist composition exhibits an excellent photoabsorption efficiency in a lithography process using EUV or the like as the exposure light source, thereby resulting in the improvement of the sensitivity and the lithography characteristics.

In Formula (d1-3), $Yd^1$ represents a single bond or a divalent linking group.

The divalent linking group as $Yd^1$ is not particularly limited, and examples thereof include a divalent hydrocarbon group (an aliphatic hydrocarbon group or an aromatic hydrocarbon group) which may have a substituent and a divalent linking group containing a hetero atom. The divalent linking groups are the same as described above as the divalent hydrocarbon group which may have a substituent and the divalent linking group containing a hetero atom explained above as the divalent linking group as $Ya^{21}$ in Formula (a2-1).

As $Yd^1$, a carbonyl group, an ester bond, an amide bond, an alkylene group, or a combination of these is preferable. As the alkylene group, a linear or branched alkylene group is more preferable, and a methylene group or an ethylene group is still more preferable.

Specific examples of preferable anion moieties for the component (d1-3) are shown below.

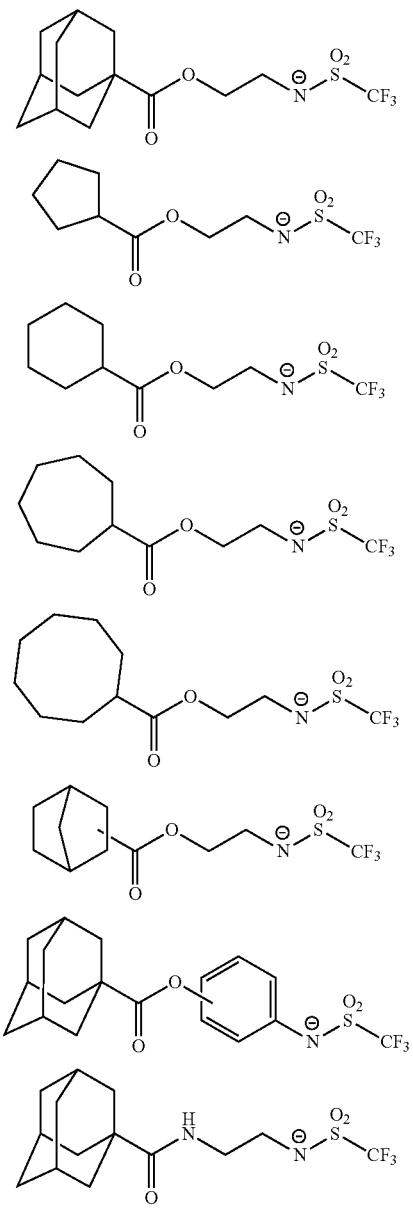

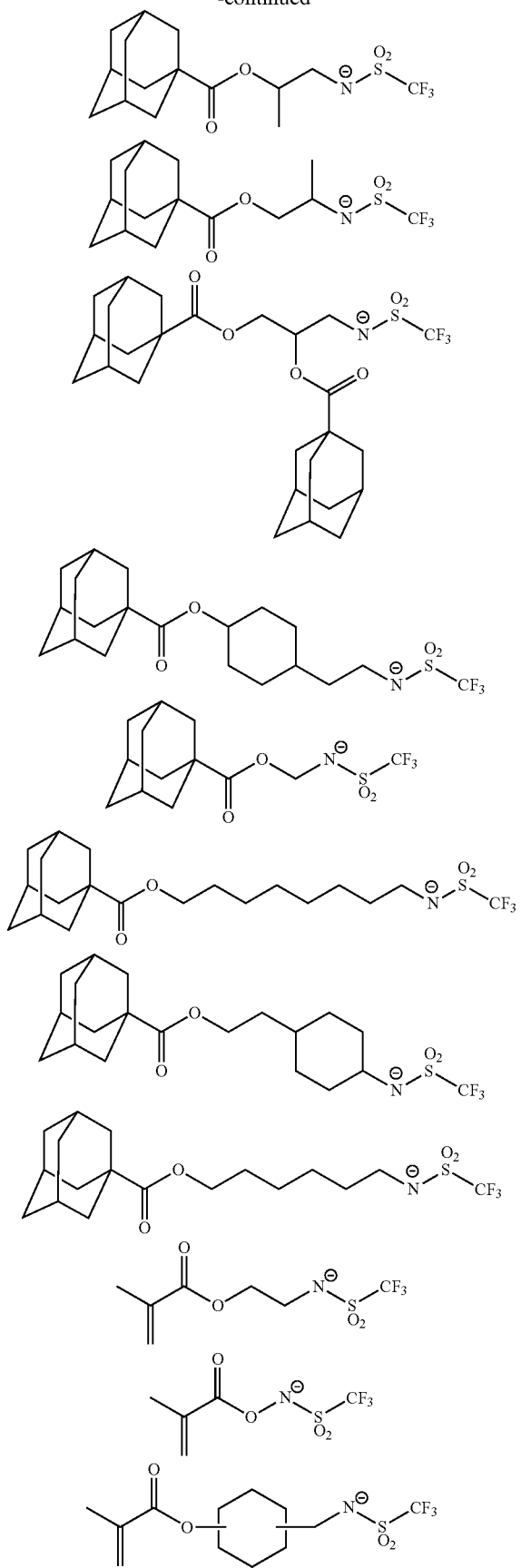
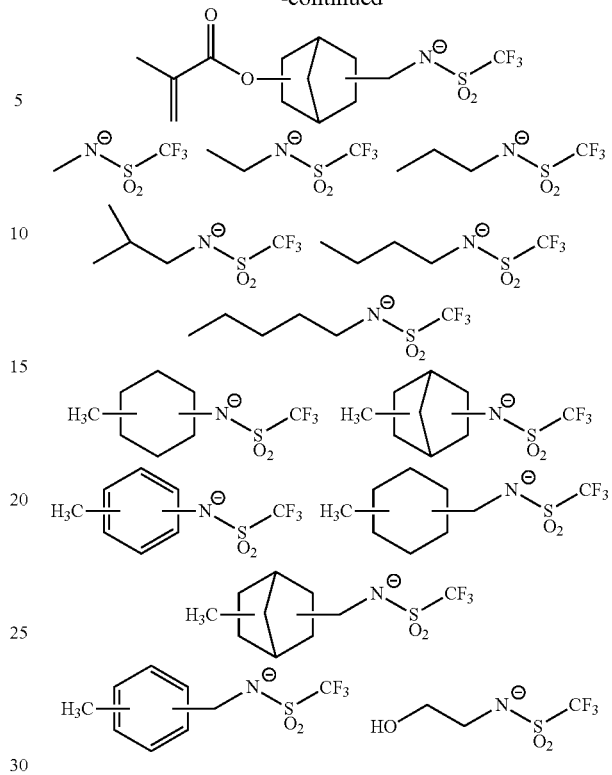

Cation Moiety

In Formula (d1-3), $M^{m+}$ represents an m-valent organic cation, and has the same definition as that for $M^{m+}$ in Formula (d1-1).

The component (d1-3) may be used alone or in combination of two or more kinds thereof.

As the component (D1), only one of the above-described components (d1-1) to (d1-3) or a combination of two or more kinds thereof may be used.

In a case where the resist composition contains the component (D1), the content of the component (D1) is preferably in a range of 0.5 to 10 parts by mass, more preferably in a range of 0.5 to 8 parts by mass, and still more preferably in a range of 1 to 8 parts by mass with respect to 100 parts by mass of the component (A).

In a case where the content of the component (D1) is greater than or equal to the preferable lower limit, excellent lithography characteristics and an excellent resist pattern shape can be more reliably obtained. Further, in a case where the content thereof is less than or equal to the upper limit thereof, the sensitivity can be maintained satisfactorily, and through-put also becomes excellent.

Method of Producing Component (D1):

The production methods of the components (d1-1) and (d1-2) are not particularly limited, and the components (d1-1) and (d1-2) can be produced by known methods.

Further, the method of producing the component (d1-3) is not particularly limited, and the component (d1-3) can be produced in the same manner as disclosed in United States Patent Application, Publication No. 2012-0149916.

Component (D2)

The resist composition may contain a nitrogen-containing organic compound component (hereinafter, referred to as a "component (D2)") that does not correspond to the component (D1) as the acid diffusion control agent component.

The component (D2) is not particularly limited, as long as it acts as an acid diffusion control agent and does not correspond to the component (D1). As the component (D2), any of the conventionally known compounds may be optionally used. Among these, an aliphatic amine is preferable, and a secondary aliphatic amine or tertiary aliphatic amine is particularly preferable.

An aliphatic amine is an amine having one or more aliphatic groups, and the aliphatic groups preferably have 1 to 12 carbon atoms.

Examples of these aliphatic amines include amines in which at least one hydrogen atom of ammonia ($NH_3$) has been substituted with an alkyl group or hydroxyalkyl group having 12 or less carbon atoms (alkylamines or alkylalcoholamines), and cyclic amines.

Specific examples of alkylamines and alkylalcoholamines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decylamine, and tri-n-dodecylamine; and alkyl alcohol amines such as diethanolamine, triethanolamine, diisopropanolamine, triisopropanolamine, di-n-octanolamine, and tri-n-octanolamine. Among these, trialkylamines of 5 to 10 carbon atoms are preferable, and tri-n-pentylamine and tri-n-octylamine are particularly preferable.

Examples of the cyclic amine include heterocyclic compounds containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

Examples of other aliphatic amines include tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine and triethanolamine triacetate, and triethanolamine triacetate is preferable.

Further, as the component (D2), an aromatic amine may be used.

Examples of aromatic amines include 4-dimethylaminopyridine, pyrrole, indole, pyrazole, imidazole and derivatives thereof as well as tribenzylamine, 2,6-diisopropylaniline and N-tert-butoxycarbonylpyrrolidine.

The component (D2) may be used alone or in combination of two or more kinds thereof.

In a case where the resist composition contains the component (D2), the content of the component (D2) is typically in a range of 0.01 to 5 parts by mass with respect to 100 parts by mass of the component (A). In a case where the content thereof is in the above-described range, the shape of the resist pattern and the post exposure temporal stability are improved.

<<At Least One Compound (E) Selected from Group Consisting of Organic Carboxylic Acids, Phosphorus Oxo Acids, and Derivatives Thereof>>

For the purpose of preventing any deterioration in sensitivity, and improving the resist pattern shape and the post exposure temporal stability, the resist composition of the present embodiment may contain at least one compound (E) (hereinafter referred to as the component (E)) selected from the group consisting of an organic carboxylic acid, or a phosphorus oxo acid and a derivative thereof.

Examples of suitable organic carboxylic acids include acetic acid, malonic acid, citric acid, malic acid, succinic acid, benzoic acid, and salicylic acid.

Examples of phosphorus oxo acids include phosphoric acid, phosphonic acid, and phosphinic acid. Among these, phosphonic acid is particularly preferable.

Examples of phosphorus oxo acid derivatives include esters in which a hydrogen atom in the above-described oxo acids is substituted with a hydrocarbon group. Examples of the hydrocarbon group include an alkyl group having 1 to 5 carbon atoms and an aryl group having 6 to 15 carbon atoms.

Examples of phosphoric acid derivatives include phosphoric acid esters such as di-n-butyl phosphate and diphenyl phosphate.

Examples of phosphonic acid derivatives include phosphonic acid esters such as dimethyl phosphonate, di-n-butyl phosphonate, phenylphosphonic acid, diphenyl phosphonate, and dibenzyl phosphonate.

Examples of phosphinic acid derivatives include phosphinic acid esters and phenylphosphinic acid.

The component (E) may be used alone or in combination of two or more kinds thereof.

In a case where the resist composition contains the component (E), the content of the component (E) is typically in a range of 0.01 to 5 parts by mass, with respect to 100 parts by mass of the component (A).

<<Fluorine Additive Component (F)>>

In the present embodiment, the resist composition may further include a fluorine additive (hereinafter, referred to as "component (F)") for imparting water repellency to the resist film.

As the component (F), a fluorine-containing polymeric compound described in Japanese Unexamined Patent Application, First Publication No. 2010-002870, Japanese Unexamined Patent Application, First Publication No. 2010-032994, Japanese Unexamined Patent Application, First Publication No. 2010-277043, Japanese Unexamined Patent Application, First Publication No. 2011-13569, and Japanese Unexamined Patent Application, First Publication No. 2011-128226 can be exemplified.

Specific examples of the component (F) include polymers having a constitutional unit (f1) represented by Formula (f1-1) shown below. As the polymer, a polymer (homopolymer) consisting of a constitutional unit (f1) represented by Formula (f1-1) shown below; a copolymer of the constitutional unit (f1) and the above-described constitutional unit (a1) containing an acid decomposable group whose polarity is increased due to the action of an acid; and a copolymer of the constitutional unit (f1), a constitutional unit derived from acrylic acid or methacrylic acid and the above-described constitutional unit (a1) are preferable. Preferred examples of the constitutional unit (a1) to be copolymerized with the constitutional unit (f1) include a constitutional unit derived from 1-ethyl-1-cyclooctyl (meth)acrylate and a constitutional unit derived from 1-methyl-1-adamantyl (meth)acrylate.

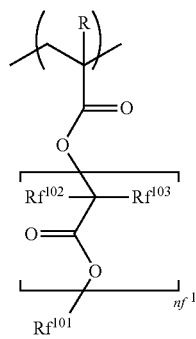

(f1-1)

[In the formula, R has the same definition as described above; $Rf^{102}$ and $Rf^{103}$ each independently represent a hydrogen atom, a halogen atom, an alkyl group having 1 to 5 carbon atoms, or a halogenated alkyl group having 1 to 5 carbon atoms, provided that $Rf^{102}$ and $Rf^{103}$ may be the same as or different from each other; $nf^1$ represents an integer of 1 to 5; and $Rf^{101}$ represents an organic group containing a fluorine atom.]

In Formula (f1-1), R bonded to the carbon atom at the α-position has the same definition as described above. As R, a hydrogen atom or a methyl group is preferable.

In Formula (f1-1), examples of the halogen atom as $Rf^{102}$ and $Rf^{103}$ include a fluorine atom, a chlorine atom, a bromine atom, and an iodine atom, and a fluorine atom is particularly preferable. Examples of the alkyl group having 1 to 5 carbon atoms as $Rf^{102}$ and $Rf^{103}$ include those described above as the alkyl group having 1 to 5 carbon atoms as R, and a methyl group or an ethyl group is preferable. Specific examples of the halogenated alkyl group having 1 to 5 carbon atoms as $Rf^{102}$ and $Rf^{103}$ include groups in which some or all hydrogen atoms of the above-described alkyl groups of 1 to 5 carbon atoms have been substituted with halogen atoms.

Examples of the halogen atom include a fluorine atom, a chlorine atom, a bromine atom, and an iodine atom, and a fluorine atom is particularly preferable.

Among these examples, as $Rf^{102}$ and $Rf^{103}$, a hydrogen atom, a fluorine atom, or an alkyl group having 1 to 5 carbon atoms is preferable, and a hydrogen atom, a fluorine atom, a methyl group, or an ethyl group is more preferable.

In Formula (f1-1), $nf^1$ represents an integer of 1 to 5, preferably an integer of 1 to 3, and more preferably an integer of 1 or 2.

In Formula (f1-1), $Rf^{101}$ represents an organic group containing a fluorine atom, and is preferably a hydrocarbon group containing a fluorine atom.

The hydrocarbon group containing a fluorine atom may be linear, branched, or cyclic, and has preferably 1 to 20 carbon atoms, more preferably 1 to 15 carbon atoms, and particularly preferably 1 to 10 carbon atoms.

It is preferable that the hydrocarbon group having a fluorine atom has 25% or more of the hydrogen atoms in the hydrocarbon group fluorinated, more preferably 50% or greater, and particularly preferably 60% or greater from the viewpoint of improving the hydrophobicity of the resist film during immersion exposure.

Among these, as $Rf^{101}$, a fluorinated hydrocarbon group having 1 to 6 carbon atoms is preferable, and a trifluoromethyl group, $-CH_2-CF_3$, $-CH_2-CF_2-CF_3$, $-CH(CF_3)_2$, $-CH_2-CH_2-CF_3$, and $-CH_2-CH_2-CF_2-CF_2-CF_2-CF_3$ are most preferable.

The weight average molecular weight (Mw) (in terms of polystyrene determined by gel permeation chromatography) of the component (F) is preferably in a range of 1,000 to 50,000, more preferably in a range of 5,000 to 40,000, and most preferably in a range of 10,000 to 30,000. In a case where the weight average molecular weight is less than or equal to the upper limit of the above-described range, the resist composition exhibits a satisfactory solubility in a solvent for a resist enough to be used as a resist. On the other hand, in a case where the weight average molecular weight is greater than or equal to the lower limit of the above-described range, dry etching resistance and the cross-sectional shape of the resist pattern become excellent.

Further, the dispersity (Mw/Mn) of the component (F) is preferably in a range of 1.0 to 5.0, more preferably in a range of 1.0 to 3.0, and most preferably in a range of 1.2 to 2.5.

The component (F) may be used alone or in combination of two or more kinds thereof.

In a case where the resist composition contains the component (F), the content of the component (F) is typically in a range of 0.5 to 10 parts by mass, with respect to 100 parts by mass of the component (A).

As desired, other miscible additives can also be added to the resist composition of the present invention. The resist composition may contain miscible additives such as additive resins, dissolution inhibitors, plasticizers, stabilizers, colorants, halation prevention agents, and dyes for improving the performance of the resist film, as appropriate.

<<Organic Solvent Component (S)>>

The resist composition of the present embodiment may be produced by dissolving the resist materials in an organic solvent (hereinafter, referred to as a "component (S)").

The component (S) may be any organic solvent which can dissolve the respective components to be used to obtain a uniform solution, and optional organic solvent can be appropriately selected from those which have been conventionally known as solvents for a chemically amplified resist composition and then used.

Examples thereof include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (such as monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene; and dimethylsulfoxide (DMSO).

The component (S) may be used alone or in the form of a mixed solvent of two or more kinds thereof.

Among these, PGMEA, PGME, γ-butyrolactone, EL and cyclohexanone are preferable.

Further, among the mixed solvents, a mixed solvent obtained by mixing PGMEA with a polar solvent is preferable. The mixing ratio (mass ratio) of the mixed solvent can be appropriately determined, taking into consideration the compatibility of the PGMEA with the polar solvent, but is preferably in the range of 1:9 to 9:1 and more preferably in a range of 2:8 to 8:2.

More specifically, in a case where EL or cyclohexanone is mixed as the polar solvent, the PGMEA:EL or cyclohexanone mass ratio is preferably in a range of 1:9 to 9:1 and more preferably in a range of 2:8 to 8:2. Alternatively, in a case where PGME is mixed as the polar solvent, the PGMEA:PGME mass ratio is preferably in a range of 1:9 to 9:1, more preferably in a range of 2:8 to 8:2, and still more preferably in a range of 3:7 to 7:3. Furthermore, a mixed solvent of PGMEA, PGME and cyclohexanone is also preferable.

Further, as the component (S), a mixed solvent of at least one of PGMEA and EL with γ-butyrolactone is also preferable. The mass ratio (former:latter) of such a mixed solvent is preferably in a range of 70:30 to 95:5.

The amount of the component (S) is not particularly limited, and is appropriately adjusted to a concentration which enables coating of a coating solution to a substrate. In general, the component (S) is used in an amount such that the solid content of the resist composition becomes in the range of 1% to 20% by mass and preferably in a range of 2% to 15% by mass.

In the resist composition of the present embodiment, a constitutional unit having a specific structure, that is, a resin component (A1) having a constitutional unit (a0) represented by Formula (a0-1) and a constitutional unit (1) containing an acid decomposable group whose polarity is increased due to the action of an acid is employed as described above.

The tertiary carbon atom-containing group that protects the oxy group (—O—) side of the carbonyloxy group [—C(=O)—O—] in the constitutional unit (a0) contains an aromatic hydrocarbon group (Ra00).

Accordingly, a carbocation generated at the time of dissociation of the tertiary carbon atom-containing group due to the action of an acid has high stability. Therefore, it is speculated that the acid dissociation property of the constitutional unit (a0) is improved and contributes to improvement of the sensitivity and the resolution.

Further, it is considered that the diffusion of an acid can be satisfactorily controlled because the tertiary carbon atom-containing group in the constitutional unit (a0) has a bulky structure.

Further, it is speculated that various lithography characteristics are balanced satisfactorily and the resolution and the roughness are improved while the effects of improving the sensitivity and the resolution using the constitutional unit (a0) are maintained by using the constitutional unit (a1) and the constitutional unit (a0) in combination.

(Method of Forming a Resist Pattern)

The method of forming a resist pattern according to the present embodiment includes a step of forming a resist film on a support using the resist composition described above; a step of exposing the resist film; and a step of developing the exposed resist film to form a resist pattern.

According to the embodiment of the method of forming a resist pattern, a method for forming a resist pattern by performing processes as described below is exemplified.

First, a resist composition of the according to the embodiment is applied to a support using a spinner or the like, and a bake treatment (post applied bake (PAB)) is conducted at a temperature of 80 to 150° C. for 40 to 120 seconds and preferably 60 to 90 seconds, to form a resist film.

Following selective exposure of the thus formed resist film, by exposure through a mask having a predetermined pattern formed thereon (mask pattern) using an exposure apparatus such as an ArF exposure apparatus, an electron beam lithography apparatus, or an EUV exposure apparatus, or by patterning via direct irradiation with an electron beam without using a mask pattern, baking treatment (post exposure baking (PEB)) is conducted under temperature conditions of 80 to 150° C. for 40 to 120 seconds, and preferably 60 to 90 seconds.

Next, the resist film is subjected to a developing treatment. The developing treatment is conducted using an alkali developing solution in a case of an alkali developing process, and a developing solution containing an organic solvent (organic developing solution) in a case of a solvent developing process.

After the developing treatment, it is preferable to conduct a rinse treatment. The rinse treatment is preferably conducted using pure water in a case of an alkali developing process, and a rinse solution containing an organic solvent in a case of a solvent developing process.

In a case of a solvent developing process, after the developing treatment or the rinsing, the developing solution or the rinse liquid remaining on the pattern can be removed by a treatment using a supercritical fluid.

After the developing treatment or the rinse treatment, drying is conducted. As desired, bake treatment (post bake) can be conducted following the developing.

In this manner, a resist pattern can be formed.

The support is not specifically limited and a conventionally known support can be used. For example, substrates for electronic components, and such substrates having wiring patterns formed thereon can be used. Specific examples of the material of the substrate include metals such as silicon wafer, copper, chromium, iron and aluminum; and glass. Suitable materials for the wiring pattern include copper, aluminum, nickel, and gold.

Further, as the support, any one of the above-described supports provided with an inorganic and/or organic film on the surface thereof may be used. As the inorganic film, an inorganic antireflection film (inorganic BARC) can be used. As the organic film, an organic antireflection film (organic BARC) and an organic film such as a lower-layer organic film used in a multilayer resist method can be used.

Here, a "multilayer resist method" is method in which at least one layer of an organic film (lower-layer organic film) and at least one layer of a resist film (upper resist film) are provided on a substrate, and a resist pattern formed on the upper resist film is used as a mask to conduct patterning of the lower-layer organic film. This method is considered as being capable of forming a pattern with a high aspect ratio. More specifically, in the multilayer resist method, a desired thickness can be ensured by the lower-layer organic film, and as a result, the thickness of the resist film can be reduced, and an extremely fine pattern with a high aspect ratio can be formed.

The multilayer resist method is broadly classified into a method in which a double-layer structure consisting of an upper-layer resist film and a lower-layer organic film is formed (double-layer resist method), and a method in which a multilayer structure having at least three layers consisting of an upper-layer resist film, a lower-layer organic film and at least one intermediate layer (thin metal film or the like) provided between the upper-layer resist film and the lower-layer organic film (triple-layer resist method).

The wavelength to be used for exposure is not particularly limited and the exposure can be conducted using radiation such as an ArF excimer laser, a KrF excimer laser, an $F_2$ excimer laser, extreme ultraviolet rays (EUV), vacuum ultraviolet rays (VUV), electron beams (EB), X-rays, and soft X-rays. The resist composition of the present invention is useful for a KrF excimer laser, an ArF excimer laser, EB, and EUV, and particularly useful for an ArF excimer laser, EB, and EUV.

The exposure of the resist film can be a general exposure (dry exposure) conducted in air or an inert gas such as nitrogen, or immersion exposure (immersion lithography).

In immersion lithography, the region between the resist film and the lens at the lowermost point of the exposure apparatus is pre-filled with a solvent (immersion medium) that has a larger refractive index than the refractive index of air, and the exposure (immersion exposure) is conducted in this state.

The immersion medium preferably exhibits a refractive index larger than the refractive index of air but smaller than the refractive index of the resist film to be exposed. The refractive index of the immersion medium is not particularly limited as long as it satisfies the above-described requirements.

Examples of this immersion medium which exhibits a refractive index that is larger than the refractive index of air but smaller than the refractive index of the resist film include water, fluorine-based inert liquids, silicon-based solvents, and hydrocarbon-based solvents.

Specific examples of the fluorine-based inert liquids include liquids containing a fluorine-based compound such as $C_3HCl_2F_5$, $C_4F_9OCH_3$, $C_4F_9OC_2H_5$ or $C_5H_3F_7$ as the main component, and the boiling point is preferably in a range of 70° to 180° C. and more preferably in a range of 80° to 160° C. A fluorine-based inert liquid having a boiling point in the above-described range is advantageous in that the removal of the immersion medium after the exposure can be conducted by a simple method.

As a fluorine-based inert liquid, a perfluoroalkyl compound in which all of the hydrogen atoms of the alkyl group are substituted with fluorine atoms is particularly preferable. Examples of these perfluoroalkyl compounds include perfluoroalkylether compounds and perfluoroalkylamine compounds.

Specifically, one example of a suitable perfluoroalkylether compound is perfluoro(2-butyl-tetrahydrofuran) (boiling point of 102° C.), and an example of a suitable perfluoroalkylamine compound is perfluorotributylamine (boiling point of 174° C.).

As the immersion medium, water is preferable in terms of cost, safety, environment and versatility.

As an example of the alkali developing solution used in an alkali developing process, a 0.1 to 10 mass % aqueous solution of tetramethylammonium hydroxide (TMAH) can be exemplified.

As the organic solvent contained in the organic developing solution used in a solvent developing process, any of the conventional organic solvents can be used which are capable of dissolving the component (A) (prior to exposure). Specific examples of the organic solvent include polar solvents such as ketone solvents, ester solvents, alcohol solvents, nitrile solvents, amide solvents and ether solvents, and hydrocarbon solvents.

A ketone solvent is an organic solvent containing C—C(═O)—C in the structure thereof. An ester solvent is an organic solvent containing C—C(═O)—O—C in the structure thereof. An alcohol solvent is an organic solvent containing an alcoholic hydroxyl group in the structure thereof. An "alcoholic hydroxyl group" indicates a hydroxyl group bonded to a carbon atom of an aliphatic hydrocarbon group. A nitrile solvent is an organic solvent containing a nitrile group in the structure thereof. An amide solvent is an organic solvent containing an amide group in the structure thereof. An ether solvent is an organic solvent containing C—O—C in the structure thereof.

Some organic solvents have a plurality of the functional groups which characterizes the above-described solvents in the structure thereof. In such a case, the organic solvent can be classified as any type of the solvent having the characteristic functional group. For example, diethylene glycol monomethylether can be classified as an alcohol solvent or an ether solvent.

A hydrocarbon solvent consists of a hydrocarbon which may be halogenated, and does not have any substituent other than a halogen atom. Examples of the halogen atom include a fluorine atom, a chlorine atom, a bromine atom and an iodine atom, and a fluorine atom is preferable.

As the organic solvent contained in the organic developing solution, among these, a polar solvent is preferable, and ketone solvents, ester solvents, and nitrile solvents are preferable.

Examples of ketone solvents include 1-octanone, 2-octanone, 1-nonanone, 2-nonanone, acetone, 4-heptanone, 1-hexanone, 2-hexanone, diisobutyl ketone, cyclohexanone, methylcyclohexanone, phenylacetone, methyl ethyl ketone, methyl isobutyl ketone, acetylacetone, acetonylacetone, ionone, diacetonylalcohol, acetylcarbinol, acetophenone, methyl naphthyl ketone, isophorone, propylenecarbonate, γ-butyrolactone and methyl amyl ketone (2-heptanone). Among these examples, as a ketone solvent, methyl amyl ketone (2-heptanone) is preferable.

Examples of ester solvents include methyl acetate, butyl acetate, ethyl acetate, isopropyl acetate, amyl acetate, isoamyl acetate, ethyl methoxyacetate, ethyl ethoxyacetate, propylene glycol monomethyl ether acetate, ethylene glycol monoethyl ether acetate, ethylene glycol monopropyl ether acetate, ethylene glycol monobutyl ether acetate, ethylene glycol monophenyl ether acetate, diethylene glycol monomethyl ether acetate, diethylene glycol monopropyl ether acetate, diethylene glycol monoethyl ether acetate, diethylene glycol monophenyl ether acetate, diethylene glycol monobutyl ether acetate, diethylene glycol monoethyl ether acetate, 2-methoxybutyl acetate, 3-methoxybutyl acetate, 4-methoxybutyl acetate, 3-methyl-3-methoxybutyl acetate, 3-ethyl-3-methoxybutyl acetate, propylene glycol monomethyl ether acetate, propylene glycol monoethyl ether acetate, propylene glycol monopropyl ether acetate, 2-ethoxybutyl acetate, 4-ethoxybutyl acetate, 4-propoxybutyl acetate, 2-methoxypentyl acetate, 3-methoxypentyl acetate, 4-methoxypentyl acetate, 2-methyl-3-methoxypentyl acetate, 3-methyl-3-methoxypentyl acetate, 3-methyl-4-methoxypentyl acetate, 4-methyl-4-methoxypentyl acetate, propylene glycol diacetate, methyl formate, ethyl formate, butyl formate, propyl formate, ethyl lactate, butyl lactate, propyl lactate, ethyl carbonate, propyl carbonate, butyl carbonate, methyl pyruvate, ethyl pyruvate, propyl pyruvate, butyl pyruvate, methyl acetoacetate, ethyl acetoacetate, methyl propionate, ethyl propionate, propyl propionate, isopropyl propionate, methyl 2-hydroxypropionate, ethyl 2-hydroxypropionate, methyl-3-methoxypropionate, ethyl-3-methoxypropionate, ethyl-3-ethoxypropionate, and propyl-3-methoxypropionate. Among these examples, as an ester solvent, butyl acetate is preferable.

Examples of nitrile solvents include acetonitrile, propionitrile, valeronitrile, butyronitrile and the like.

As desired, the organic developing solution may have a conventional additive blended. Examples of the additive include surfactants. The surfactant is not particularly limited, and for example, an ionic or non-ionic fluorine and/or silicon surfactant can be used.

As the surfactant, a non-ionic surfactant is preferable, and a non-ionic fluorine surfactant or a non-ionic silicon surfactant is more preferable.

In a case where a surfactant is added, the amount thereof based on the total amount of the organic developing solution is generally 0.001% to 5% by mass, preferably 0.005% to 2% by mass, and more preferably 0.01% to 0.5% by mass.

The developing treatment can be performed by a conventional developing method. Examples thereof include a method in which the substrate is immersed in the developing solution for a predetermined time (a dip method), a method in which the developing solution is cast up on the surface of the substrate by surface tension and maintained for a predetermined period (a puddle method), a method in which the developing solution is sprayed onto the surface of the substrate (spray method), and a method in which the developing solution is continuously ejected from a developing solution ejecting nozzle while scanning at a constant rate to apply the developing solution to the substrate while rotating the substrate at a constant rate (dynamic dispense method).

As the organic solvent contained in the rinse liquid used in the rinse treatment after the developing treatment in a case of a solvent developing process, any of the above-described organic solvents contained in the organic developing solution can be used which hardly dissolves the resist pattern. In general, at least one solvent selected from the group consisting of hydrocarbon solvents, ketone solvents, ester solvents, alcohol solvents, amide solvents and ether solvents is used. Among these, at least one solvent selected from the group consisting of hydrocarbon solvents, ketone solvents, ester solvents, alcohol solvents and amide solvents is preferable, more preferably at least one solvent selected from the group consisting of alcohol solvents and ester solvents, and an alcohol solvent is particularly preferable.

The alcohol solvent used for the rinse liquid is preferably a monohydric alcohol of 6 to 8 carbon atoms, and the monohydric alcohol may be linear, branched or cyclic. Specific examples thereof include 1-hexanol, 1-heptanol, 1-octanol, 2-hexanol, 2-heptanol, 2-octanol, 3-hexanol, 3-heptanol, 3-octanol, 4-octanol, and benzyl alcohol. Among these, 1-hexanol, 2-heptanol and 2-hexanol are preferable, and 1-hexanol and 2-hexanol are more preferable.

As the organic solvent, one kind of solvent may be used alone, or two or more kinds of solvents may be used in combination. Further, an organic solvent other than the above-described examples or water may be mixed together. However, in consideration of the development characteristics, the amount of water in the rinse liquid, based on the total amount of the rinse liquid is preferably 30% by mass or less, more preferably 10% by mass or less, still more preferably 5% by mass or less, and most preferably 3% by mass or less.

As desired, the rinse solution may have a conventional additive blended. Examples of the additive include surfactants. Examples of the additive include surfactants. As the surfactant, the same surfactants as those described above can be exemplified, a non-ionic surfactant is preferable, and a non-ionic fluorine surfactant or a non-ionic silicon surfactant is more preferable.

In a case where a surfactant is added, the amount thereof based on the total amount of the rinse liquid is generally 0.001% to 5% by mass, preferably 0.005% to 2% by mass, and more preferably 0.01% to 0.5% by mass.

The rinse treatment using a rinse liquid (washing treatment) can be conducted by a conventional rinse method. Examples of the rinse method include a method in which the rinse liquid is continuously applied to the substrate while rotating it at a constant rate (rotational coating method), a method in which the substrate is immersed in the rinse liquid for a predetermined time (dip method), and a method in which the rinse liquid is sprayed onto the surface of the substrate (spray method).

In the method of forming a resist pattern according to the present embodiment which has been described above, since the resist composition according to the first embodiment has been used, the sensitivity can be improved during the formation of the resist pattern. In addition, according to the method of forming a resist pattern, lithography characteristics (the resolution, the roughness reduction, and the like) are further improved and the resolution is increased so that a resist pattern having an excellent shape can be formed.

EXAMPLES

Hereinafter, the present invention will be described in detail based on the following examples, but the present invention is not limited to these examples.

Synthesis Examples 1 to 12: Synthesis of Polymers P1 to P12

Polymers P1 to P12 were synthesized using compounds listed in Tables 1 and 2 according to a known method based on the molar ratios listed in Tables 1 and 2.

With respect to the obtained polymers P1 to P12, the copolymerization compositional ratio (the ratio (molar ratio) of each constitutional unit in the polymer compound) of each polymer compound acquired by $^{13}$C-NMR, and the weight average molecular weight (Mw) in terms of standard polystyrene acquired by GPC measurement, and the molecular weight dispersity (Mw/Mn) thereof are listed in Table 1.

(m101)

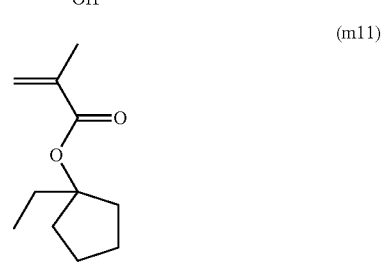
(m11)

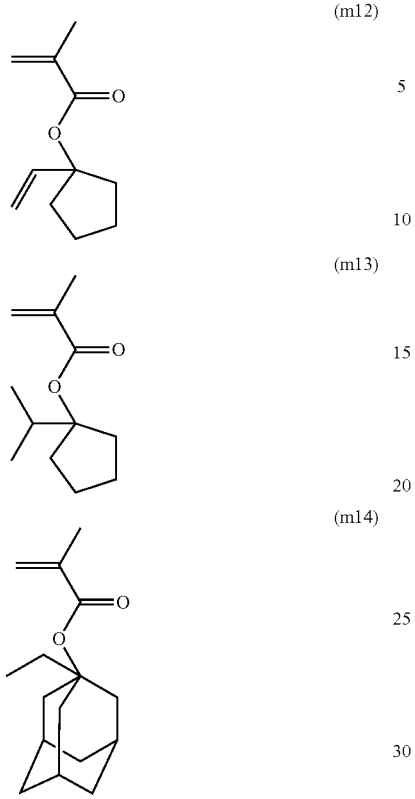

(m12)
(m13)
(m14)

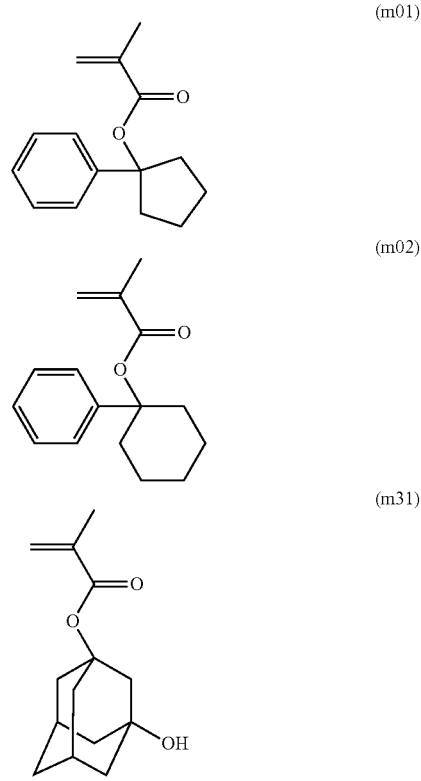

(m01)
(m02)
(m31)

TABLE 1

| | | Compositional ratio | | | | | | | | |
|---|---|---|---|---|---|---|---|---|---|---|
| | | Constitutional unit (a10) | | Constitutional unit (a1) | | Constitutional unit (a0) | | Constitutional unit (a3) | | |
| Polymer | Type | Proportion (% by mole) | Type | Proportion (% by mole) | Type | Proportion (% by mole) | Type | Proportion (% by mole) | Molecular weight | Dispersity |
| P1 | (m101) | 50 | (m11) | 30 | (m01) | 20 | | | 7600 | 1.7 |
| P2 | (m101) | 50 | (m11) | 10 | (m01) | 40 | | | 8000 | 1.8 |
| P3 | (m101) | 50 | (m11) | 40 | (m01) | 10 | | | 7700 | 1.7 |
| P4 | (m101) | 50 | (m12) | 30 | (m01) | 20 | | | 8100 | 1.7 |
| P5 | (m101) | 50 | (m14) | 30 | (m01) | 20 | | | 7900 | 1.6 |
| P6 | (m101) | 50 | (m11) | 30 | (m02) | 20 | | | 8100 | 1.7 |
| P7 | (m101) | 50 | (m13) | 30 | (m02) | 20 | | | 8200 | 1.8 |
| P8 | (m101) | 40 | (m11) | 30 | (m01) | 20 | (m31) | 10 | 7900 | 1.7 |

TABLE 2

| | | Compositional ratio | | | | | | | |
|---|---|---|---|---|---|---|---|---|---|
| | | Constitutional unit (a10) | | Constitutional unit (a1) | | | Constitutional unit (a0) | | |
| Polymer | Type | Proportion (% by mole) | Type | Proportion (% by mole) | Type | Proportion (% by mole) | Type | Proportion (% by mole) | Molecular weight | Dispersity |
| P9 | (m101) | 50 | | | | | (m01) | 50 | 8100 | 1.8 |
| P10 | (m101) | 50 | (m11) | 50 | | | | | 8100 | 1.6 |
| P11 | (m101) | 50 | | | | | (m02) | 50 | 7600 | 1.7 |
| P12 | (m101) | 50 | (m11) | 30 | (m12) | 20 | | | 8100 | 1.8 |

<Preparation of Resist Composition>

Respective components listed in Table 3 were mixed so as to be dissolved, thereby preparing resist compositions of each example.

TABLE 3

|  | Component (A) | Component (B) | Component (C) | Component (D) |
|---|---|---|---|---|
| Example 1 | (A)-1 [100] | (B)-1 [18.8] | (D)-1 [6.8] | (S)-1 [12400] |
| Example 2 | (A)-2 [100] | (B)-1 [18.8] | (D)-1 [6.8] | (S)-1 [12400] |
| Example 3 | (A)-3 [100] | (B)-1 [18.8] | (D)-1 [6.8] | (S)-1 [12400] |
| Example 4 | (A)-4 [100] | (B)-1 [18.8] | (D)-1 [6.8] | (S)-1 [12400] |
| Example 5 | (A)-5 [100] | (B)-1 [18.8] | (D)-1 [6.8] | (S)-1 [12400] |
| Example 6 | (A)-6 [100] | (B)-1 [18.8] | (D)-1 [6.8] | (S)-1 [12400] |
| Example 7 | (A)-7 [100] | (B)-1 [18.8] | (D)-1 [6.8] | (S)-1 [12400] |
| Example 8 | (A)-8 [100] | (B)-1 [18.8] | (D)-1 [6.8] | (S)-1 [12400] |
| Comparative Example 1 | (A)-9 [100] | (B)-1 [18.8] | (D)-1 [6.8] | (S)-1 [12400] |
| Comparative Example 2 | (A)-10 [100] | (B)-1 [18.8] | (D)-1 [6.8] | (S)-1 [12400] |
| Comparative Example 3 | (A)-11 [100] | (B)-1 [18.8] | (D)-1 [6.8] | (S)-1 [12400] |
| Comparative Example 4 | (A)-12 [100] | (B)-1 [18.8] | (D)-1 [6.8] | (S)-1 [12400] |

In Table 3, each abbreviation has the following meaning. The numerical values in the parentheses are blending amounts (parts by mass).

(A)-1 to (A)-12: polymers P1 to P12 described above (B)-1: acid generator represented by Chemical Formula (B)-1

(D)-1: acid diffusion control agent represented by Chemical Formula (D)-1

(S)-1: mixed solution obtained by mixing propylene glycol monomethyl ether acetate and propylene glycol monomethyl ether at mass ratio of 6:4

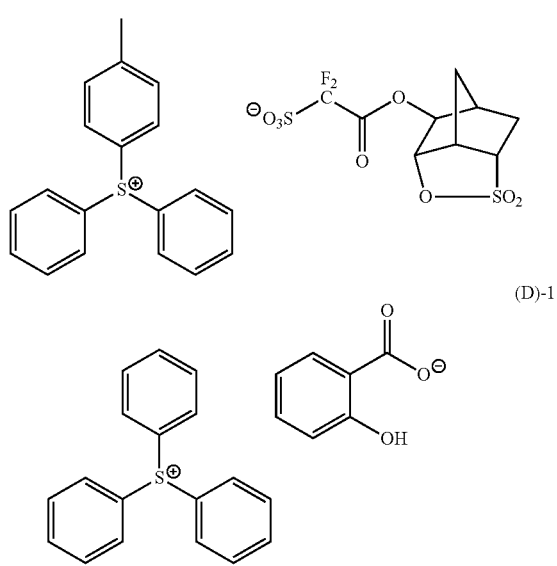

(B)-1

(D)-1

<Evaluation of Resist Composition>

A resist pattern was formed using each of the obtained resist compositions, and the sensitivity (Eop), the resolution, and LWR were respectively evaluated in the following manners.

[Formation of Resist Pattern]

An 8-inch silicon substrate to which a hexamethyldisilazane (HMDS) had been applied was coated with the resist composition of each example using a spinner, and a prebake (PAB) treatment performed thereon on a hot plate at a temperature of 110° C. for 60 seconds so that the hot plate was dried to form a resist film having a film thickness of 30 nm. Next, drawing (exposing) was performed on the resist film at an accelerating voltage of 100 kV such that the target size was set to a line width of 50 mm and 1:1 line and space pattern (hereinafter, referred to as an "LS pattern") using an electron beam lithography device JEOL-JBX-9300FS (manufactured by JEOL Ltd.), and a post exposure bake (PEB) treatment was performed thereon at 110° C. for 60 seconds. Subsequently, alkali development was performed at 23° C. for 60 seconds using a 2.38 mass % tetramethylammonium hydroxide (TMAH) aqueous solution "NMD-3" (trade name, manufactured by TOKYO OHKA KOGYO CO., LTD.), and water rinsing was performed for 15 seconds using pure water. As the result, a 1:1 LS pattern with a line width of 50 nm was formed.

[Evaluation of Optimum Exposure Amount (Eop)]

An optimum exposure amount Eop ($\mu C/cm^2$) at which the LS pattern with a target size was formed according to the method of forming a resist pattern was acquired. The results are listed in Table 4.

[Evaluation of Resolution]

The limit resolution in the Eop, specifically, the minimum dimension of a pattern to be resolved without collapsing while the exposure amount from the optimum exposure amount Eop was increased to form an LS pattern was acquired using a scanning electron microscope S-9380 (manufactured by Hitachi High-Technologies Corporation). The results are listed in Table 4.

Using the LS pattern formed in the section of the "formation of resist pattern", the 3σ which is the scale that indicates the LWR was acquired. The "3σ" indicates three times (3σ) (unit: nm) the standard deviation (σ) acquired based on the result of measurement performed by measuring 400 sites of line positions in the longitudinal direction of the line using a scanning electron microscope (trade name: S-9380, manufactured by Hitachi High-Technologies Corporation, accelerating voltage of 800 V). In a case where the value of the 3σ is small, this indicates that the roughness of a line side wall is small and an LS pattern with a uniform width is obtained.

TABLE 4

|  | Eop (mJ/cm$^2$) | Resolution (nm) | LWR (nm) |
|---|---|---|---|
| Example 1 | 126 | 39 | 5.5 |
| Example 2 | 112 | 41 | 5.9 |
| Example 3 | 127 | 41 | 5.8 |
| Example 4 | 129 | 39 | 5.6 |
| Example 5 | 136 | 41 | 6.0 |
| Example 6 | 132 | 40 | 5.7 |
| Example 7 | 133 | 40 | 5.6 |
| Example 8 | 119 | 39 | 5.6 |
| Comparative Example 1 | 108 | 43 | 6.3 |
| Comparative Example 2 | 129 | 45 | 6.5 |

| | Eop (mJ/cm$^2$) | Resolution (nm) | LWR (nm) |
|---|---|---|---|
| Comparative Example 3 | 131 | 43 | 6.3 |
| Comparative Example 4 | 130 | 44 | 6.3 |

Based on the results listed in Table 4, it was confirmed that the resist compositions of Examples 1 to 8 to which the present invention had been applied had well-balanced sensitivity, resolution, and LWR, and the resolution and LWR were improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A resist composition which generates an acid upon exposure and whose solubility in a developing solution is changed due to an action of the acid, the resist composition comprising:

a resin component (A1) whose solubility in a developing solution is changed due to the action of the acid, wherein the resin component (A1) includes a copolymer consisting of a constitutional unit (a10) represented by Formula (a10-1), a constitutional unit (a0) derived from a compound represented by Formula (a0-1) and a constitutional unit (a1) (where a constitutional unit corresponding to the constitutional unit (a0) is excluded) represented by Formula (a1-1), wherein a total content of the constitutional unit (a0) and the constitutional unit (a1) in the resin component (A1) is in a range of 40% to 60% by mole with respect to all constitutional units (100% by mole) constituting the copolymer:

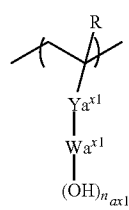

(a10-1)

wherein R represents a hydrogen atom, an alkyl group having 1 to 5 carbon atoms, or a halogenated alkyl group having 1 to 5 carbon atoms, $Ya^{x1}$ represents a single bond, $Wa^{x1}$ represents an ($n_{ax1}$+1)-valent aromatic hydrocarbon group, and $n_{ax1}$ represents an integer of 1 or greater;

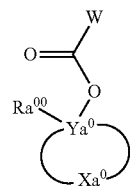

(a0-1)

wherein W represents a polymerizable group-containing group, $Ya^0$ represents a carbon atom, $Xa^0$ represents a group that forms a monocyclic aliphatic hydrocarbon group together with $Ya^0$, some or all hydrogen atoms in the monocyclic aliphatic hydrocarbon group may be substituted with substituents, and $Ra^{00}$ represents an aromatic hydrocarbon group which may have a substituent,

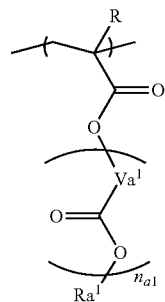

(a1-1)

wherein R represents a hydrogen atom, an alkyl group having 1 to 5 carbon atoms, or a halogenated alkyl group having 1 to 5 carbon atoms, $Va^1$ represents a divalent hydrocarbon group which may contain an ether bond, $n_{a1}$ represents an integer of 0 to 2, and $Ra^1$ represents an acid dissociable group represented by Formula (a1-r2-1) or (a1-r2-2):

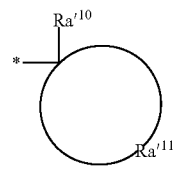

(a1-r2-1)

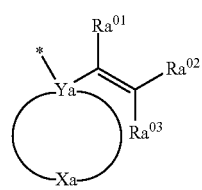

(a1-r2-2)

wherein $Ra'^{10}$ represents an alkyl group having 1 to 10 carbon atoms, and $Ra'^{11}$ represents a group that forms a monocyclic aliphatic cyclic group together with the carbon atom to which $Ra'^{10}$ is bonded; Ya represents a carbon atom, Xa represents a group that forms a cyclic hydrocarbon group together with Ya; $Ra^{01}$ to $Ra^{03}$ each independently represent a hydrogen atom, a chain monovalent saturated hydrocarbon group having 1 to 10 carbon atoms, or a monovalent aliphatic cyclic saturated hydrocarbon group having 3 to 20 carbon atoms.

2. A method of forming a resist pattern, comprising:

forming a resist film on a support using the resist composition according to claim 1;

exposing the resist film; and developing the exposed resist film to form a resist pattern.

3. The method of forming a resist pattern according to claim 2, wherein, in exposing the resist film, the resist film is exposed to extreme ultraviolet rays (EUV) or electron beams (EB).

4. The resist composition according to claim 1, wherein $Ra^1$ represents an acid dissociable group represented by Formula (a1-r2-1).

* * * * *